(12) United States Patent
Roberts et al.

(10) Patent No.: US 11,075,293 B2
(45) Date of Patent: Jul. 27, 2021

(54) QUBIT-DETECTOR DIE ASSEMBLIES

(71) Applicant: Intel Corporation, Santa Clara, CA (US)

(72) Inventors: Jeanette M. Roberts, North Plains, OR (US); Ravi Pillarisetty, Portland, OR (US); Nicole K. Thomas, Portland, OR (US); Hubert C. George, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 341 days.

(21) Appl. No.: 16/328,670

(22) PCT Filed: Sep. 24, 2016

(86) PCT No.: PCT/US2016/053607
§ 371 (c)(1),
(2) Date: Feb. 26, 2019

(87) PCT Pub. No.: WO2018/057016
PCT Pub. Date: Mar. 29, 2018

(65) Prior Publication Data
US 2019/0181256 A1    Jun. 13, 2019

(51) Int. Cl.
*H01L 29/66*   (2006.01)
*H01L 29/76*   (2006.01)
(Continued)

(52) U.S. Cl.
CPC ......... *H01L 29/7613* (2013.01); *B82Y 10/00* (2013.01); *H01L 23/3107* (2013.01);
(Continued)

(58) Field of Classification Search
CPC ............ H01L 29/66977; H01L 29/127; H01L 29/122; H01L 29/7613
See application file for complete search history.

(56) References Cited

U.S. PATENT DOCUMENTS

| | | |
|---|---|---|
| 2002/0179897 A1 | 12/2002 | Eriksson et al. |
| 2009/0173936 A1 | 7/2009 | Bunyk |

(Continued)

FOREIGN PATENT DOCUMENTS

| | | |
|---|---|---|
| WO | 2015178992 A3 | 1/2016 |
| WO | 2017155531 A1 | 9/2017 |

(Continued)

OTHER PUBLICATIONS

PCT Jun. 7, 2017 International Search Report and Written Opinion from International Application Serial No. PCT/US2016/053607; 14 pages.

(Continued)

*Primary Examiner* — Errol V Fernandes
(74) *Attorney, Agent, or Firm* — Patent Capital Group

(57) ABSTRACT

Disclosed herein are qubit-detector die assemblies, as well as related computing devices and methods. In some embodiments, a die assembly may include: a first die having a first face and an opposing second face, wherein a plurality of active qubit devices are disposed at the first face of the first die; and a second die, mechanically coupled to the first die, having a first face and an opposing second face, wherein a plurality of quantum state detector devices are disposed at the first face of the second die; wherein the first faces of the first and second dies face each other.

20 Claims, 60 Drawing Sheets

(51) Int. Cl.

| | | |
|---|---|---|
| *H01L 29/775* | (2006.01) | |
| *H01L 29/423* | (2006.01) | |
| *H01L 29/12* | (2006.01) | |
| *H01L 29/06* | (2006.01) | |
| *H01L 25/00* | (2006.01) | |
| *H01L 25/16* | (2006.01) | |
| *B82Y 10/00* | (2011.01) | |
| *H01L 23/31* | (2006.01) | |
| *H01L 25/18* | (2006.01) | |
| *H01L 23/00* | (2006.01) | |
| *H01L 25/11* | (2006.01) | |
| *H01L 21/56* | (2006.01) | |
| *H01L 29/165* | (2006.01) | |

(52) U.S. Cl.
CPC .............. *H01L 24/18* (2013.01); *H01L 24/19* (2013.01); *H01L 24/20* (2013.01); *H01L 25/117* (2013.01); *H01L 25/16* (2013.01); *H01L 25/18* (2013.01); *H01L 25/50* (2013.01); *H01L 29/0673* (2013.01); *H01L 29/12* (2013.01); *H01L 29/127* (2013.01); *H01L 29/423* (2013.01); *H01L 29/42376* (2013.01); *H01L 29/66* (2013.01); *H01L 29/66977* (2013.01); *H01L 29/775* (2013.01); *H01L 21/568* (2013.01); *H01L 24/05* (2013.01); *H01L 24/06* (2013.01); *H01L 24/16* (2013.01); *H01L 24/17* (2013.01); *H01L 29/165* (2013.01); *H01L 2224/0401* (2013.01); *H01L 2224/06154* (2013.01); *H01L 2224/06155* (2013.01); *H01L 2224/16145* (2013.01); *H01L 2224/16147* (2013.01); *H01L 2224/16225* (2013.01); *H01L 2224/16237* (2013.01); *H01L 2224/18* (2013.01)

(56) References Cited

U.S. PATENT DOCUMENTS

| | | | |
|---|---|---|---|
| 2011/0242632 A1 | 10/2011 | Bennett et al. | |
| 2013/0123111 A1 | 5/2013 | Simon | |
| 2013/0264617 A1 | 10/2013 | Joshi et al. | |
| 2019/0044066 A1* | 2/2019 | Thomas ............. | G02B 6/12004 |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0165152 A1 | 5/2019 | Roberts et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0221659 A1* | 7/2019 | George ................. | H01L 29/423 |
| 2019/0229188 A1 | 7/2019 | Clarke et al. | |
| 2019/0229189 A1 | 7/2019 | Clarke et al. | |
| 2019/0259850 A1 | 8/2019 | Pillarisetty et al. | |
| 2019/0267692 A1 | 8/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0341459 A1 | 11/2019 | Pillarisetty et al. | |
| 2019/0363181 A1 | 11/2019 | Pillarisetty et al. | |
| 2019/0363239 A1 | 11/2019 | Yoscovits et al. | |
| 2020/0242208 A1* | 7/2020 | Daraeizadeh ........... | G06F 30/30 |

FOREIGN PATENT DOCUMENTS

| | | |
|---|---|---|
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057016 A1 | 3/2018 |
| WO | 2018057018 A1 | 3/2018 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.

"A two-qubit logic gate in silicon," Veldhorst et al., Nature, vol. 526, Oct. 15, 2015, pp. 410-414.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Fast sensing of double-dot charge arrangement and spin state with an rf sensor quantum dot," Barthel et al, Materials Department, University of California, Santa Barbara, Jan. 16, 2014, 4 pages.

"Undoped accumulation-mode Si/SiGe quantum dots," Borselli et al, HRL Laboratories, LLC., Jul. 15, 2014, 4 pages.

"Spin Relaxation and Decoherence of Holes in Quantum Dots," Bulaev et al., Phys. Rev. Lett. 95, 076805, Aug. 11, 2005, 1 page.

"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.

"Ultrafast optical control of individual quantum dot spin qubits," De Greve et al, Reports on Progress in Physics, vol. 76, No. 9, Sep. 4, 2013, 2 pages.

"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.

"How it's built: Micron/Intel3D NAND Micron Opens the Veil a Little," Moyer, Bryon, retrieved from https://www.eejournal.com/article/20160201-micron/ on Nov. 29, 2017, 9 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Platinum single-electron transistors with tunnel barriers made by atomic layer deposition", George et al., Department of Electrical Engineering, University of Notre Dame, Received Jul. 7, 2010:Published Nov. 5, 2010, 3 pages.

"Quantum computation with quantum dots," Loss et al , Physical Review A, vol. 57, No. 1, Jan. 1998, pp. 120-126.

"Ultrafast high-fidelity initialization of a quantum-dot spin qubit without magnetic fields," Mar et al., Phys. Rev. B 90 241303®, published Dec. 15, 2014, 1 page.

"Delaying Forever: Uniaxial Strained Silicon Transistors in a 90nm CMOS Technology," Mistry et al Portland Technology Department, TCAD, Intel Corp., 2 pages.

Supplementary Information, retrieved from www.nature.com, doi:10.1038/nature 15263, 8 pages.

"Embracing the quantum limit in silicon computing," Morton et al, Macmillan Publishers, Nov. 17, 2011, vol. 479, Nature, pp. 345-353.

"Review : Towards Spintronic Quantum Technologies with Dopants in Silicon," Morley, Gavin, Department of Physics, University of Warwich, 13 pages.

"A Reconfigurable Gate Architecture for Si/SiGe Quantum Dots," Zajac et al., Department Of Physics, Princeton University; Department of Physics, University of California; Feb. 6, 2015, 5 pages.

(56) References Cited

OTHER PUBLICATIONS

"Defect reduction of selective Ge epitaxy in trenches on Si(001) substrates using aspect ratio trapping," Park et al., Applied Physics Letter 90, 052113 (2007), pp. 052113-1 through 3.

"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).

"Radio frequency measurements of tunnel couplings and singlet-triplet spin states in Si:P quantum dots," House et al., Nature Communications, 6:884, DOI: 10.1038/ncomms9848, pp. 1-6.

"Detecting bit-flip errors in a logical qubit using stabilizer measurements," Riste et al., Nature Communications, 6:6983, DOI: 10.1038/ncomms7983, pp. 1-6.

"Scalable gate architecture for densely packed semiconductor spin qubits," Zajac et al, Department of Physics, Princeton University; Sandia National Laboratories, 8 pages.

"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

"Single-electron Transistors fabricated with sidewall spacer patterning," Park et al., Superlattices and Microstructures 34 (2003) 231-239.

"Single-electron Transistors with wide operating temperature range," Dubuc et al., Applied Physics Letters 90, 113104 (2007) pp. 113104-1 through 3.

"Single-shot read-out of an individual electron spin in a quantum dot," Elzerman et al., Nature, vol. 430, Jul. 22, 2004, pp. 431-435.

"An addressable quantum dot qubit with fault-tolerant control-fidelity," Veldhorst et al., Nature Nanotechnology vol. 9, Dec. 2014, pp. 981-985.

* cited by examiner

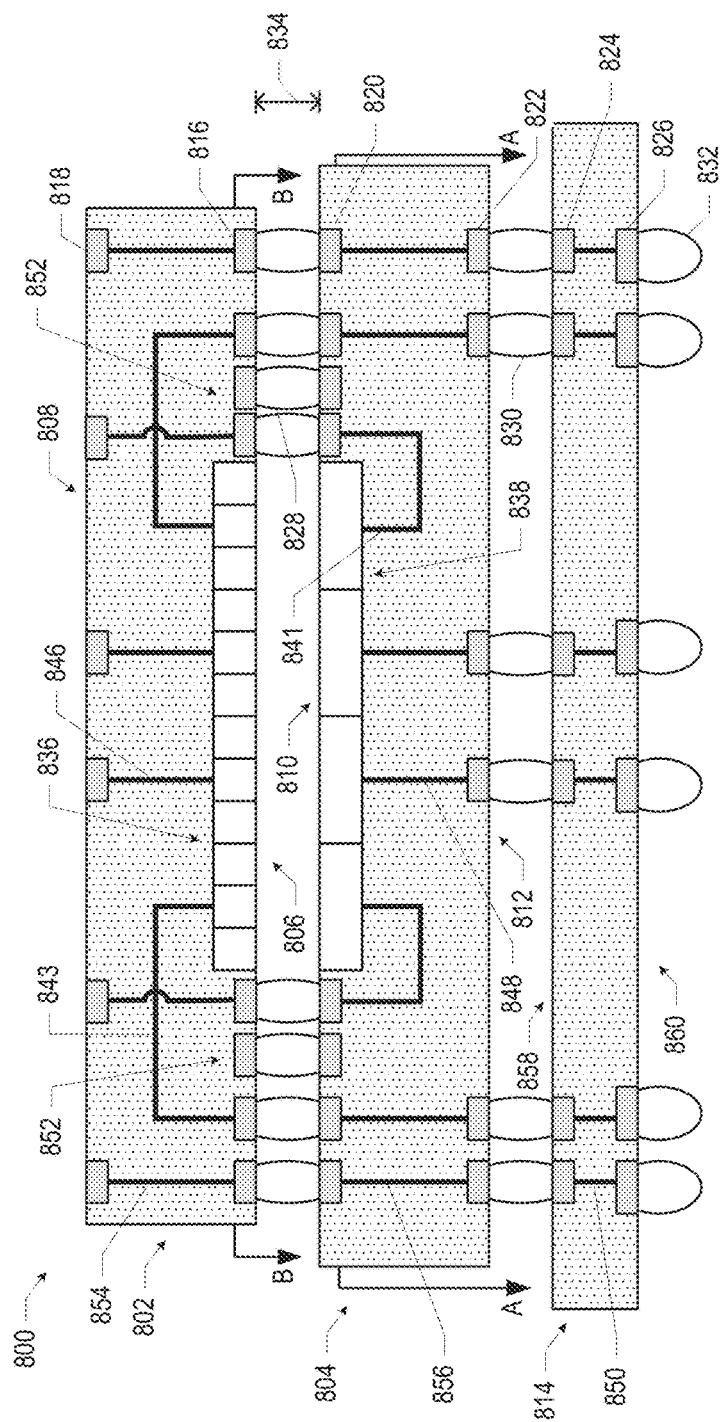
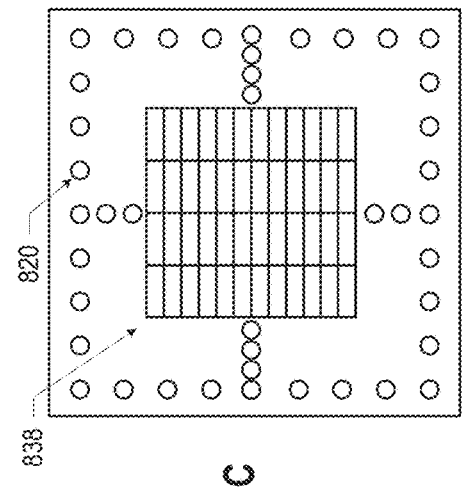
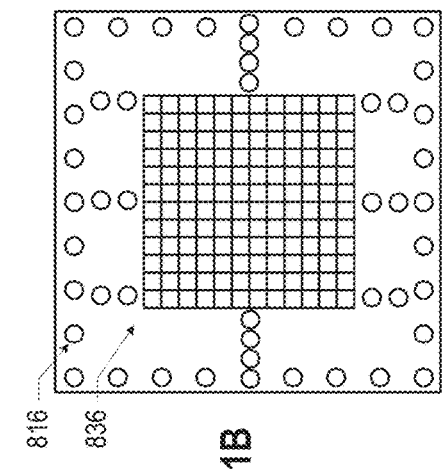
FIG. 1A
FIG. 1B
FIG. 1C

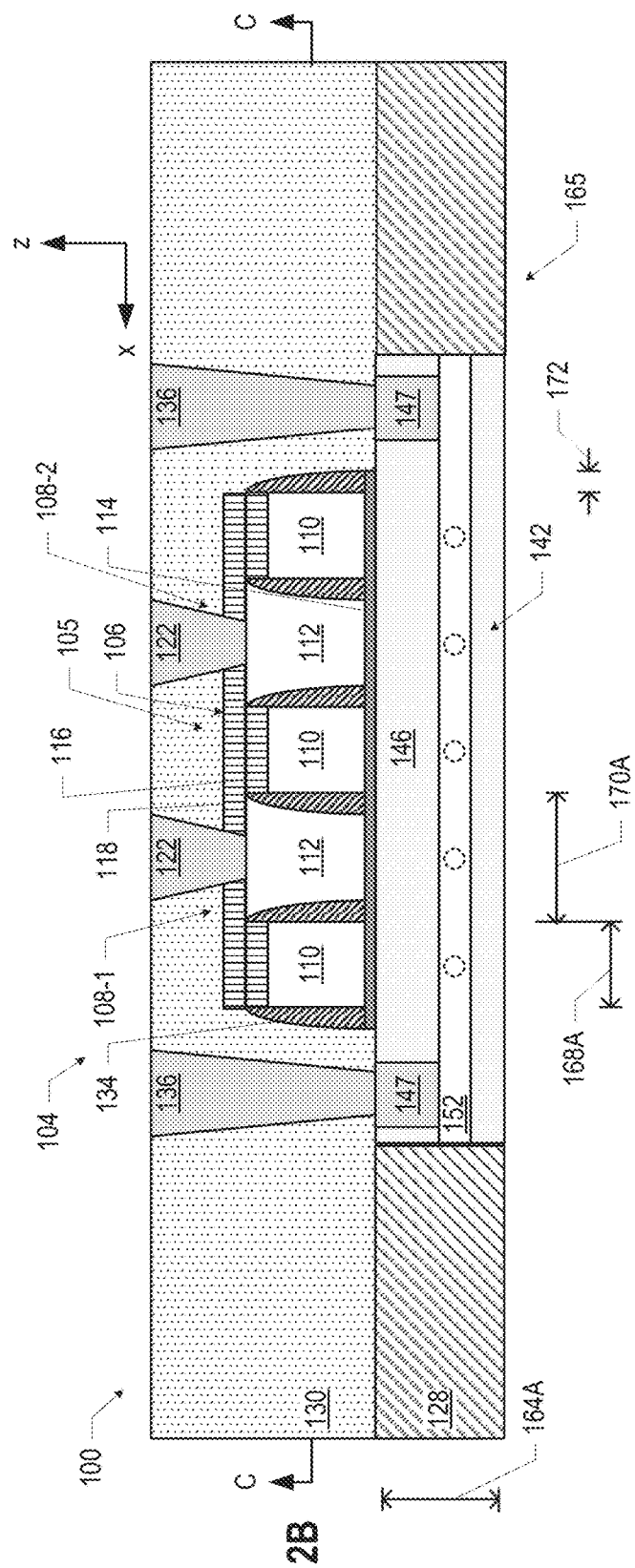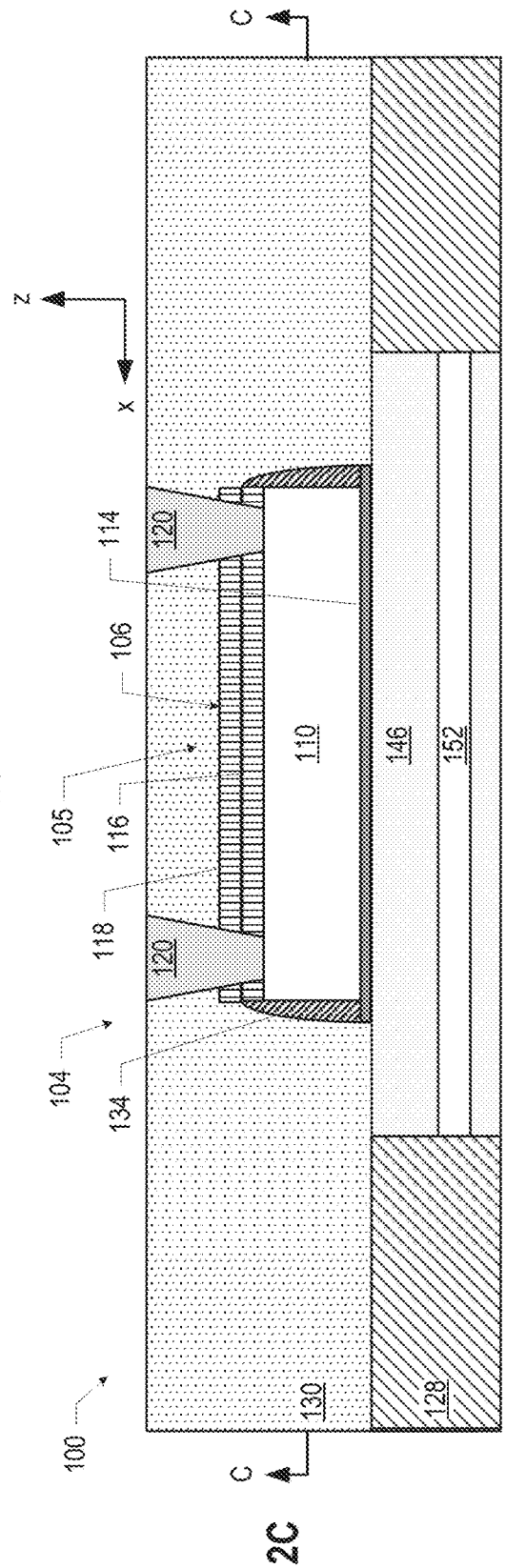

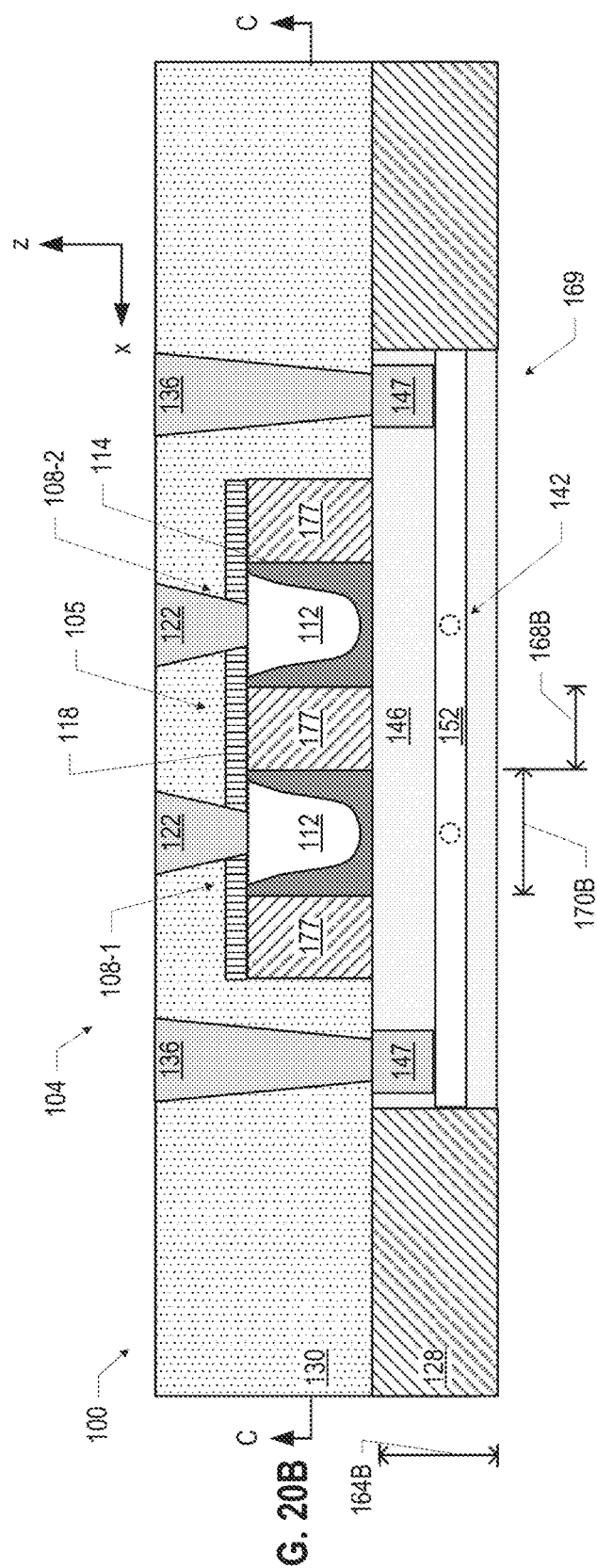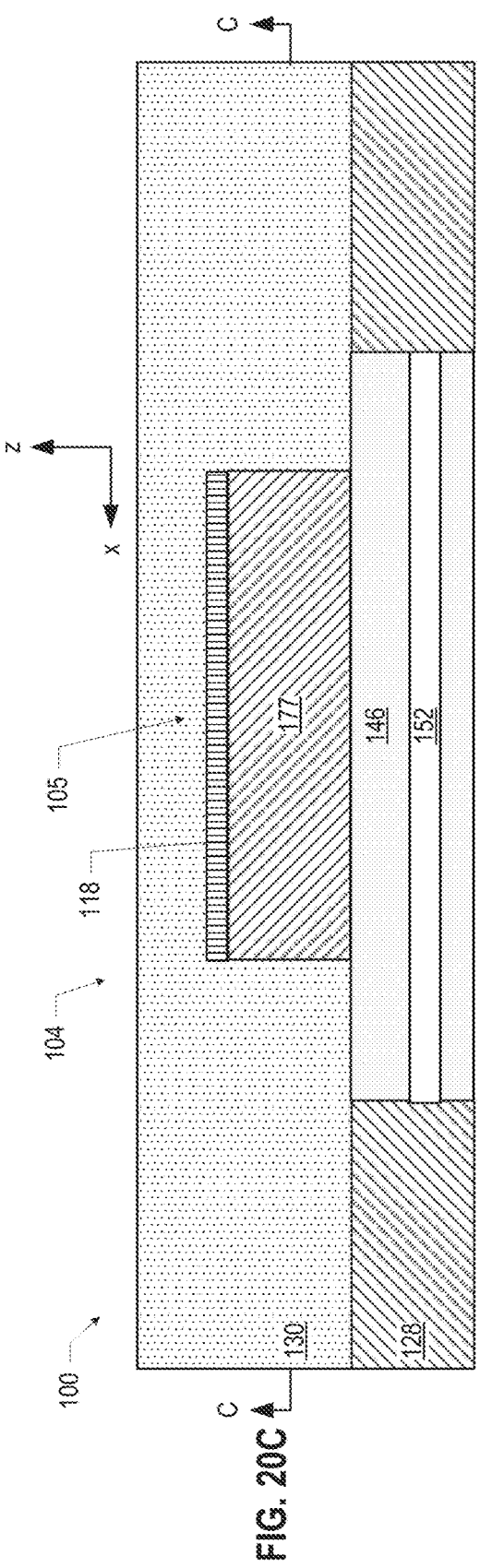

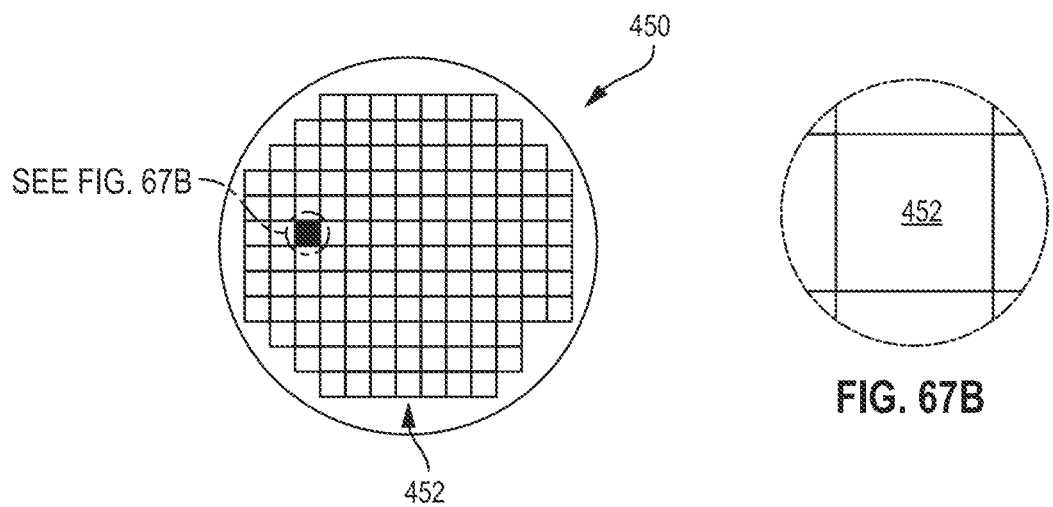
FIG. 67A
FIG. 67B
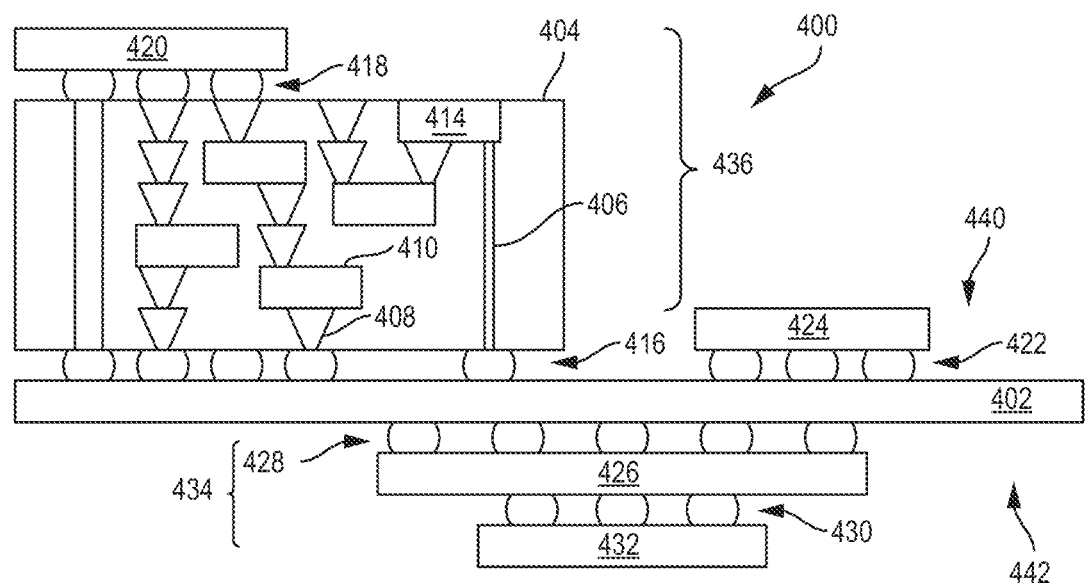
FIG. 68

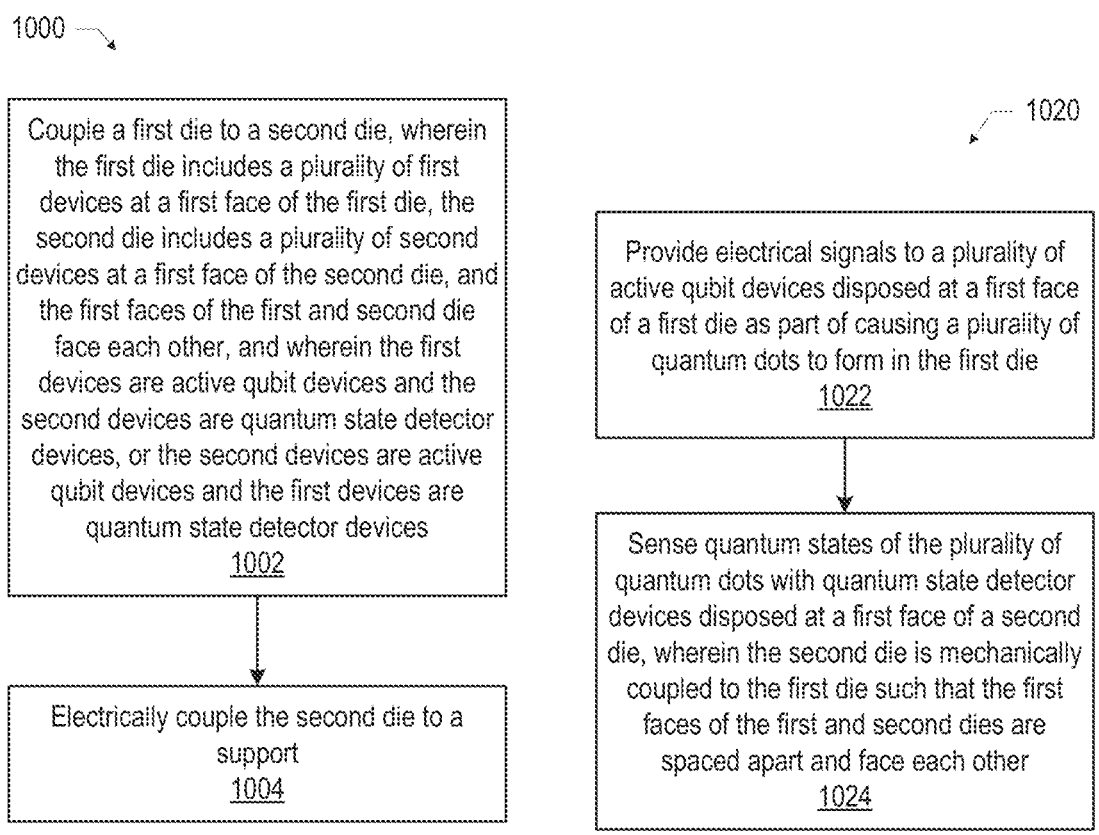

QUBIT-DETECTOR DIE ASSEMBLIES

CROSS-REFERENCE TO RELATED APPLICATION

This application is a national stage application under 35 U.S.C. § 371 of PCT International Application Serial No. PCT/US2016/053607, filed on Sep. 24, 2016 and entitled "QUBIT-DETECTOR DIE ASSEMBLIES," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A, 1B, and 1C are cross-sectional views of an embodiment of a qubit-detector die assembly, in accordance with various embodiments.

FIGS. 2A, 2B, and 2C are cross-sectional views of an embodiment of a gate-stack device, in accordance with various embodiments.

FIGS. 20A, 20B, and 20C are cross-sectional views of another embodiment of a gate-stack device, in accordance with various embodiments.

FIGS. 67A and 67B are top views of a wafer and dies that may include any of the active qubit devices or detector devices disclosed herein.

FIG. 68 is a cross-sectional side view of a device assembly that may include any of the qubit-detector die assemblies disclosed herein.

FIG. 69 is a flow diagram of an illustrative method of manufacturing a quantum computing device, in accordance with various embodiments.

FIG. 70 is a flow diagram of an illustrative method of operating a qubit-detector die assembly, in accordance with various embodiments.

DETAILED DESCRIPTION

Figure 2A:
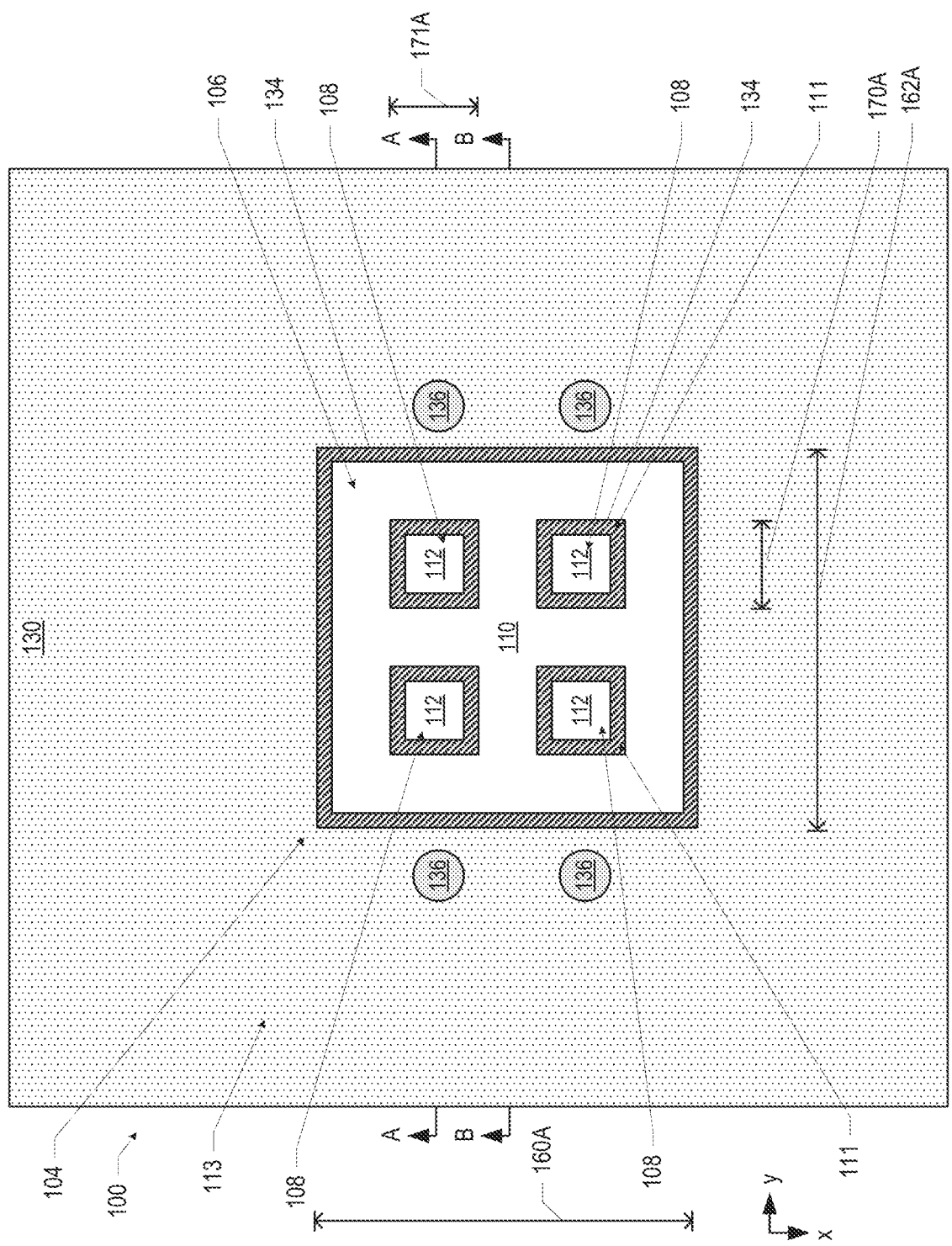

Disclosed herein are qubit-detector die assemblies, as well as related computing devices and methods. For example, in some embodiments, a die assembly may include: a first die having a first face and an opposing second face, wherein a plurality of active qubit devices are disposed at the first face of the first die; and a second die, mechanically coupled to the first die, having a first face and an opposing second face, wherein a plurality of quantum state detector devices are disposed at the first face of the second die; wherein the first faces of the first and second dies face each other.

The devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the devices disclosed herein provide strong spatial localization of the quantum dots (and therefore good control over quantum dot interactions and manipulation), good scalability in the number of quantum dots included in the device, and/or design flexibility in making electrical connections to the devices to integrate the devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). For ease of discussion, all of the lettered sub-figures associated with a particular numbered figure may be referred to by the number of that figure; for example, FIGS. 1A-1C may be referred to as "FIG. 1," FIGS. 2A-2C may be referred to as "FIG. 2," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

FIGS. 1A, 1B, and 1C are cross-sectional views of an embodiment of a qubit-detector die assembly 800, in accordance with various embodiments. In particular, FIG. 1B is a cross-sectional view of the active qubit die 802 through the section B-B of FIG. 1A, and FIG. 1C is a cross-sectional view of the quantum state detector die 804 through the section A-A of FIG. 1A.

The qubit-detector die assembly 800 may include an active qubit die 802 mechanically coupled to a quantum state detector die 804. The active qubit die 802 may have a first face 806 and an opposing second face 808. Multiple active qubit devices 836 may be disposed proximate to the first face 806 of the active qubit die 802. The quantum state detector die 804 may have a first face 810 and an opposing second face 812. The quantum state detector die 804 may include multiple detector devices 838 disposed proximate to the first face 810. The active qubit die 802 and the quantum state detector die 804 may be coupled together so that the first face 806 of the active qubit die 802 faces the first face 810 of the quantum state detector die 804, and thus the active qubit devices 836 are proximate to the detector devices 838. In some embodiments, the distance 834 between the first face 810 and the first face 806 may be between 50 and 250 nanometers (e.g., between 50 and 150 nanometers, or between 100 and 200 nanometers). During operation of the die assembly 800, the quantum states of quantum dots generated by the active qubit devices 836 in the active qubit die 802 may be detected by the detector devices 838 in the quantum state detector die 804; the distance 834 may be small enough so that quantum state detection may take place "across" the space between the active qubit die 802 and the quantum state detector die 804. As discussed below, a number of different devices may provide the active qubit devices 836, and a number of different devices may provide the detector devices 838.

In some embodiments, the active qubit devices 836 and the detector devices 838 may have a same or similar structure, while in other embodiments, the active qubit devices 836 and the detector devices 838 may have different structures. For example, in some embodiments, the active qubit devices 836 and the detector devices 838 may both include any of the gate-stack devices 100 disclosed herein. In some embodiments, the active qubit devices 836 and the detector devices 838 may both include any of the SET devices 500 disclosed herein. In some embodiments, the active qubit devices 836 may include any of the gate-stack devices 100 disclosed herein, and the detector devices 838 may include any of the SET devices 500 disclosed herein. In some embodiments, the active qubit devices 836 may include any of the SET devices 500 disclosed herein, and the detector devices 838 may include any of the gate-stack devices 100 disclosed herein. In some embodiments, the active qubit die 802 and the quantum state detector die 804 may be "mirror images" of each other in the die assembly 800.

The active qubit die 802 and the quantum state detector die 804 may be mechanically coupled in any of a number of ways. In some embodiments, the active qubit die 802 and the quantum state detector die 804 may be coupled together with an adhesive disposed between the first face 806 and the first face 810. In some embodiments, the active qubit die 802 and the quantum state detector die 804 may be coupled together with conductive material. For example, the active qubit die 802 may include one or more conductive contacts 816 disposed at the first face 806, and these conductive contacts 816 may be coupled to corresponding conductive contacts 820 disposed at the first face 810 of the quantum state detector die 804 via die-to-die interconnects 828. As used herein, a "conductive contact" may include a bond pad, a post, or any other suitable contact structure. In some embodiments, the die-to-die interconnects 828 may include solder bumps, paste, or balls (as illustrated in FIG. 1A); for example, the die-to-die interconnects 828 may be flip chip (or controlled collapse chip connection, "C4") bumps disposed initially on the active qubit die 802 or on the quantum state detector die 804. Any other die-to-die coupling technology may be used to provide the die-to-die interconnects 828.

In some embodiments in which the active qubit die 802 and the quantum state detector die 804 are coupled via solder, one or more of the conductive contacts 816 disposed at the first face 806 of the active qubit die 802 that mechanically couple the active qubit die 802 to the quantum state detector die 804 may not be connected to any significant conductive pathways within the active qubit die 802 (e.g., no power or electrical signals may flow through those conductive contacts 816). Similarly, one or more of the conductive contacts 820 disposed at the first face 810 of the quantum state detector die 804 that mechanically couple the active qubit die 802 to the quantum state detector die 804 may not be connected to any significant conductive pathways within the quantum state detector die 804. For example, FIG. 1A depicts a coupling structure 852 that includes a conductive contact 816, a conductive contact 820, and die-to-die interconnects 828 coupling the conductive contacts 816 and 820. The conductive contact 816 of the coupling structure 852 may not be connected to any conductive pathways within the active qubit die 802, and the conductive contact 820 of the coupling structure 852 may not be connected to any significant conductive pathways within the quantum state detector die 804. In such embodiments, the die-to-die interconnects 828 coupling the conductive contact 816 and the conductive contact 820 of the coupling structure 852 may simply provide a mechanical coupling.

In some embodiments in which the active qubit die 802 and the quantum state detector die 804 are coupled via solder, the solder may provide an electrical pathway between the active qubit die 802 and the quantum state detector die 804 through which electrical signals and/or power or reference signals may flow (e.g., as discussed below with reference to the conductive pathways 843). The "conductive pathways" discussed with reference to FIG. 1 may generally include conductive vias, conductive lines, and/or any combination of conductive vias and lines, among other structures, arranged as appropriate. In some embodiments, conductive lines of a die (or a package substrate, as discussed below) may extend into and out of the plane of the drawing, providing conductive pathways to route electrical signals to and/or from various elements in the die. Conductive vias and/or lines that provide the conductive pathways in a die or package substrate may be formed using any suitable techniques. Examples of such techniques may include subtractive fabrication techniques, additive or semi-additive fabrication techniques, single Damascene fabrication techniques, dual Damascene fabrication techniques, or any other suitable technique.

The active qubit die 802 may include one or more conductive contacts 818 disposed at the second face 808 of the active qubit die 802. In some embodiments, the active qubit die 802 may include one or more conductive pathways 846 between the active qubit devices 836 (or other components of the active qubit die 802) and one or more conductive contacts 818; these conductive contacts 818 may be coupled to other devices (not shown) via solder, wire bonding, or any other suitable technique. In some embodiments, the active qubit die 802 may include one or more conductive pathways 854 between one or more conductive contacts 818 and one or more conductive contacts 816; the conductive contacts 816 of the conductive pathways 854 may be coupled to conductive contacts 820 of the quantum state detector die 804 via solder, for example, and the conductive contacts 818 of the conductive pathways 854 may be coupled to other devices (not shown) via solder, wire bonding, or any other suitable technique. In some embodiments, the active qubit die 802 may include one or more conductive pathways 843 between the active qubit devices 836 (or other components of the active qubit die 802) and one or more conductive contacts 816; the conductive contacts 816 of the conductive pathways 843 may be coupled to conductive contacts 820 of the quantum state detector die 804, as shown. Generally, the active qubit die 802 may include any desired conductive pathways between various components included in the active qubit die 802 (e.g., the active qubit devices 836) and the conductive contacts 816 and/or 818. During operation of the active qubit die 802, electrical signals (such as power and/or input/output (I/O) signals) may be routed to and/or from the active qubit devices 836 (and/or other components) of the active qubit die 802 through the conductive pathways 846 and/or 842.

The quantum state detector die 804 may also include any desired conductive pathways between various components included in the quantum state detector die 804 (e.g., the detector devices 838) and the conductive contacts 820 and/or the conductive contacts 822 disposed at the second face 812 of the quantum state detector die 804. In some embodiments, the quantum state detector die 804 may include one or more conductive pathways 848 between the detector devices 838 (or other components of the quantum state detector die 804) and one or more conductive contacts 822; these conductive contacts 822 may be coupled to a package substrate 814, for example, via first level interconnects 830 (and thus the die assembly 800 may be regarded as an electronics package). In some embodiments, the quantum state detector die 804 may include one or more conductive pathways 856 between one or more conductive contacts 820 and one or more conductive contacts 822. In some embodiments, the quantum state detector die 804 may include one or more conductive pathways 841 between the detector devices 838 (or other components of the quantum state detector die 804) and one or more conductive contacts 820; the conductive contacts 820 of the conductive pathways 841 may be coupled to conductive contacts 816 of the active qubit die 802, as shown. During operation of the quantum state detector die 804, electrical signals (such as power and/or input/output (I/O) signals) may be routed to and/or from the detector devices 838 (and/or other components) of the quantum state detector die 804 through the conductive pathways 848 (or any other suitable conductive pathways).

In some embodiments, a single detector device 838 may be used to sense the quantum state of a single quantum dot formed by an active qubit device 836. In other embodiments, a single detector device 838 may be used to sense the quantum state of more than one quantum dot formed by one or more active qubit devices 836; for example, a single detector device 838 may be used to sense the quantum state of two quantum dots, or three quantum dots.

An active qubit die 802 may include any desired number and arrangement of active qubit devices 836; similarly, a quantum state detector die 804 may include any desired number and arrangement of detector devices 838. In some embodiments, as illustrated in FIG. 1, the active qubit devices 836 and the detector devices 838 may be arranged in regular rectangular spacing. In other embodiments, the active qubit devices 836 and the detector devices 838 may be arranged in any desired pattern.

In the die assembly 800 illustrated in FIG. 1A, the quantum state detector die 804 is disposed between the active qubit die 802 and a package substrate 814. In other embodiments, the active qubit die 802 may be disposed between the quantum state detector die 804 and the package substrate 814; in such embodiments, the detector devices 838 of the quantum state detector die 804 may still "face" the active qubit devices 836 of the active qubit die 802.

The package substrate 814 may include a first face 858 and an opposing second face 860. Conductive contacts 824 may be disposed at the first face 858, and conductive contacts 826 may be disposed at the second face 860. Conductive pathways 850 may extend between the conductive contacts 824 at the first face 858 and the conductive contacts 826 at the second face 860 of the package substrate 814, electrically coupling various ones of the conductive contacts 824 to various ones of the conductive contacts 826, in any desired manner. The conductive pathways 850 may include one or more conductive vias and/or one or more conductive lines, for example.

In some embodiments, the package substrate 814 may be built on a carrier material (not shown) that remains in the package substrate 814. In such embodiments, the carrier material may be a dielectric material; laser vias or other through-holes may be made through the carrier material to allow conductive pathways 850 to extend between the first face 858 and the second face 860. In some embodiments, the package substrate 814 may be or may otherwise include a silicon interposer, and the conductive pathways 850 may be through-silicon vias. Silicon may have a desirably low coefficient of thermal expansion compared with other dielectric materials that may be used in the package substrate 814, and thus may limit the degree to which the package substrate 814 expands and contracts during temperature changes relative to such other materials (e.g., polymers having higher coefficients of thermal expansion). A silicon interposer may also help the package substrate 814 achieve a desirably small line width and maintain high connection density to the quantum state detector die 804.

Limiting differential expansion and contraction may help preserve the mechanical and electrical integrity of the die assembly 800 as the die assembly 800 is fabricated (and exposed to higher temperatures) and used in a cooled environment (and exposed to lower temperatures). In some embodiments, thermal expansion and contraction in the package substrate 814 may be managed by maintaining an approximately uniform density of the conductive material in the package substrate 814 (so that different portions of the package substrate 814 expand and contract uniformly), using reinforced dielectric materials as the insulating material in the package substrate 814 (e.g., dielectric materials with silicon dioxide fillers), or utilizing stiffer materials as the insulating material in the package substrate 814 (e.g., a prepreg material including glass cloth fibers).

The conductive contacts 822 of the quantum state detector die 804 may be electrically coupled to the conductive contacts 824 of the package substrate 814 via the first level interconnects 830. In some embodiments, the first level interconnects 830 may include solder bumps or balls (as illustrated in FIG. 1A); for example, the first level interconnects 830 may be flip chip bumps disposed initially on the quantum state detector die 804 or on the package substrate 814. Second level interconnects 832 (e.g., solder balls or other types of interconnects) may couple the conductive contacts 826 on the second face 860 of the package substrate 814 to another component, such as a circuit board (not shown). Examples of arrangements of electronics packages that may include an embodiment of the die assembly 800 are discussed below with reference to FIG. 68.

During manufacturing of the die assembly 800, the active qubit die 802 may be brought into contact with the quantum state detector die 804 using a pick-and-place apparatus, for example, and a reflow or thermal compression bonding operation may be used to couple the active qubit die 802 to the quantum state detector die 804 via the die-to-die interconnects 828. Similarly, the quantum state detector die 804 may be brought in contact with the package substrate 814 using a pick-and-place apparatus, for example, and a reflow or thermal compression bonding operation may be used to couple the quantum state detector die 804 to the package substrate 814 via the first level interconnects 830. In some embodiments, a different structure may take the place of the package substrate 814; for example, the die assembly 800 may include a circuit board, interposer, or other die in the place of the package substrate 814.

The conductive contacts of the die assembly 800 may include multiple layers of material that may be selected to serve different purposes. In some embodiments, some or all of the conductive contacts may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, some or all of the conductive contacts may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the conductive pathways included in the die assembly 800 may include superconducting materials. Example superconducting materials that may be used for the structures in these conductive pathways (and/or conductive contacts) may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts may include aluminum, and the solder may include an indium-based solder.

In some embodiments, the structures and materials in the active qubit die 802 and/or the quantum state detector die 804 may be damaged if exposed to the high temperatures that are common in conventional integrated circuit processing (e.g., greater than 100 degrees Celsius, or greater than 200 degrees Celsius). In particular, in embodiments in which the die-to-die interconnects 828 or the first level interconnects 830 include solder, the solder may be a low-temperature solder (e.g., a solder having a melting point below 100 degrees Celsius) so that it can be melted to couple the associated conductive contacts without having to expose the components in the die assembly 800 to higher temperatures and risk of damage. Examples of solders that may be suitable include indium-based solders (e.g., solders including indium alloys). When low-temperature solders are used, however, these solders may not be fully solid during handling of the die assembly 800 (e.g., at room temperature or temperatures between room temperature and 100 degrees Celsius), and thus the solder of the die-to-die interconnects 828 or the first level interconnects 830 alone may not reliably mechanically couple the associated components. In some such embodiments, the die assembly 800 may further include a mechanical stabilizer to maintain mechanical coupling between the components of the die assembly 800, even when the low-temperature solder is not solid. Examples of mechanical stabilizers may include an underfill material disposed between adjacent components, a corner glue disposed between adjacent components, an overmold material disposed around adjacent components, and/or a mechanical frame to secure the adjacent components.

As noted above, different types of active qubit devices 836 may be used to generate the "active" quantum dots in the device assembly 800, and different types of detector devices 838 may be used to detect the quantum state of these active quantum dots. Discussed below are a number of embodiments of gate-stack devices 100 and SET devices 500. Any of the gate-stack devices 100 disclosed herein may be included in the active qubit devices 836 and/or the detector devices 838; similarly, any of the SET devices 500 disclosed herein may be included in the active qubit devices 836 and/or the detector devices 838. Additionally, any desired combination of the gate-stack devices 100 and/or the SET devices 500 may be used in the active qubit devices 836 and/or the detector devices 838. Other quantum dot formation/detection devices may be included in the die assembly 800 as active qubit devices 836 and/or detector devices 838.

For example, in some embodiments, the detector devices 838 may include one or more quantum point contacts (QPCs).

FIGS. 2A, 2B, and 2C are cross-sectional views of a gate-stack device 100, in accordance with various embodiments. In particular, FIG. 2B illustrates the gate-stack device 100 taken along the section A-A of FIG. 2A, and FIG. 2C illustrates the gate-stack device 100 taken along the section B-B of FIG. 2A (while FIG. 2A illustrates the gate-stack device 100 taken along the section C-C of FIGS. 2B and 2C. FIG. 2A may be considered a "top" cross-sectional view, and FIGS. 2B and 2C may be considered "side" cross-sectional views, although as noted above, such descriptions are used to facilitate the discussion and are not intended to restrict the application of disclosed embodiments. As noted above, the gate-stack device 100 illustrated in FIG. 2 may be included in the active qubit devices 836, the detector devices 838, or both, as desired. When the gate-stack device 100 of FIG. 2 is included in the active qubit devices 836, the face 165 of the gate-stack device 100 may provide (or be oriented towards) the first face 806 of the active qubit die 802 of the die assembly 800. When the gate-stack device 100 of FIG. 2 is included in the detector devices 838, the face 165 of the gate-stack device 100 may provide (or be oriented towards) the first face 810 of the quantum state detector die 804 of the die assembly 800.

The gate-stack device 100 may include one or more quantum dot formation regions 104 spaced apart by insulating material 128 (e.g., silicon oxide). Although only a single quantum dot formation region 104 is shown in FIG. 2, this is simply for ease of illustration, and more than one quantum dot formation region 104 may be included in the gate-stack device 100 (e.g., as discussed below with reference to FIG. 39). The quantum dot formation regions 104 may include a quantum well stack 146, which may be a quantum well stack including one or more quantum well layers 152. In some embodiments, as discussed below, the quantum well stack 146 may be a modulation doped stack, including one or more doped layers 137 (not illustrated in FIG. 2), and one or more barrier layers 154 (not illustrated in FIG. 2) disposed between the quantum well layer(s) 152 and the doped layer(s) 137. The relative position of the quantum well layer 152 in FIG. 2B (and in others of the accompanying drawings) is intended to represent the inclusion of the quantum well layer 152 in the quantum well stack 146, and particular arrangements of various components of the quantum well stack 146 are discussed in detail below with reference to FIGS. 37-39.

As noted above, each of the quantum dot formation regions 104 may include one or more quantum well layers 152. A quantum well layer 152 included in the quantum dot formation regions 104 may be arranged normal to the z-direction, and may provide a layer in which a two-dimensional electron gas (2DEG) may form to enable the generation of a quantum dot during operation of the gate-stack device 100, as discussed in further detail below. A quantum well layer 152 itself may provide a geometric constraint on the z-location of quantum dots in the quantum dot formation regions 104. To control the x-location and the y-location of quantum dots in the quantum dot formation regions 104, voltages may be applied to gates disposed on the quantum dot formation regions 104 to adjust the energy profile along the quantum dot formation regions 104 in the x-direction and the y-direction and thereby constrain the x-location and y-location of quantum dots within quantum wells (discussed in detail below with reference to the gates 106/108). The dimensions of the quantum dot formation regions 104 may take any suitable values. The x-length 160A and the y-length 162A, for example, may depend on the number and arrangement of gates included in the quantum dot formation region 104. In some embodiments, the z-length 164A of the quantum well stack 146 included in a quantum dot formation region 104 may be between 200 and 400 nanometers (e.g., between 250 and 350 nanometers, or equal to 300 nanometers). Insulating material and conductive pathways may be present in the peripheral region 113 around a quantum dot formation region 104, as discussed in detail below.

Multiple gates may be disposed in each of the quantum dot formation regions 104. In particular, a set of gates 105 may be disposed at the "top" of each quantum dot formation region 104. In the embodiment illustrated in FIG. 2, the set of gates 105 includes a gate 106 and four gates 108. This particular number of gates is simply illustrative, and any suitable number and arrangement of gates may be used. For example, a set of gates 105 may include three or more gates 108, arranged in any desired arrangement (e.g., as vertices of triangles or other polygons, in a rectangular or other array, in an irregular arrangement on the quantum well stack 146, etc.). Additionally, as discussed below with reference to FIG. 39, multiple quantum dot formation regions 104 may be included in a gate-stack device 100, as desired.

As shown in FIG. 2, the gate 108-1 may be disposed in an opening 111 in the gate 106, and the gate 108-2 may be disposed in a different opening 111 in the gate 106. Reference to a "gate 108" herein may refer to any of the gates 108.

A set of gates 105 may include multiple gates 108 that include at least one pair of gates spaced apart from each other in a first dimension (e.g., spaced apart from each other in the x-dimension), and at least one pair of gates spaced apart from each other in a second dimension perpendicular to the first dimension (e.g., spaced apart from each other in the y-dimension). A two-dimensional regular array of spaced-apart gates 108 is one example of such an arrangement (e.g., as illustrated in FIG. 2), but many others exist (e.g., an irregular array or other distribution). These pairs may share a gate; for example, three gates may satisfy this description if arranged accordingly. In the embodiment illustrated in FIG. 2, the gates 108 in a set 105 are spaced apart by intervening portions of the gate 106 in the set 105; in other embodiments, other materials or structures may be disposed between pairs of gates 108 in a set 105.

In the embodiment illustrated in FIG. 2A, from a top view, the gate metal 110 of the gates 106 may be shaped substantially as a "grid" having openings 111 in which the gate metal 112 of the gates 108 are at least partially disposed. Such a grid may have one or more cross-shaped portions (between a set of four adjacent openings 111) and a perimeter portion (extending around the collection of openings 111). As noted elsewhere herein, the gate metal 110 of the gates 106 may be patterned in any suitable way to define the location and shape of the gates 106 and the locations and shapes of the gates 108.

Each of the gates 106/108 may include a gate dielectric 114. In the embodiment illustrated in FIG. 2, the gate dielectric 114 for all of the gates 106/108 in a particular set of gates 105 is provided by a common layer of gate dielectric material. In other embodiments, the gate dielectric 114 for each of the gates 106/108 in a particular set of gates 105 may be provided by separate portions of gate dielectric 114 (e.g., as discussed below with reference to FIGS. 31-33). In some embodiments, the gate dielectric 114 may be a multilayer gate dielectric (e.g., with multiple materials used to improve the interface between the quantum well stack 146 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

The gate 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. Only one portion of the hardmask 116 is labeled in FIGS. 2B and 2C for ease of illustration. In some embodiments, the hardmask 116 may not be present in the gate-stack device 100 (e.g., a hardmask like the hardmask 116 may be removed during processing, as discussed below). In some embodiments, the gate metal 110 may be a superconductor, such as aluminum, titanium nitride (e.g., deposited via atomic layer deposition), or niobium titanium nitride. The sides of the gate metal 110 may be substantially parallel, as shown in FIGS. 2B and 2C, and insulating spacers 134 may be disposed on the sides of the gate metal 110. As illustrated in FIGS. 2B and 2C, the spacers 134 may be thinner farther from the quantum well stack 146 and thicker closer to the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride).

Each of the gates 108 may include a gate metal 112 and a hardmask 118. The hardmask 118 may be formed of any of the materials discussed above with reference to the hardmask 116. The gate metal 112 may be disposed between the hardmask 118 and the gate dielectric 114, and the gate dielectric 114 may be disposed between the gate metal 112 and the quantum well stack 146. In the embodiment illustrated in FIGS. 2B and 2C, the hardmask 118 may extend over the hardmask 116 (and over the gate metal 110 of the gate 106), while in other embodiments, the hardmask 118 may not extend over the gate metal 110. The gate dielectric 114 may be disposed between the gate metal 112 and the quantum well stack 146. In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the gate-stack device 100 (e.g., a hardmask like the hardmask 118 may be removed during processing, as discussed below).

The gate 108-1 may extend between the proximate spacers 134 on the sides of the corresponding opening 111 in the gate 106, as shown. In some embodiments, the gate metal 112 of the gate 108-1 may extend between the spacers 134 on the sides of the corresponding opening 111. Thus, the gate metal 112 of the gate 108-1 may have a shape that is substantially complementary to the shape of the spacers 134, as shown. Similarly, the gate 108-2 may extend between the proximate spacers 134 on the sides of the corresponding opening 111. In some embodiments in which the gate dielectric 114 is not a layer shared commonly between the associated gates 106 and 108, but instead is separately deposited on the quantum well stack 146 between the associated spacers 134, the gate dielectric 114 may extend at least partially up the sides of the associated spacers 134, and the gate metal 112 may extend between the portions of the associated gate dielectric 114 on the associated spacers 134.

The dimensions of the gates 106/108 may take any suitable values. For example, in some embodiments, the z-height 166A of the gate metal 110 may be between 40 and 75 nanometers (e.g., approximately 50 nanometers); the z-height of the gate metal 112 may be in the same range. In some embodiments (e.g., the embodiment illustrated in FIG. 2B), the z-height of the gate metal 112 may be greater than the z-height of the gate metal 110. In some embodiments, the x-length 168A of the gate metal 110 in the cross section of FIG. 2B may be between 20 and 40 nanometers (e.g., 30 nanometers). In some embodiments, the x-length 170A of the openings 111 in the gates 106 may be between 40 and 60 nanometers (e.g., 50 nanometers); the y-length 171A of the openings 111 may take any of the values described herein for the x-length 170A, for example. In some embodiments, the thickness 172 of the spacers 134 may be between 1 and 10 nanometers (e.g., between 3 and 5 nanometers, between 4 and 6 nanometers, or between 4 and 7 nanometers). The x-length of the gate metal 112 may depend on the dimensions of the gates 106 and the spacers 134, as illustrated in FIG. 2B.

During operation of the gate-stack device 100, voltages may be applied to the gates 106/108 to adjust the potential energy in the quantum well layer 152 in the quantum dot formation region 104 to create quantum wells of varying depths in which quantum dots 142 may form. Only one quantum dot 142 is labeled with a reference numeral in FIG. 2B for ease of illustration, but five are indicated as dotted circles in the quantum well layer 152 of the quantum well stack 146. In some embodiments, the quantum well stack 146 and the quantum well layer 152 may be sized and spaced so that the distance between the quantum well layer 152 and the face 165 is less than 100 nanometers; when the gate-stack device 100 is included in the die 802 or 804 in the die assembly 800, the distance between the quantum well layer 152 and the die 804 or 802, respectively, may be less than 200 nanometers.

The spacers 134 may themselves provide "passive" barriers between quantum wells under the gates 106/108 in the quantum well layer 152, and the voltages applied to different ones of the gates 106/108 may adjust the potential energy under the gates 106/108 in the quantum well layer; decreasing the potential energy may form quantum wells, while increasing the potential energy may form quantum barriers.

In some embodiments, the gate-stack device 100 may include a reservoir of charge carriers. These charge carriers may flow through the quantum well layer 152, and may be "trapped" to form quantum dots 142, as discussed above. In some embodiments, one or more reservoirs of charge carriers may be disposed in the peripheral region 113 of the gate-stack device 100, and the quantum well layer 152 may extend into the reservoirs. Such reservoirs may be formed by, e.g., heavily doping appropriate regions of the gate-stack device 100 (e.g., by ion implantation). As noted above, in some embodiments, the quantum well stack 146 may include one or more doped layers 137 (not shown in FIG. 2) that may serve as a reservoir of charge carriers for the gate-stack device 100 (and thus the quantum well stack 146 may be a "modulation doped stack"). For example, an n-type doped layer may supply electrons for electron-type quantum dots 142, and a p-type doped layer may supply holes for hole-type quantum dots 142. A doped layer 137 may be spaced apart from the quantum well layer 152 in the quantum well stack 146 (e.g., by a barrier layer 154, also not shown in FIG. 2) to allow charge carriers to flow into the quantum well layer 152 without "contaminating" the quantum well layer 152 with the ionized impurities that would be present in the quantum well layer 152 if it were directly doped. Examples of doped layers 137, barrier layers 154, and quantum well layers 152 are discussed in detail below (e.g., with reference to FIGS. 37-39).

The gate-stack devices 100 disclosed herein may be used to form electron-type or hole-type quantum dots 142. Note that the polarity of the voltages applied to the gates 106/108 to form quantum wells/barriers depend on the charge carriers used in the gate-stack device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in the associated quantum well layer 152 in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106/108 may decrease the potential barrier under the gate 106/108 (thereby forming a potential well in the associated quantum well layer 152 in which a hole-type quantum dot 142 may form). The gate-stack devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the gate-stack device 100 to tune the potential interaction between quantum dots 142 under adjacent gates. For example, if two adjacent quantum dots 142 (e.g., one quantum dot 142 under a gate 108 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108 and neighboring gates, the differences in potential between various gates 106/108 may be adjusted, and thus the interaction tuned. In some applications, the gates 108 may be used as plunger gates to enable the formation of quantum dots 142 under the gates 108, while the gates 106 may be used as barrier gates to adjust the potential barrier between quantum dots 142 formed under adjacent gates 108.

Conductive vias and lines may make contact with the gates 106/108, and with the quantum well stack 146, to enable electrical connection to the gates 106/108 and the quantum well stack 146 to be made in desired locations. As shown in FIG. 2, the gate 106 may extend away from the quantum well stack 146, and conductive vias 120 may contact the gate 106. The conductive vias 120 may extend through the hardmask 116 and the hardmask 118 to contact the gate metal 110 of the gate 106. The gates 108 may extend away from the quantum well stack 146, and conductive vias 122 may contact the gates 108. The conductive vias 122 may extend through the hardmask 118 to contact the gate metal 112 of the gates 108.

In some embodiments, the gate-stack device 100 may include conductive pathways (including, e.g., vias and lines) to the quantum well layer 152 of the quantum well stack 146. In other embodiments, the gate-stack device 100 may not include such conductive pathways to the quantum well layer 152 of the quantum well stack 146. Embodiments of the gate-stack device 100 that do include conductive pathways to the quantum well layer 152 may use the conductive pathways to couple the quantum well layer 152 to additional sources/drains of carriers (not shown), which may be provided by implant doping or outer accumulation gates, for example. Such conductive pathways may not be needed (and may thus be beneficially omitted for manufacturing simplicity) when doped layer 137 of a modulation doped stack are able to provide an adequate volume of carriers to the quantum well layer 152.

In some embodiments in which the quantum well stack 146 is a modulation doped stack, the gate-stack device 100 may include conductive pathways (including, e.g., vias and lines) to the doped layer 137 of the quantum well stack 146. In other embodiments, the gate-stack device 100 may not include such conductive pathways to the doped layer 137 of the quantum well stack 146. Embodiments of the gate-stack device 100 that do include conductive pathways to the doped layer 137 may use the conductive pathways to provide further carriers to the doped layer 137; for example, after parent donor atoms have donated their electrons, more electrons may be provided to the doped layer 137 by an appropriate voltage provided to the doped layer 137 through conductive pathways. Providing conductive pathways to the doped layer 137, therefore, may allow the carrier density in the doped layer 137 to be dynamically adjusted. Such conductive pathways may be omitted, in some embodiments, for manufacturing simplicity.

Various ones of the accompanying drawings depict conductive pathways to the quantum well stack 146 for illustrative purposes. These conductive pathways, discussed below, may make electrical contact with the quantum well layer 152 and/or the doped layer 137, and additional conductive pathways like those illustrated may be included to make any desired combination of contacts. As noted above, in some embodiments, no conductive pathways may extend to the quantum well layer 152 or the doped layer 137, and thus the pathways to the quantum well stack 146 illustrated in various ones of the accompanying drawings may be omitted.

In the embodiment illustrated in FIG. 2, a conductive pathway to the quantum well layer 152 and/or a doped layer 137 (not shown) may include conductive vias 136 (extending through the insulating material 130) and conductive bridges 147-1 (extending into the quantum well stack 146). In the embodiment illustrated in FIG. 2, the conductive bridges 147 may be formed by ion implantation of dopants (e.g., n-type or p-type dopants, as appropriate) into the quantum well stack 146 so as to form a conductive region between the conductive vias 136 and the quantum well layer 152 and/or a doped layer 137 (not shown) (e.g., as discussed below). The conductive bridges 147 may take any of the forms discussed herein. In other embodiments, conductive pathways to one or more components in the quantum well stack 146 may take other forms (e.g., as discussed below).

The gate-stack device 100 may include further conductive vias and/or lines (not shown) to make electrical contact to the gates 106/108 and/or the quantum well stack 146, as desired. The conductive vias and lines included in a gate-stack device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

In some embodiments in which the quantum well stack 146 is a modulation doped stack, during operation, a bias voltage may be applied to the quantum well layers 152 (e.g., through the appropriate conductive pathways) to cause current to flow through the quantum well layers 152. When the doped layers 137 are doped with an n-type material, this voltage may be positive; when the doped layers 137 are doped with a p-type material, this voltage may be negative. The magnitude of this bias voltage may take any suitable value (e.g., between 0.25 volts and 2 volts). Layers other than the quantum well layer 152 in the quantum well stack 146 (e.g., the doped layer 137 of the quantum well stack 146) may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility.

The conductive vias 120, 122, and 136 may be electrically isolated from each other by various insulating materials, including the insulating material 130, as shown. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown in FIG. 2) included in the gate-stack device 100 may have a width that is 100 nanometers or greater, and a pitch of 100 nanometers or greater. The particular arrangement of conductive vias and lines shown in FIG. 2 is simply illustrative, and any electrical routing arrangement may be implemented.

In embodiments in which the gate-stack device 100 is an active qubit device 836 in the active qubit die 802, the quantum dots 142 in the quantum well layer 152 may be used as "active" quantum dots in the sense that these quantum dots 142 act as qubits and are controlled (e.g., by voltages applied to the gates 106/108) to perform quantum computations. In embodiments in which the gate-stack device 100 is a detector device 838 in the quantum state detector die 804, the quantum dots 142 in the quantum well layer 152 may be used as "read" quantum dots in the sense that these quantum dots 142 may sense the quantum state of the "active" quantum dots formed by the active qubit devices 836 in the active qubit die 802 by detecting the electric field generated by the charge in the active quantum dots, and may convert the quantum state of the active quantum dots into electrical signals that may be detected by the gates 106/108.

The gate-stack devices 100 disclosed herein may be manufactured using any suitable techniques. FIGS. 3-19 illustrate various example stages in the manufacture of the gate-stack device 100 of FIG. 2, in accordance with various embodiments. Although the particular manufacturing operations discussed below with reference to FIGS. 3-19 are illustrated as manufacturing a particular embodiment of the gate-stack device 100, these operations may be applied to manufacture many different embodiments of the gate-stack device 100, as discussed herein. Any of the elements discussed below with reference to FIGS. 3-19 may take the form of any of the embodiments of those elements discussed above (or otherwise disclosed herein). For ease of illustration, not all elements in each of FIGS. 3-19 are expressly labeled with reference numerals, but reference numerals for each element are included among the drawings of FIGS. 3-19.

Figure 3:
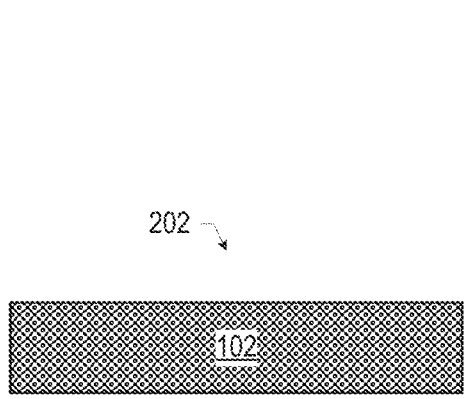
FIGS. 3-5, 6A, 6B, 6C, 7-8, 9A, 9B, and 10-19 illustrate various example stages in the manufacture of the gate-stack device of FIGS. 2A, 2B, and 2C, in accordance with various embodiments.

FIG. 3 illustrates a cross-sectional view of an assembly 202 including a base 102. The base 102 may include any suitable semiconductor material or materials, or any other suitable structure on which to perform the subsequent operations. In some embodiments, the base 102 may include a semiconductor material. For example, the base 102 may include silicon (e.g., may be formed from a silicon wafer).

Figure 4:
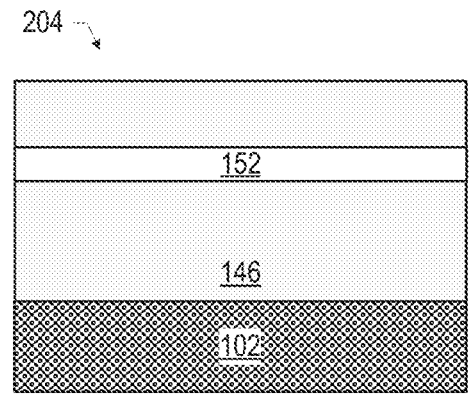

FIG. 4 illustrates a cross-sectional view of an assembly 204 subsequent to providing a quantum well stack 146 on the base 102 of the assembly 202 (FIG. 3). The quantum well stack 146 may include at least one quantum well layer 152. When the quantum well stack 146 is a modulation doped stack, the quantum well stack 146 may also include at least one doped layer 137 (not shown), and at least one barrier layer 154 (not shown). As discussed above, a 2DEG may form in the quantum well layer 152 during operation of the gate-stack device 100. Various embodiments of the quantum well stack 146 are discussed below with reference to FIGS. 37-39.

Figure 5:
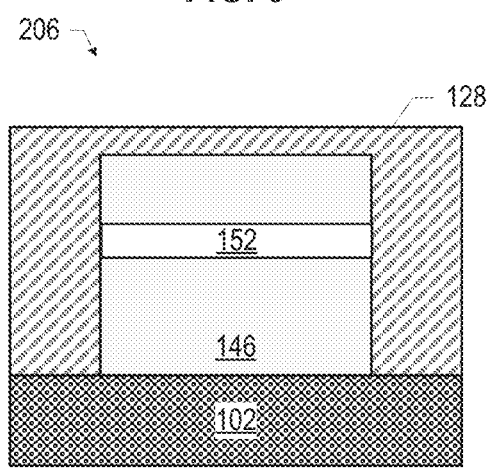

FIG. 5 illustrates a cross-sectional view of an assembly 206 subsequent to etching the quantum well stack 146 of the assembly 204 (FIG. 4) into a desired shape, then providing an insulating material 128 around the etched quantum well stack 146. The size and shape of the quantum well stack 146 after etching may take any suitable form (e.g., the substantially rectangular solid form illustrated in FIG. 2 and FIGS. 5-6). The quantum well stack 146 may be patterned and etched using any suitable technique known in the art. For example, a combination of dry and wet etch chemistry may be used to shape the quantum well stack 146, and the appropriate chemistry may depend on the materials included in the assembly 204, as known in the art. Any suitable material may be used as the insulating material 128 to electrically insulate the quantum well stack 146. As noted above, in some embodiments, the insulating material 128 may be a dielectric material, such as silicon oxide. Although the etched quantum well stacks 146 are illustrated in FIG. 5 as substantially rectangular with parallel sidewalls, this is simply for ease of illustration, and the etched quantum well stacks 146 may have any suitable shape (e.g., a shape appropriate to the manufacturing processes used to shape the quantum well stacks 146). For example, in some embodiments, the etched quantum well stacks 146 may be tapered, narrowing as they extend away from the base 102 (FIG. 5). In some embodiments, the quantum well stacks 146 may taper by 3-10 nanometers in x-width for every 100 nanometers in z-height (e.g., 5 nanometers in x-width for every 100 nanometers in z-height).

Figure 6A:
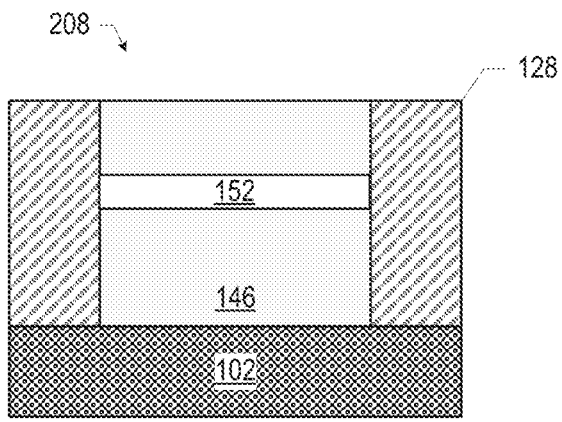

FIG. 6A illustrates a cross-sectional view of an assembly 208 subsequent to planarizing the assembly 206 (FIG. 5) to remove the insulating material 128 above the quantum well stack 146. In some embodiments, the assembly 206 may be planarized into the assembly 208 using a chemical mechanical polishing (CMP) technique.

Figure 6B:
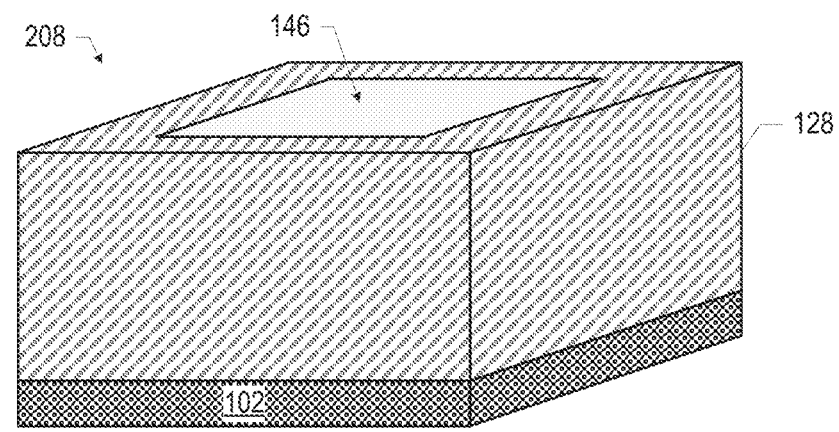
Figure 6C:
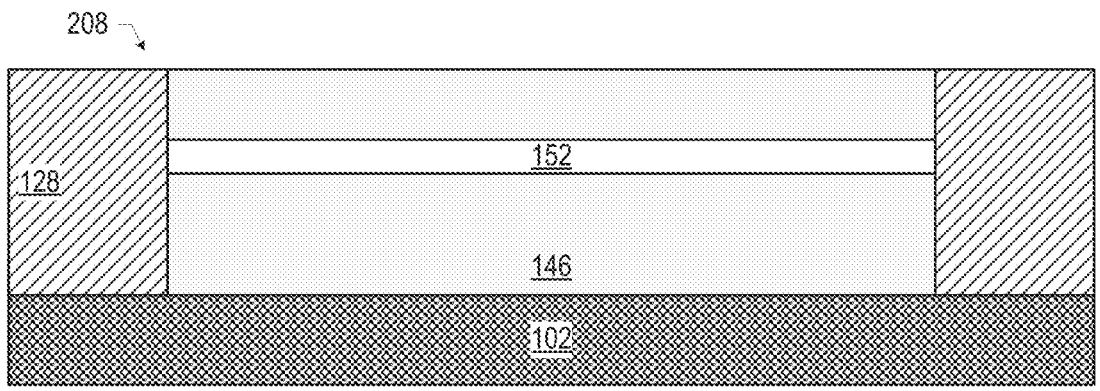

FIG. 6B is a perspective view of at least a portion of the assembly 208, showing the quantum well stack 146 extending from the base 102 and laterally insulated by the insulating material 128. FIG. 6C is another cross-sectional view of the assembly 208.

Figure 7:
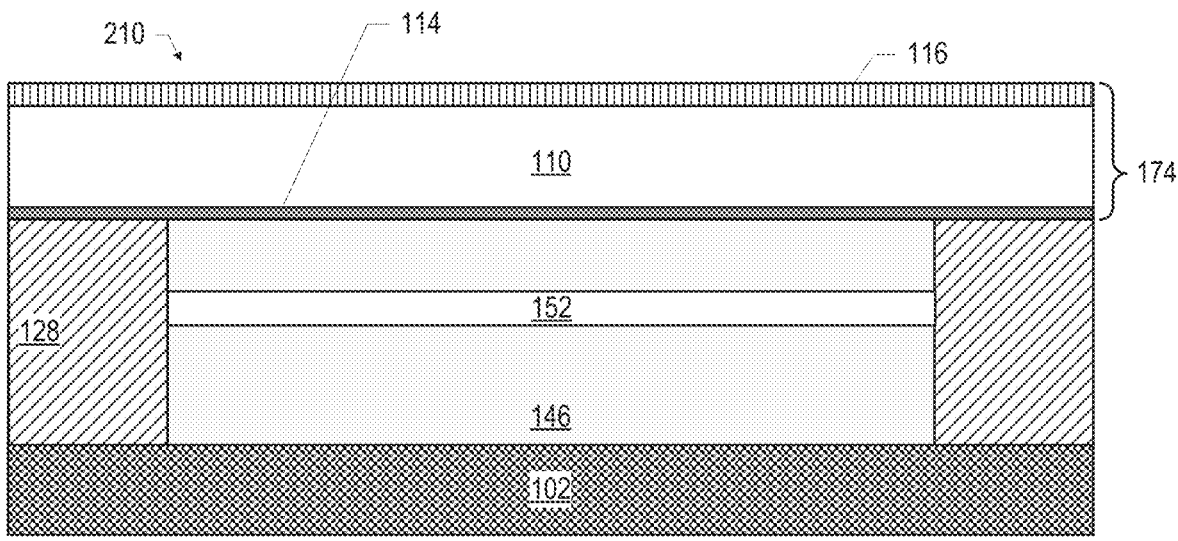

FIG. 7 is a cross-sectional view of an assembly 210 subsequent to forming a gate stack 174 on the quantum well stack 146 of the assembly 208 (FIG. 6). The gate stack 174 may include the gate dielectric 114, the gate metal 110, and a hardmask 116. The hardmask 116 may be formed of an electrically insulating material, such as silicon nitride or carbon-doped nitride.

Figure 8:
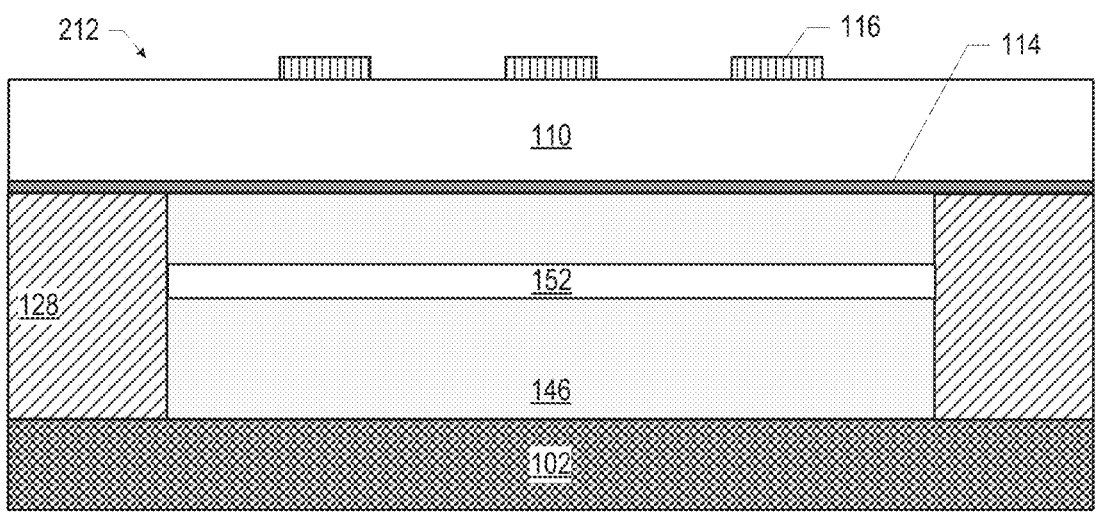

FIG. 8 is a cross-sectional view of an assembly 212 subsequent to patterning the hardmask 116 of the assembly 210 (FIG. 7). The pattern applied to the hardmask 116 may correspond to the locations for the gate 106, as discussed below. The hardmask 116 may be patterned by applying a resist, patterning the resist using lithography, and then etching the hardmask (using dry etching or any appropriate technique).

Figure 9A:
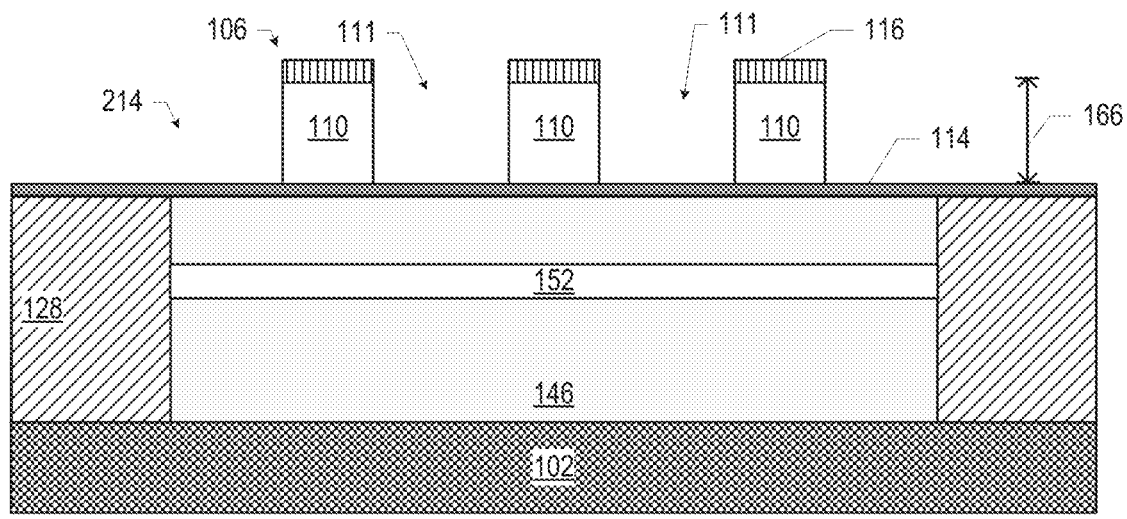
Figure 9B:
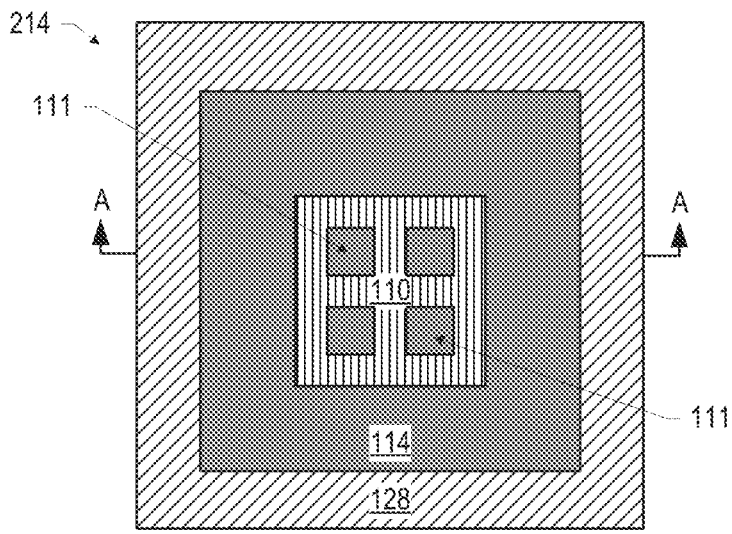

FIG. 9A is a cross-sectional view of an assembly 214 subsequent to etching the assembly 212 (FIG. 8) to remove the gate metal 110 that is not protected by the patterned hardmask 116 to form the gate 106. In some embodiments, as illustrated in FIG. 9A, the gate dielectric 114 may remain after the etched gate metal 110 is etched away; in other embodiments, the gate dielectric 114 may also be etched during the etching of the gate metal 110. Etching the gate metal 110 may form openings 111 in the gate metal 110 (and the hardmask 116) that extend down to the gate dielectric 114. FIG. 9B is a top view of the assembly 214, depicting the openings 111 as substantially rectangular in footprint. Although a particular number of particular shapes of the openings 111 are illustrated in FIG. 9 in a particular arrangement, this is simply an illustrative embodiment and the openings 111 may have any desired and appropriate shape (e.g., a footprint that is circular, square, an oval, a polygon, etc.), number, or arrangement (e.g., in a rectangular array, a non-rectangular array, a regular or irregular arrangement, etc.).

Figure 10:
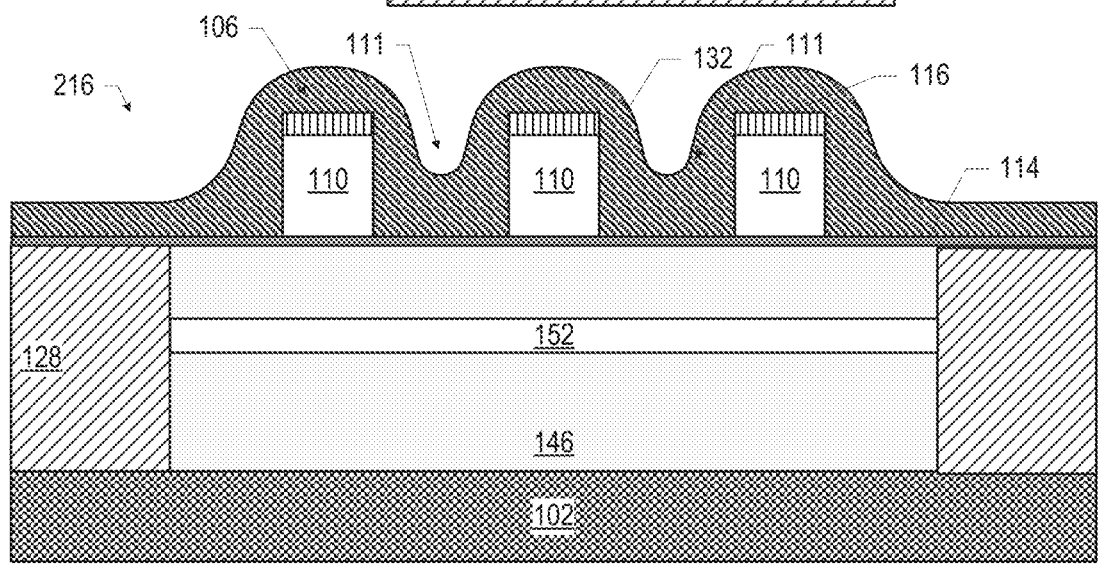

FIG. 10 is a cross-sectional view of an assembly 216 subsequent to providing spacer material 132 on the assembly 214 (FIG. 9). The spacer material 132 may include any of the materials discussed above with reference to the spacers 134, for example, and may be deposited using any suitable technique. For example, the spacer material 132 may be a nitride material (e.g., silicon nitride) deposited by sputtering. The spacer material 132 may at least partially fill the openings 111.

Figure 11:
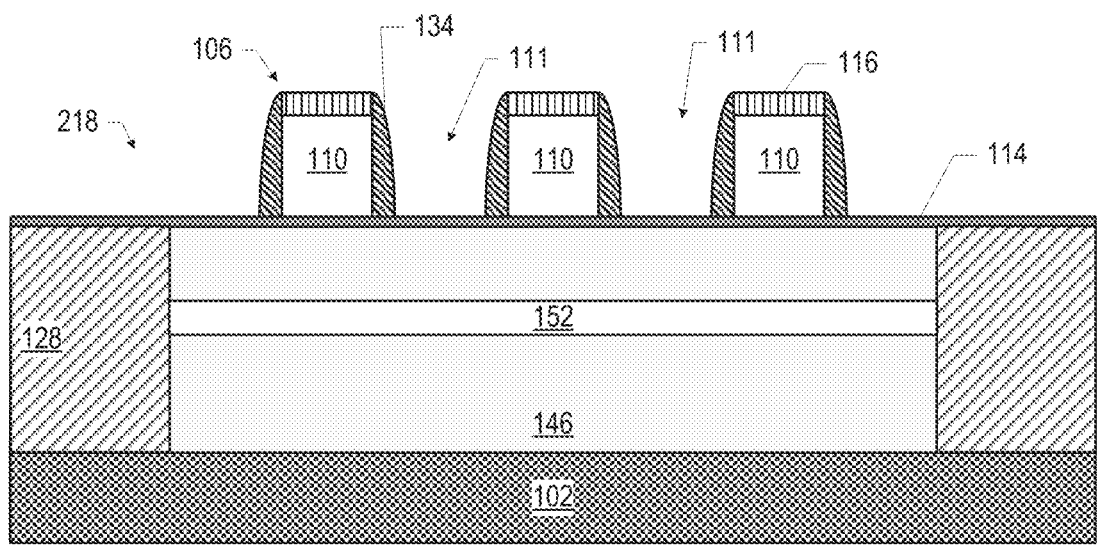

FIG. 11 is a cross-sectional view of an assembly 218 subsequent to etching the spacer material 132 of the assembly 216 (FIG. 10), leaving spacers 134 formed of the spacer material 132 on the side faces of the gate 106 (e.g., on the sides of the hardmask 116 and the gate metal 110). The etching of the spacer material 132 may be an anisotropic etch, etching the spacer material 132 "downward" to remove the spacer material 132 on top of the gate 106 and in some of the area between the gate metal 110 of the gate 106 (e.g., at the "bottoms" of the openings 111), while leaving the spacers 134 on the sides of the gate 106. In some embodiments, the anisotropic etch may be a dry etch.

Figure 12:
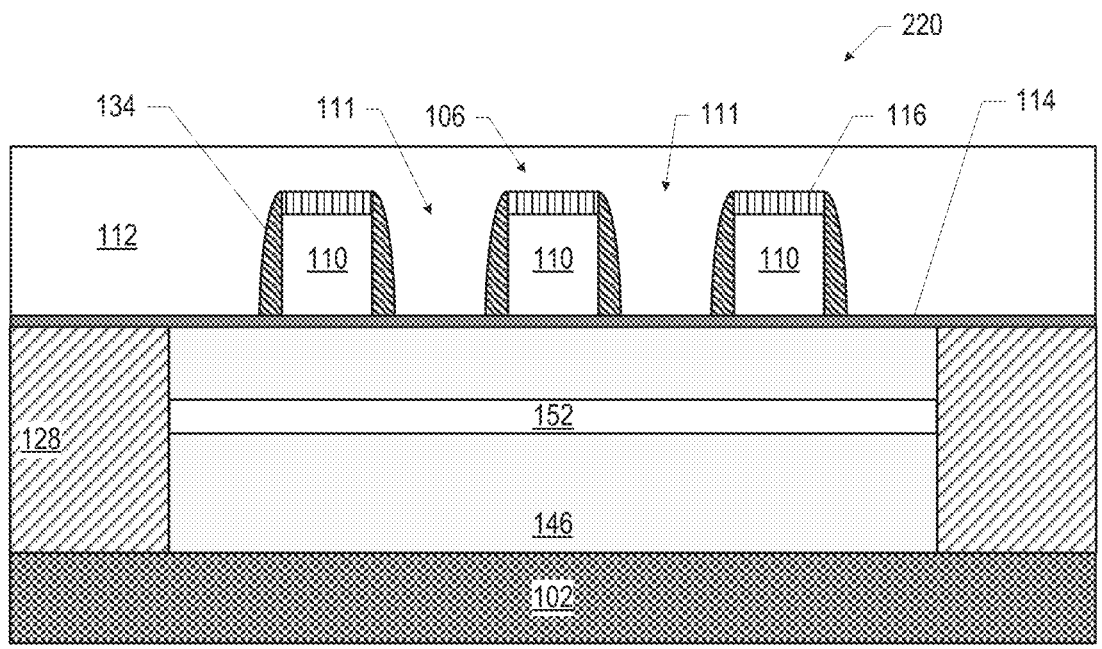

FIG. 12 is a cross-sectional view of an assembly 220 subsequent to providing the gate metal 112 on the assembly 218 (FIG. 11). The gate metal 112 may fill the openings 111 between adjacent portions of the gate 106, and may extend over the tops of the gate 106 and beyond the outer side faces of the gate 106.

Figure 13:
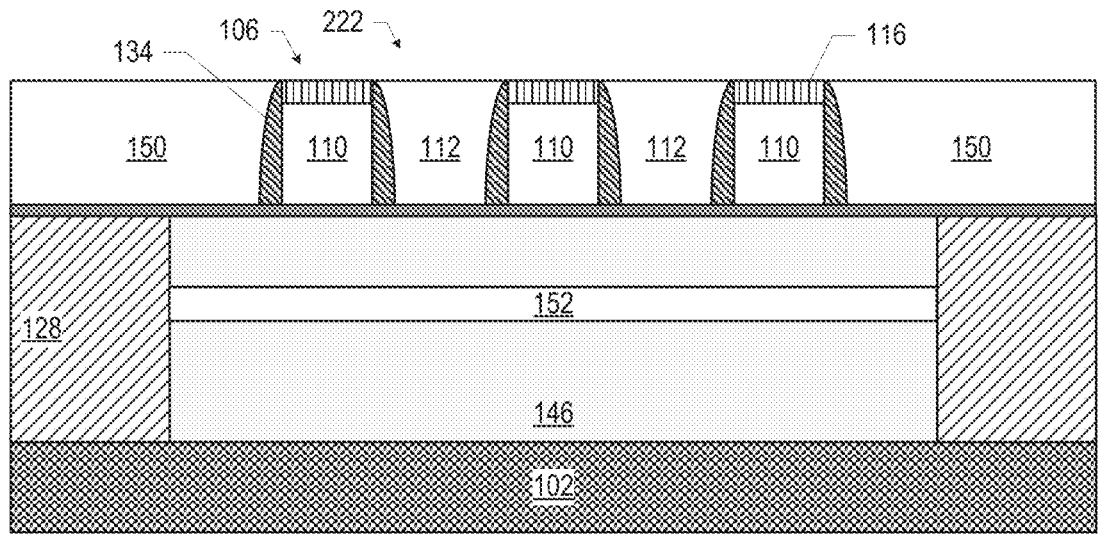

FIG. 13 is a cross-sectional view of an assembly 222 subsequent to planarizing the assembly 220 (FIG. 12) to remove the gate metal 112 above the gate 106. In some embodiments, the assembly 220 may be planarized to form the assembly 222 using a CMP technique. Some of the remaining gate metal 112 may fill the openings 111 between adjacent portions of the gate 106, while other portions 150 of the remaining gate metal 112 may be located "outside" of the gate 106.

Figure 14:
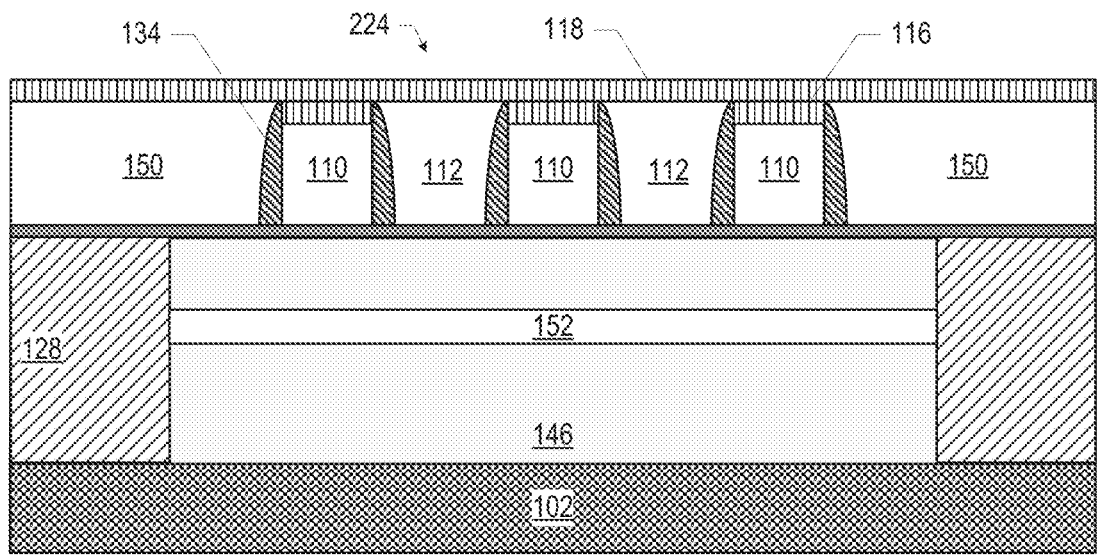

FIG. 14 is a cross-sectional view of an assembly 224 subsequent to providing a hardmask 118 on the planarized surface of the assembly 222 (FIG. 13). The hardmask 118 may be formed of any of the materials discussed above with reference to the hardmask 116, for example.

Figure 15:
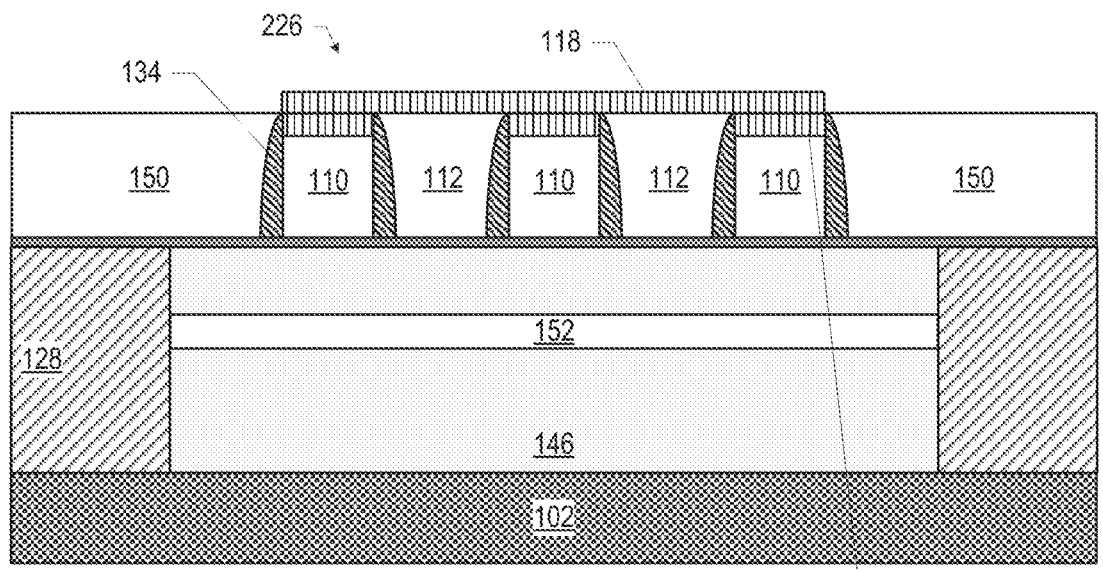

FIG. 15 is a cross-sectional view of an assembly 226 subsequent to patterning the hardmask 118 of the assembly 224 (FIG. 14). The pattern applied to the hardmask 118 may extend over the hardmask 116 (and over the gate metal 110 of the gate 106, as well as over the locations for the gates 108 (as illustrated in FIG. 2B). The hardmask 118 may be non-coplanar with the hardmask 116, as illustrated in FIG. 15. The hardmask 118 illustrated in FIG. 15 may thus be a common, continuous portion of hardmask 118 that extends over all of the hardmask 116; in other embodiments, the hardmask 118 may not be disposed over the entirety of the hardmask 116. The hardmask 118 may be patterned using any of the techniques discussed above with reference to the patterning of the hardmask 116, for example.

Figure 16:
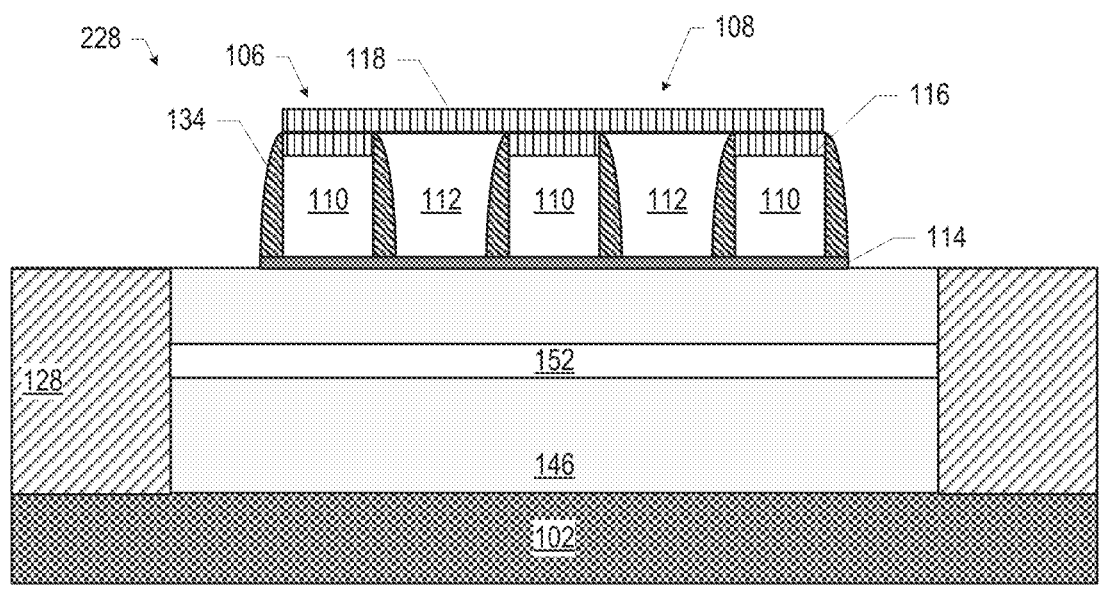

FIG. 16 is a cross-sectional view of an assembly 228 subsequent to etching the assembly 226 (FIG. 15) to remove the portions 150 that are not protected by the patterned hardmask 118 to form the gates 108. Portions of the hardmask 118 may remain on top of the hardmask 116, as shown. The operations performed on the assembly 226 may include removing any gate dielectric 114 that is "exposed" on the quantum well stack 146, as shown. The excess gate dielectric 114 may be removed using any suitable technique, such as chemical etching or silicon bombardment.

Figure 17:
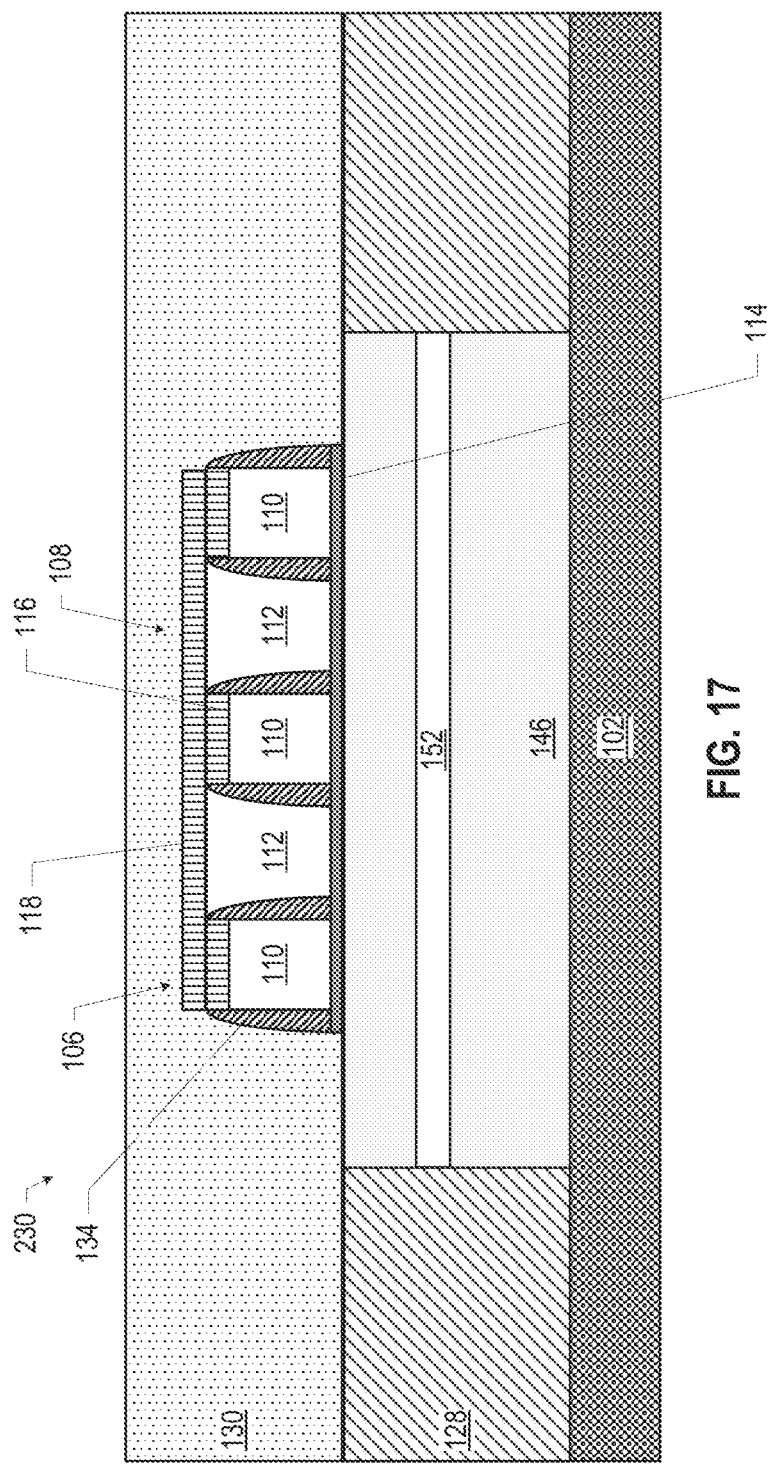

FIG. 17 is a cross-sectional view of an assembly 230 subsequent to providing an insulating material 130 on the assembly 228 (FIG. 16). The insulating material 130 may take any of the forms discussed above. For example, the insulating material 130 may be a dielectric material, such as silicon oxide. The insulating material 130 may be provided on the assembly 228 using any suitable technique, such as spin coating, chemical vapor deposition (CVD), or plasma-enhanced CVD (PECVD). In some embodiments, the insulating material 130 may be polished back after deposition, and before further processing. In some embodiments, the assembly 230 may be planarized to remove the hardmasks 116 and 118, then additional insulating material 130 may optionally be provided on the planarized surface; in such an embodiment, the hardmasks 116 and 118 would not be present in the gate-stack device 100.

Figure 18:
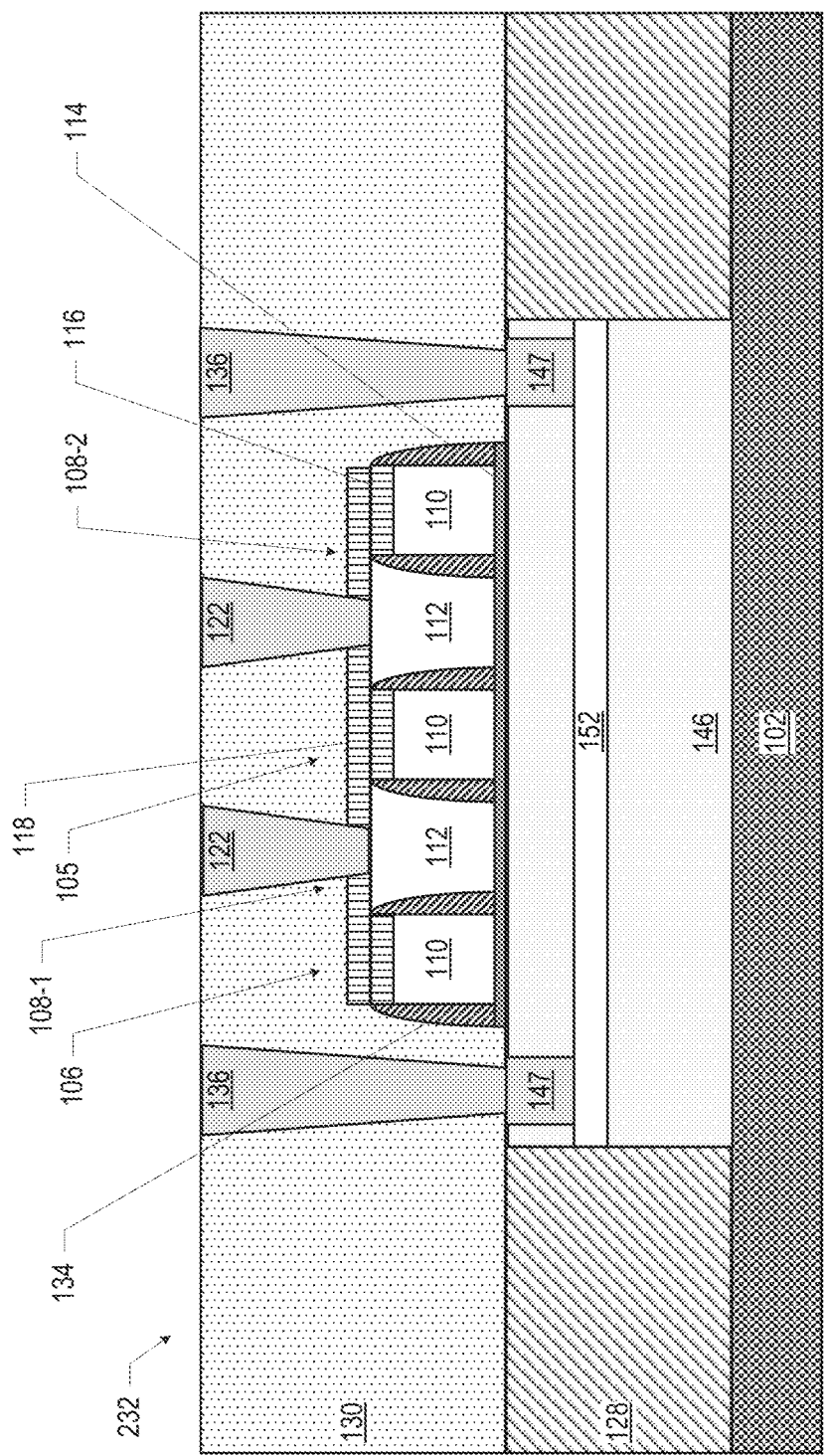

FIG. 18 is a cross-sectional view of an assembly 232 subsequent to forming conductive vias 122 in electrical contact with the gate metal 112 of the gates 108 of the assembly 230 (FIG. 17), as well as forming conductive vias 120 in electrical contact with the gate metal 110 of the gate 106 (not shown in FIG. 18, but illustrated in FIG. 2C). FIG. 18 also illustrates conductive bridges 147 and conductive vias 136 in electrical contact with the quantum well layer 152 and/or a doped layer 137 (not shown) of the quantum well stack 146. The conductive vias and any desired lines may be formed using any conventional interconnect technique (e.g., forming cavities for the vias, filling the cavities with conductive material for the vias, depositing additional insulating material 130, forming trenches for the lines, filling the trenches with conductive material for the lines, etc.). Generally, conductive vias and lines included in the gate-stack devices 100 disclosed herein may be formed using any suitable additive, subtractive, semi-additive/subtractive, or other known interconnect formation technique. The conductive material included in the assembly 232 may include any suitable ones of the materials disclosed herein (e.g., a superconducting material), and the conductive material may be provided to form the vias and lines using any suitable deposition or growth technique (e.g., sputtering, electroless plating, CVD, ALD, or electroplating).

In some embodiments, the conductive bridges 147 may be formed by ion implantation before formation of the conductive vias 136. For example, the conductive vias 136 and the conductive bridges 147 may be formed by first forming cavities in the insulating material 130. The cavities may extend down to the quantum well stack 146, and in some embodiments may be tapered so as to be narrower proximate to the quantum well stack 146. The cavities may be formed using any suitable technique (e.g., laser or mechanical drilling, or using conventional lithography techniques for patterning and etching the cavities in a low dielectric insulating material 130). After forming the cavities, ion implantation may be performed in the quantum well stack 146 at the base of the cavities to create conductive bridges 147 in the quantum well stack 146 between the cavities and the quantum well layer 152 and/or a doped layer 137 (as desired). The type of dopant (e.g., n-type or p-type) implanted in the quantum well stack 146 to form the conductive bridges 147 may depend on the type of gate-stack device 100 (e.g., an n-type dopant for an electron-type device, and a p-type dopant for a hole-type device), and the density of doping may be selected to achieve a desired amount of conductivity for the relevant carrier. The cavities may then be filled with conductive material to form the conductive vias 136.

In some embodiments, the conductive bridges 147 may be formed by metal diffusion into the quantum well stack 146. In such an embodiment, cavities may be formed as discussed above, then the cavities may be filled with a conductive material to form the conductive vias 136, without performing ion implantation in between. After the conductive vias 136 are formed, the conductive vias 136 may be annealed to drive metal atoms from the conductive vias 136 into the quantum well stack 146 to form the conductive bridges 147 between the conductive vias 136 and the quantum well layer 152 and/or a doped layer 137 (not shown). The parameters of the annealing process may depend on the materials used in the gate-stack device 100, and on the desired properties of the conductive bridges 147.

In some embodiments, the conductive bridges 147 may be a part of the conductive vias 136. In particular, cavities may be formed that extend into the quantum well stack 146 to expose the doped layer 137 (not shown) and/or the quantum well layer 152. The cavities may then be filled with a conductive material to form the conductive bridges 147 (the portion of conductive material within the contours of the quantum well stack 146) and the conductive vias 136 (the portion of conductive material in the insulating material 130).

As discussed above, in some embodiments, the gate-stack device 100 may not include conductive pathways to the quantum well layer 152 and/or any doped layer(s) 137 in the quantum well stack 146. In such embodiments, the conductive vias 136 and the conductive bridges 147 may be omitted.

Figure 19:
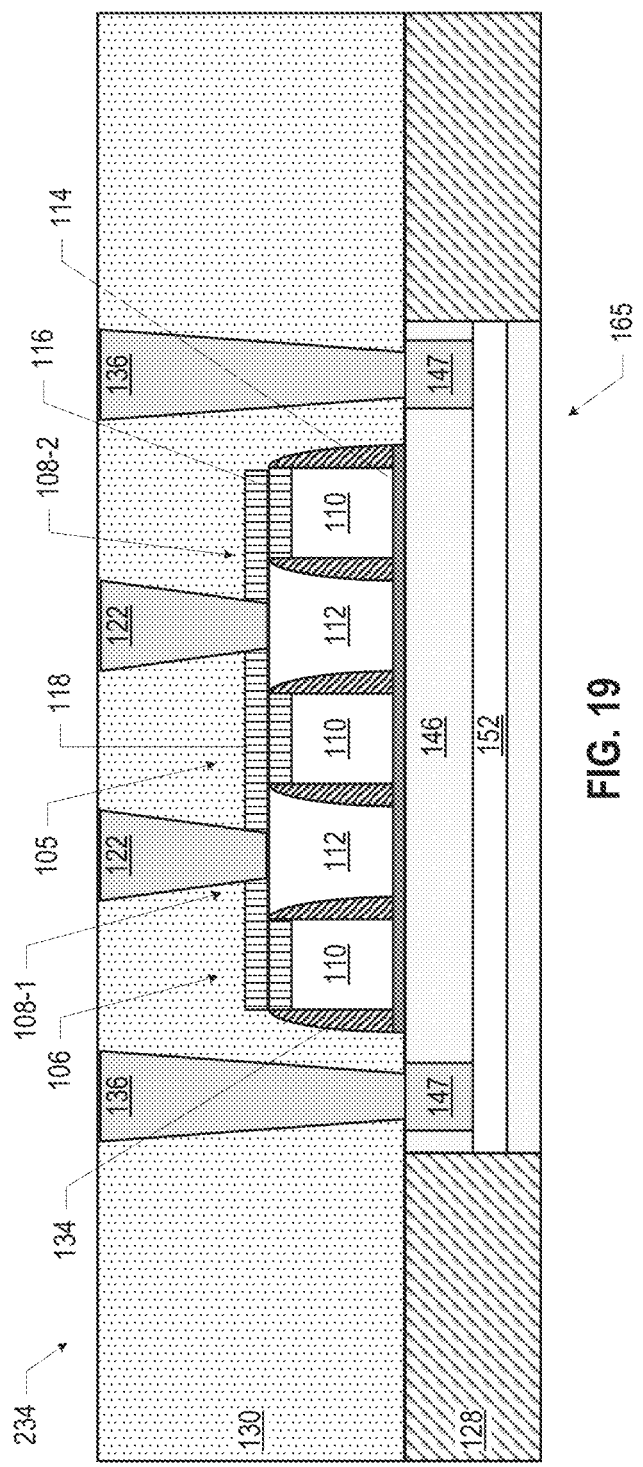

FIG. 19 is a cross-sectional view of an assembly 234 subsequent to removing the base 102 from the assembly 232 (FIG. 18). In some embodiments, this may include polishing back the quantum well stack 146 to bring the face 165 of the assembly 234 closer to the quantum well layer 152, reducing the distance between the quantum well layer 152 and the face 165. The remainder of the quantum well stack 146 may remain secured to the gates 106/108 and the insulating material 130. Any suitable technique may be used to separate the base 102 from the rest of the assembly 232 to form the assembly 234. For example, in some embodiments, an ion implantation and wafer bonding technique may be used in which the a support is adhered to the "top" surface of the assembly 232 and then the base 102 at the "bottom" surface is polished or etched away. In some embodiments, the base 102 may be mechanically separated from the rest of the assembly 232, and then the "broken" surface of the assembly 234 may be polished or etched.

The resulting assembly 234 may take the form of the gate-stack device 100 discussed above with reference to FIG. 2. In some embodiments, the assembly 234 may be planarized to remove the hardmasks 116 and 118, then additional insulating material 130 may be provided on the planarized surface before forming the conductive vias 120, 122, and 136; in such an embodiment, the hardmasks 116 and 118 would not be present in the gate-stack device 100.

Figure 20A:
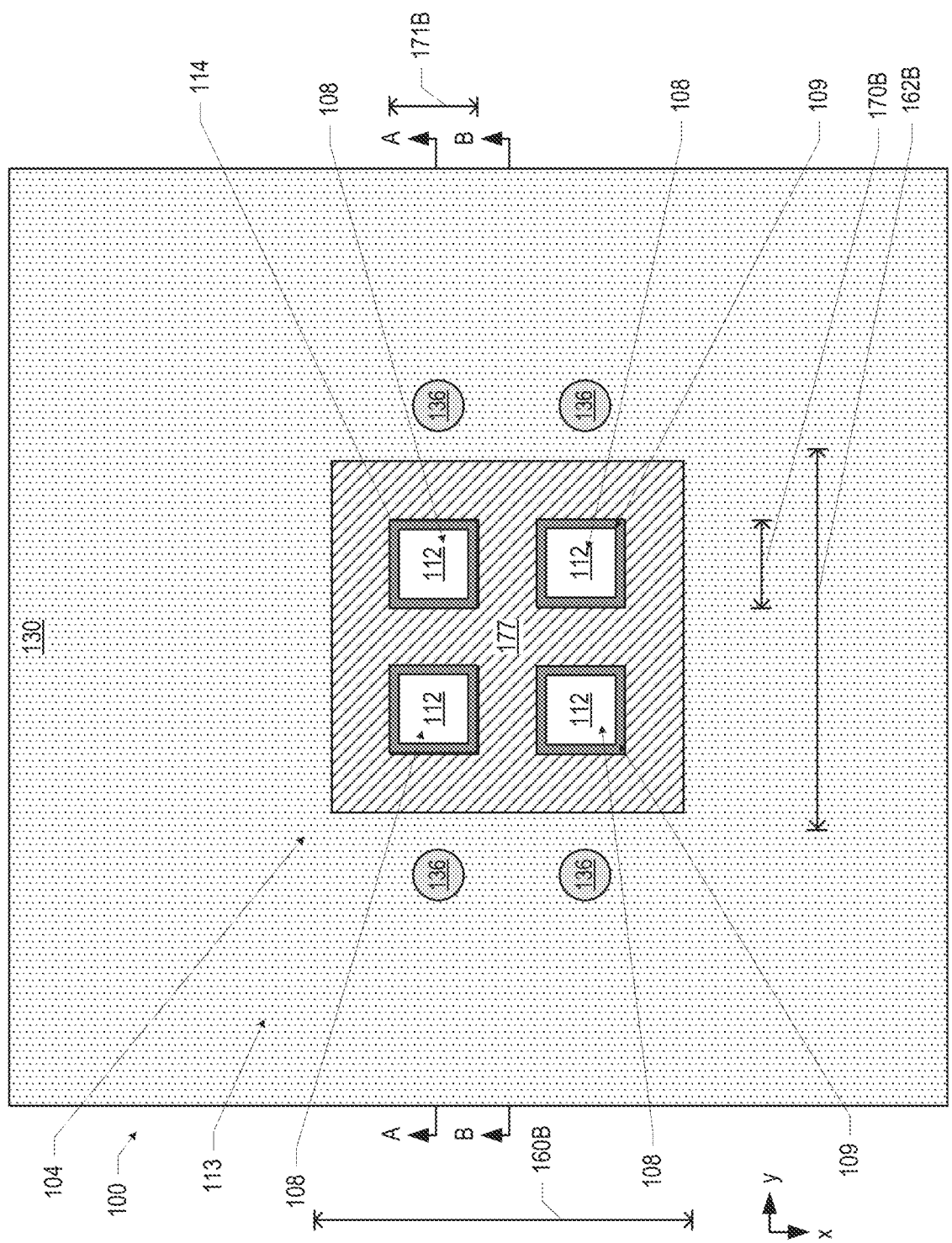

FIGS. 20A, 20B, and 20C illustrate another embodiment of a gate-stack device 100. In particular, FIG. 20B illustrates the gate-stack device 100 taken along the section A-A of FIG. 20A, and FIG. 20C illustrates the gate-stack device 100 taken along the section B-B of FIG. 20A (while FIG. 20A illustrates the gate-stack device 100 taken along the section C-C of FIGS. 20B and 20C. Like FIG. 2B, FIG. 20A may be considered a "top" cross-sectional view and, like FIGS. 2B and 2C, FIGS. 20B and 20C may be considered "side" cross-sectional views, although as noted above, such descriptions are used to facilitate the discussion and are not intended to restrict the application of disclosed embodiments. As noted above, the gate-stack device 100 illustrated in FIG. 20 may be included in the active qubit devices 836, the detector devices 838, or both, as desired. When the gate-stack device 100 of FIG. 20 is included in the active qubit devices 836, the face 169 of the gate-stack device 100 may provide (or be oriented towards) the first face 806 of the active qubit die 802 of the die assembly 800. When the gate-stack device 100 of FIG. 20 is included in the detector devices 838, the face 169 of the gate-stack device 100 may provide (or be oriented towards) the first face 810 of the quantum state detector die 804 of the die assembly 800.

The gate-stack device 100 of FIG. 20 may include one or more quantum dot formation regions 104 spaced apart by insulating material 128 (e.g., silicon oxide), and may share a number of structural features with the gate-stack device 100 of FIG. 2, as illustrated. A number of these shared features may not be discussed separately with reference to FIG. 20, but these features may take the form of any of the embodiments discussed herein. Although only a single quantum dot formation region 104 is shown in FIG. 20, this is simply for ease of illustration, and more than one quantum dot formation region 104 may be included in the gate-stack device 100 (e.g., as discussed below with reference to FIG. 39). The quantum dot formation regions 104 may include a quantum well stack 146, which may take the form of any of the quantum well stacks 146 disclosed herein. In the embodiment illustrated in FIG. 2, the quantum well stack 146 includes a single quantum well layer 152, but in some embodiments (as discussed further herein), the quantum well stack 146 may include more than one quantum well layer 152. As discussed above with reference to FIG. 2, in some embodiments, the quantum well stack 146 and the quantum well layer 152 of the gate-stack device 100 of FIG. 20 may be sized and spaced so that the distance between the quantum well layer 152 and the face 169 is less than 100 nanometers; when the gate-stack device 100 of FIG. 20 is included in the die 302 or 304 in the die assembly 800, the distance between the quantum well layer 152 and the die 304 or 302, respectively, may be less than 200 nanometers.

The dimensions of the quantum dot formation regions 104 may take any suitable values. The x-length 160B and the y-length 162B, for example, may depend on the number and arrangement of gates included in the quantum dot formation region 104. In some embodiments, the z-length 164B of the quantum well stack 146 included in a quantum dot formation region 104 may be between 200 and 400 nanometers (e.g., between 250 and 350 nanometers, or equal to 300 nanometers). Insulating material and conductive pathways may be present in the peripheral region 113 around a quantum dot formation region 104, as discussed in detail below. Multiple gates may be disposed in each of the quantum dot formation regions 104 of the gate-stack device 100 of FIG. 20. In particular, in some embodiments, a first set of gates 105 may be disposed at the "top" of each quantum dot formation region 104. In the embodiment illustrated in FIG. 20, the set of gates 105 includes four gates 108. This particular number of gates is simply illustrative, and any suitable number and arrangement of gates may be used. For example, a set of gates 105 may include three or more gates 108, arranged in any desired arrangement (e.g., as vertices of triangles or other polygons, in a rectangular or other array, in an irregular arrangement on the quantum well stack 146, etc.).

As shown in FIG. 20, the gate 108-1 may be disposed in an opening 109 in an insulating material 177, and the gate 108-2 may be disposed in a different opening 109 in the insulating material 177.

A set of gates 105 in the gate-stack device 100 of FIG. 20 may include multiple gates 108 that include at least one pair of gates 108 spaced apart from each other in a first dimension (e.g., spaced apart from each other in the x-dimension), and at least one pair of gates 108 spaced apart from each other in a second dimension perpendicular to the first dimension (e.g., spaced apart from each other in the y-dimension). A two-dimensional regular array of spaced-apart gates 108 is one example of such an arrangement (e.g., as illustrated in FIG. 20), but many others exist (e.g., an irregular array or other distribution). These pairs may share a gate 108; for example, three gates 108 may satisfy this description if arranged accordingly. In the embodiment illustrated in FIG. 20, the gates 108 in a set 105 are spaced apart by intervening portions of the insulating material 177; in other embodiments, other materials or structures may be disposed between pairs of gates 108 in a set 105. The insulating material 177 may have any suitable material composition. For example, in some embodiments, the insulating material 177 may include silicon oxide, silicon nitride, aluminum oxide, carbon-doped oxide, and/or silicon oxynitride.

In the embodiment illustrated in FIG. 20, from a top view, the insulating material 177 around each set of gates 105 may be shaped substantially as a "grid" or "cross-grating," having openings 109 in which the gate metal 112 of the gates 108 are at least partially disposed. Such a grid may have one or more cross-shaped portions (between a set of four adjacent openings 109) and a perimeter portion (extending around the collection of openings 109). As noted elsewhere herein, the insulating material 177 may be patterned in any suitable way to define the location and shape of the gates 108. A number of examples of techniques for patterning the insulating material 177, and thereby establishing the footprints of the gates 108, are discussed below.

Each of the gates 108 of the gate-stack device 100 of FIG. 20 may include a gate dielectric 114. Separate portions of the gate dielectric 114 may be provided for each of the gates 108, and in some embodiments, the gate dielectric 114 may extend at least partially up the side walls of the openings 109 in the proximate insulating material 177. In such embodiments, the gate metal 112 may extend between the portions of the associated gate dielectric 114 on the side walls of the openings 109, and thus may have a U-shape in cross section.

Each of the gates 108 of the gate-stack device 100 of FIG. 20 may include a gate metal 112, and a hardmask 118 may be disposed above the gate metal 112, as discussed above with reference to FIG. 2. In some embodiments, the gate metal 112 may be a superconductor, such as aluminum, titanium nitride (e.g., deposited via atomic layer deposition), or niobium titanium nitride. In some embodiments, the hardmask 118 may not be present in the gate-stack device 100 of FIG. 20 (e.g., a hardmask like the hardmask 118 may be removed during processing, as discussed below).

The dimensions of the insulating material 177 and the gates 108 may take any suitable values. For example, in some embodiments, the z-height 166B of the insulating material 177 and the gate metal 112 may be between 40 and 75 nanometers (e.g., approximately 50 nanometers). In some embodiments, the x-distance 168B between adjacent portions of the gate metal 112 in the cross section of FIG. 20C (and therefore the x-length of the portion of the insulating material 177 disposed between adjacent gates 108) may be less than 100 nanometers (e.g., between 20 and 100 nanometers, between 20 and 40 nanometers, approximately 30 nanometers, or approximately 50 nanometers). In some embodiments, the x-length 170B of the openings 109 in the insulating material 177 (and therefore the x-length of the gates 108) may be between 40 and 60 nanometers (e.g., 50 nanometers); the y-length 171B of the openings 109 may take any of the values described herein for the x-length 170B, for example.

During operation of the gate-stack device 100 of FIG. 20, voltages may be applied to the gates 108 to adjust the potential energy in the quantum well layer 152 in the quantum dot formation region 104 to create quantum wells of varying depths in which quantum dots 142 may form. Only one quantum dot 142 is labeled with a reference numeral in FIG. 20B for ease of illustration, but two are indicated as dotted circles in the quantum well layer 152 of the quantum well stack 146.

The portions of insulating material 177 disposed between adjacent gates 108 may themselves provide "passive" barriers between quantum wells under the gates 108 in the associated quantum well layer 152, and the voltages applied to different ones of the gates 108 may adjust the potential energy under the gates 108 in the quantum well layer 152; decreasing the potential energy may form quantum wells, while increasing the potential energy may form quantum barriers.

The gate-stack devices 100 discussed with reference to FIG. 20 may be used to form electron-type or hole-type quantum dots 142, as discussed above. Voltages may be applied to each of the gates 108 separately to adjust the potential energy in the quantum well layer under the gates 108, and thereby control the formation of quantum dots 142 under each of the gates 108.

Conductive vias and lines may make contact with the gates 108, and with the quantum well stack 146, to enable electrical connection to the gates 108 and the quantum well stack 146 to be made in desired locations. For example, FIG. 20 illustrates a number of conductive vias, conductive lines, and conductive bridges 147, which may take any of the forms discussed above with reference to FIG. 2. As discussed above with reference to other embodiments of the gate-stack device 100, in some embodiments of the gate-stack device 100 illustrated in FIG. 20, no conductive pathways may extend through the insulating material to contact the quantum well layers 152 or the doped layer(s) 137 of the gate-stack device 100. In such an embodiment, the conductive vias 136 and the conductive bridges 147 may be omitted.

As discussed above with reference to FIG. 2, in embodiments in which the gate-stack device 100 of FIG. 20 is an active qubit device 836 in the active qubit die 802, the quantum dots 142 in the quantum well layer 152 may be used as "active" quantum dots in the sense that these quantum dots 142 act as qubits and are controlled (e.g., by voltages applied to the gates 108) to perform quantum computations. In embodiments in which the gate-stack device 100 of FIG. 20 is a detector device 838 in the quantum state detector die 804, the quantum dots 142 in the quantum well layer 152 may be used as "read" quantum dots in the sense that these quantum dots 142 may sense the quantum state of the "active" quantum dots formed by the active qubit devices 836 in the active qubit die 802 by detecting the electric field generated by the charge in the active quantum dots, and may convert the quantum state of the active quantum dots into electrical signals that may be detected by the gates 108.

The gate-stack device 100 of FIG. 20 may be manufactured using any suitable techniques. For example, the manufacture of the gate-stack device 100 of FIG. 20 may begin as described above in FIGS. 3-6. FIGS. 21-36 illustrate various further example stages in the manufacture of the gate-stack device 100 of FIG. 20, in accordance with various embodiments. For ease of illustration, not all elements in each of FIGS. 21-36 are expressly labeled with reference numerals, but reference numerals for each element are included among the drawings herein.

Figure 21:
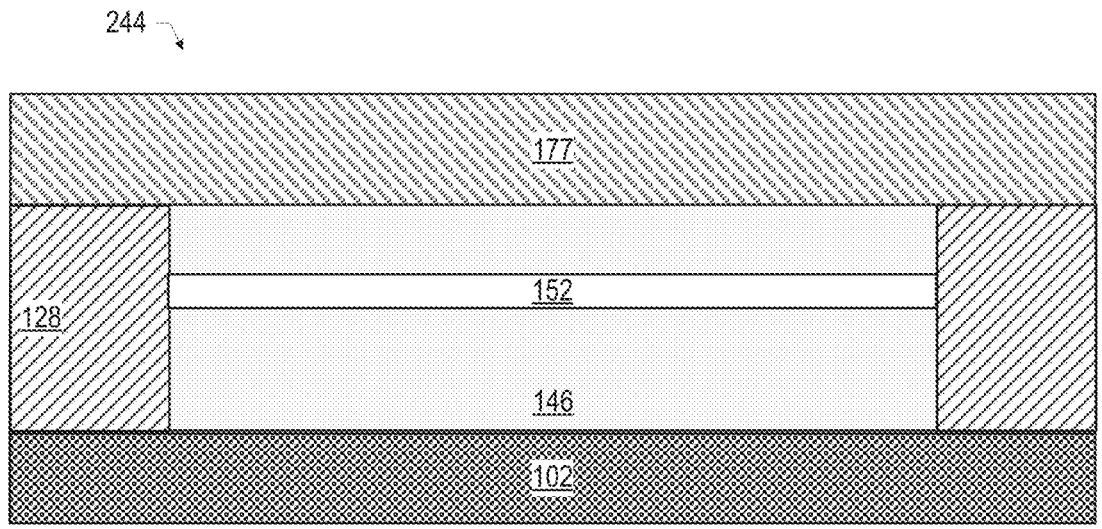
FIGS. 21, 22, 23A, 23B, 24A, 24B, 25A, 25B, 26A, 26B, 27A, 27B, 28A, 28B, 29A, 29B, 30A, 30B, and 31-36 illustrate various example stages in the manufacture of the gate-stack device of FIGS. 20A, 20B, and 20C, in accordance with various embodiments.

FIG. 21 is a cross-sectional view of an assembly 244 subsequent to providing an insulating material 177 on the quantum well stack 146 of the assembly 208 (FIG. 6). The insulating material 177 may take any of the forms disclosed herein, and may be deposited using any suitable technique.

Figure 22:
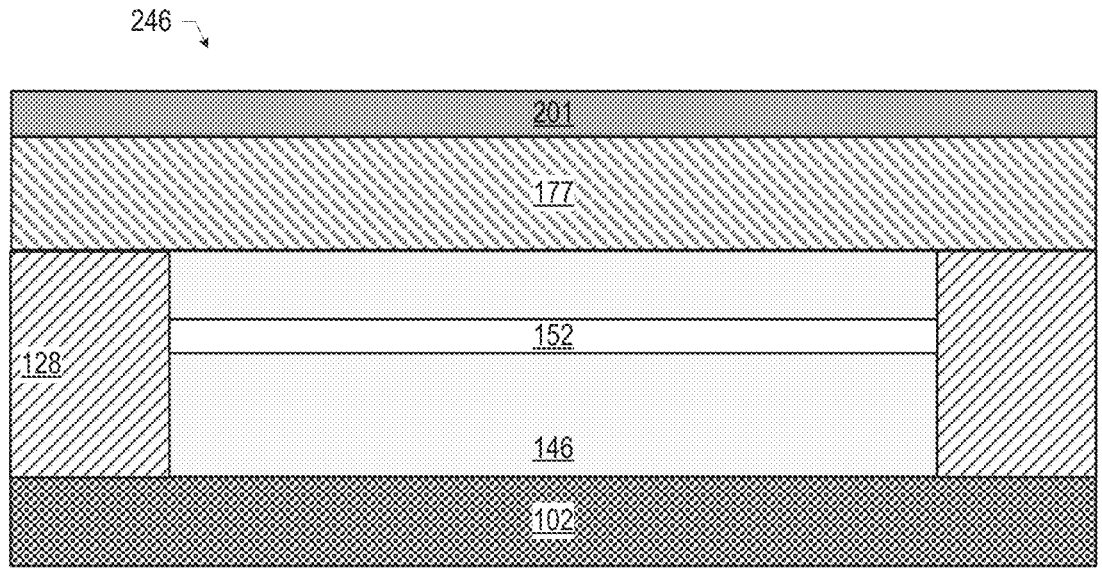
Figure 23A:
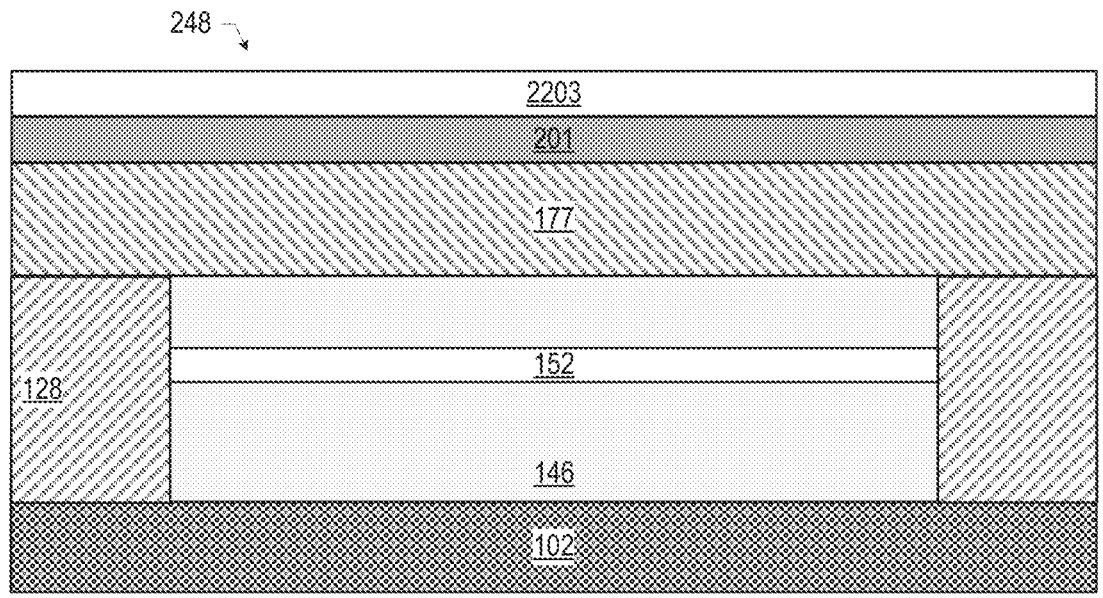
Figure 23B:
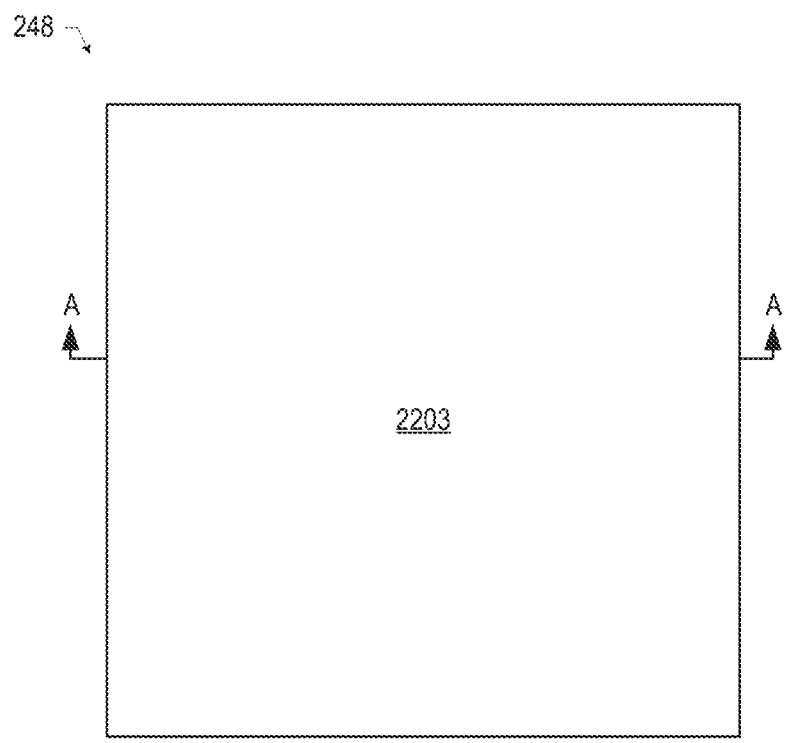

FIG. 22 is a cross-sectional view of an assembly 246 subsequent to providing a hardmask 201 on the insulating material 177 of the assembly 244 (FIG. 21). The hardmask 201 may be formed of an electrically insulating material, such as silicon nitride or carbon-doped nitride. The etch selectivity of the hardmask 201, as well as the other masks (e.g., hardmasks) disclosed herein, may be chosen to achieve the patterning results described, and may take any suitable form. FIG. 23A is a cross-sectional view of an assembly 248 subsequent to providing a hardmask 2203 on the hardmask 201 of the assembly 246 (FIG. 22). FIG. 23B is a top view of the assembly 248; the cross-sectional view of FIG. 23A is taken along the section A-A of FIG. 23B. The hardmask 2203 may take the form of any of the hardmasks disclosed herein, for example. The operations discussed herein with reference to FIGS. 23-29 may represent a "photobucket" technique. In some embodiments, the patterning operations discussed with reference to FIGS. 23-29 may utilize spacer-based pitch-quartering or pitch-halving to enable greater control and smaller pitch than achievable using conventional lithography.

Figure 24A:
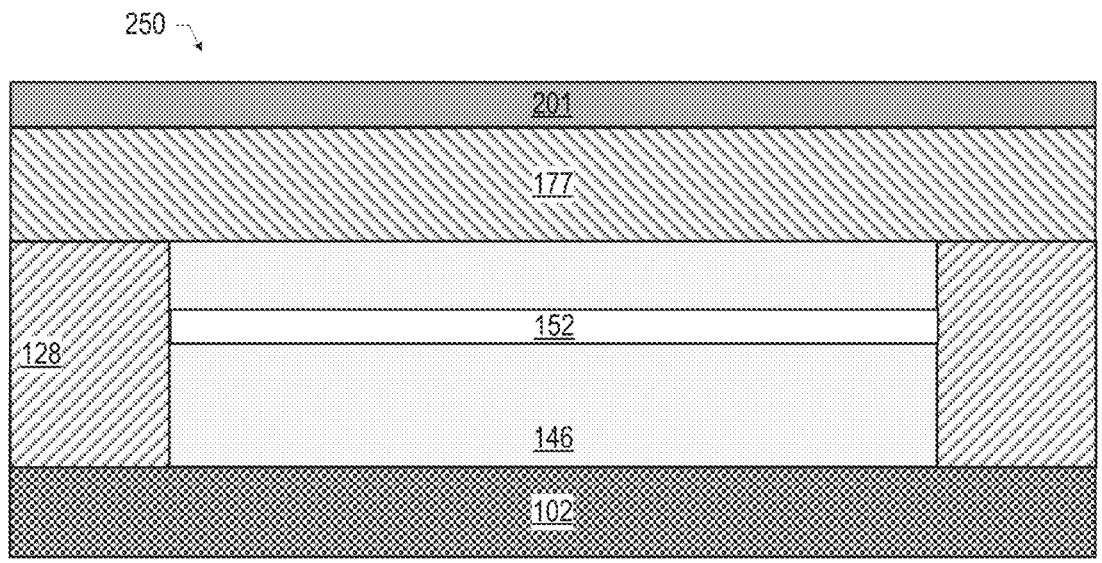
Figure 24B:
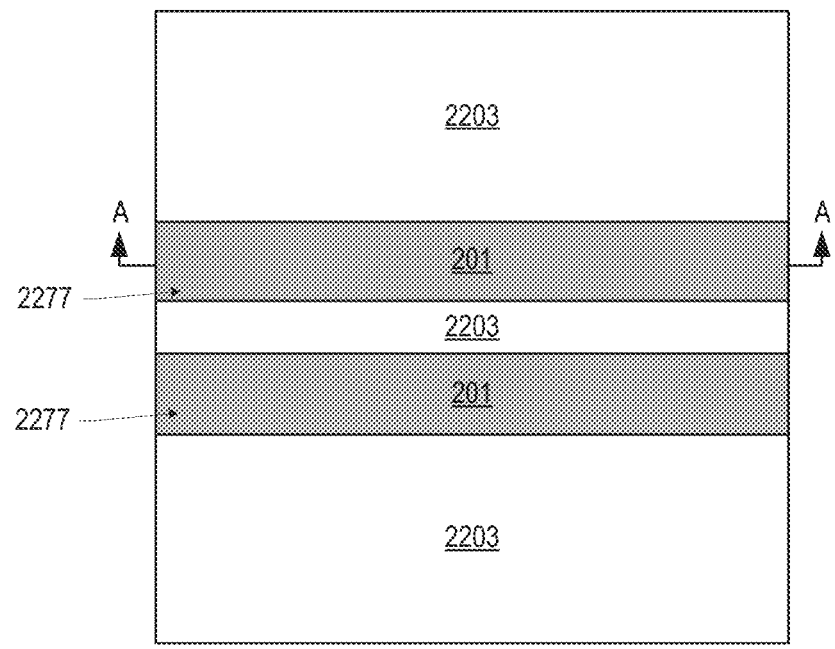

FIG. 24A is a cross-sectional view of an assembly 250 subsequent to patterning the hardmask 2203 to form trenches 2277 in the hardmask 2203 of the assembly 248 (FIG. 23) using a pitch-quartering or pitch-halving technique. FIG. 24B is a top view of the assembly 250; the cross-sectional view of FIG. 24A is taken along the section A-A of FIG. 24B. In particular, the view of FIG. 24A is taken along a trench 2277. The trenches 2277 may be parallel, and may have any suitable dimensions in accordance with the spacer-based patterning technique applied. Only two trenches 2277 are illustrated in FIG. 24B for economy of illustration, but any suitable number of trenches 2277 may be formed.

Figure 25A:
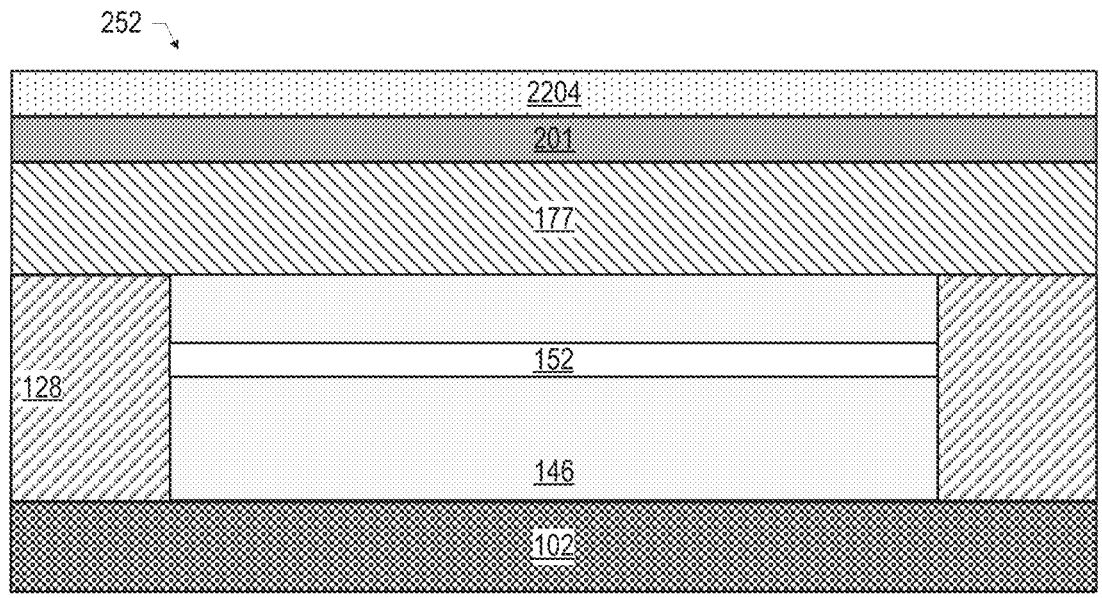
Figure 25B:
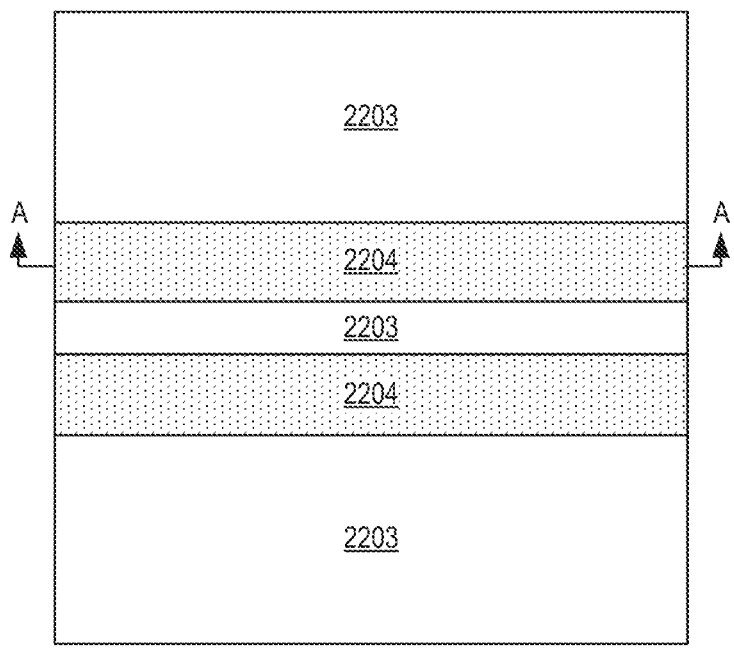

FIG. 25A is a cross-sectional view of an assembly 252 subsequent to filling the trenches 2277 of the assembly 250 (FIG. 24) with a resist material 2204. FIG. 25B is a top view of the assembly 252; the cross-sectional view of FIG. 25A is taken along the section A-A of FIG. 25B. The resist material 2204 may be, for example, a photoresist. The resist material 2204 may be provided in the trenches 2277 using any suitable technique.

Figure 26A:
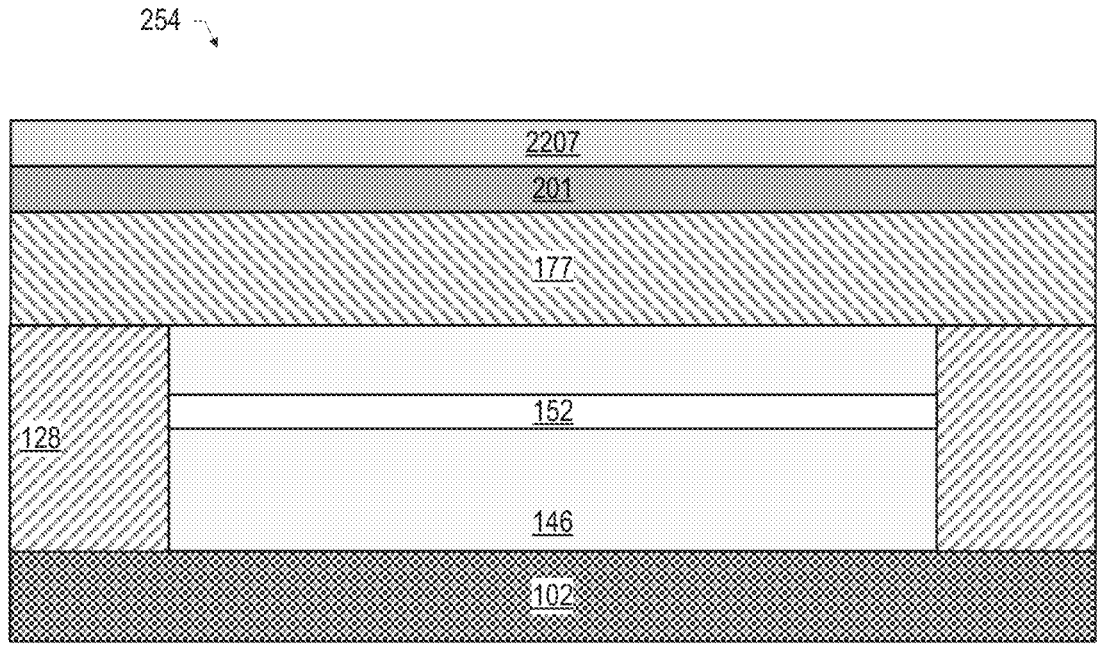
Figure 26B:
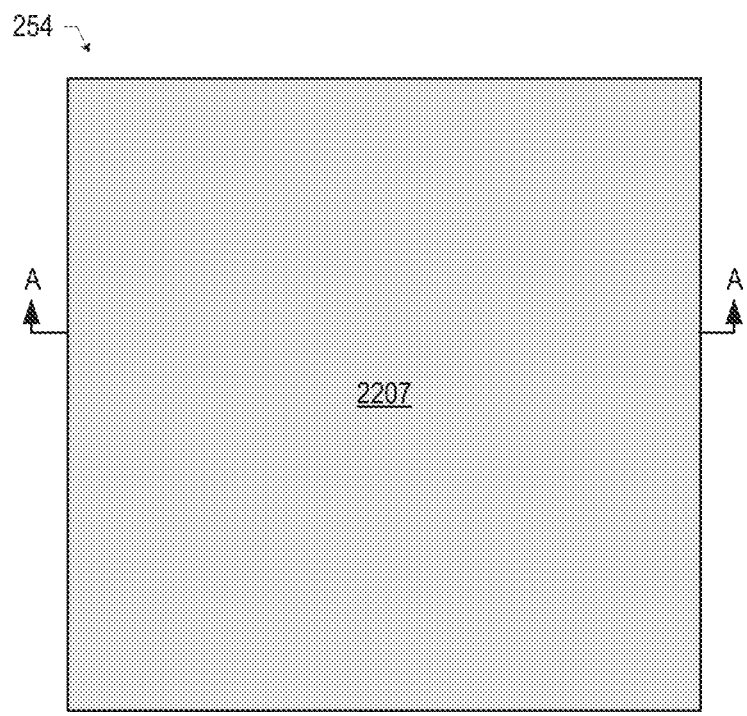

FIG. 26A is a cross-sectional view of an assembly 254 subsequent to providing another hardmask 2207 on the assembly 252 (FIG. 25). FIG. 26B is a top view of the assembly 254; the cross-sectional view of FIG. 26A is taken along the section A-A of FIG. 26B. The hardmask 2207 may take the form of any of the hardmasks disclosed herein, for example.

Figure 27A:
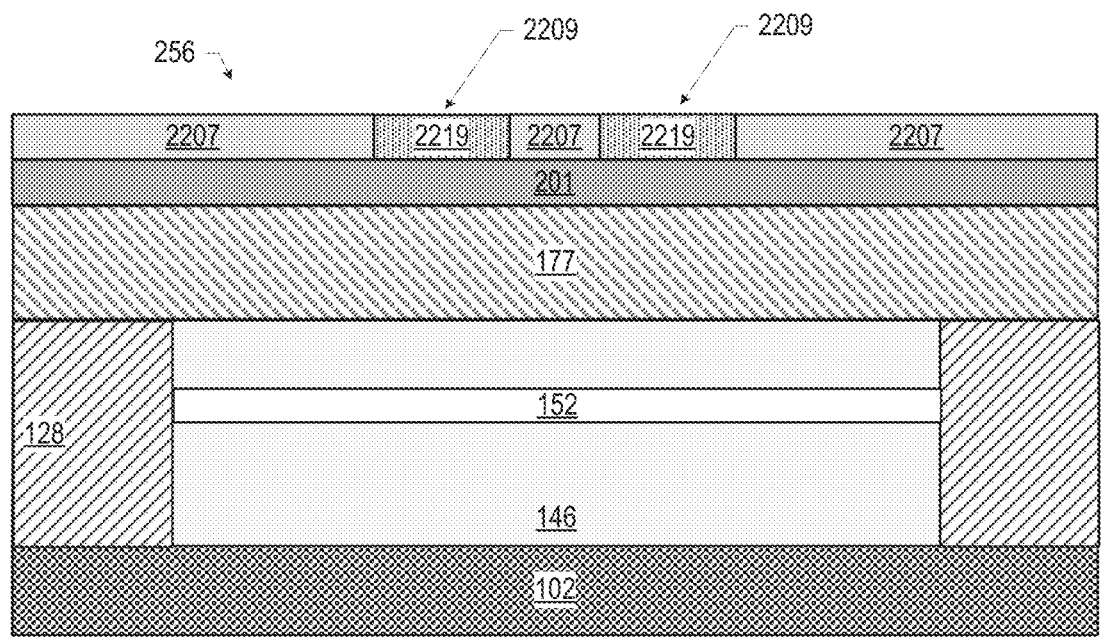
Figure 27B:
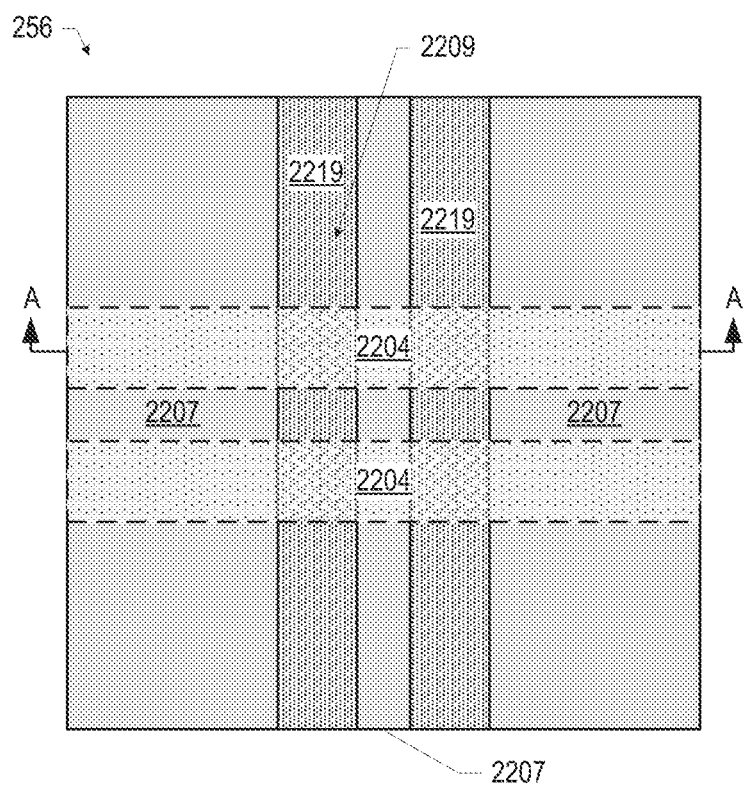

FIG. 27A is a cross-sectional view of an assembly 256 subsequent to patterning the hardmask 2207 to form trenches 2209 in the hardmask 2207 of the assembly 254 (FIG. 26), and filling the trenches 2209 with resist material 2219. FIG. 27B is a top view of the assembly 256; the cross-sectional view of FIG. 27A is taken along the section A-A of FIG. 27B. The hardmask 2207 may be patterned in accordance with any of the embodiments discussed above with reference to the patterning of the hardmask 2203 (e.g., using a pitch-quartering or pitch-halving technique), and the resist material 2219 may be provided in accordance with any of the embodiments discussed above with reference to the provision of the resist material 2204. The trenches 2209 in the hardmask 2207 may be oriented differently than the trenches 2277 in the assembly 252 (FIG. 25); for example, as illustrated in FIG. 27, the trenches 2209 may be perpendicular to, and overlap with, the trenches 2277. The resist material 2204 in the trenches 2277 are shown with dashed lines in FIG. 27B to illustrate the areas of overlap with the resist material 2219 in the trenches 2209. Only two trenches 2209 are illustrated in FIG. 27 for economy of illustration, but any suitable number of trenches 2209 may be formed.

Figure 28A:
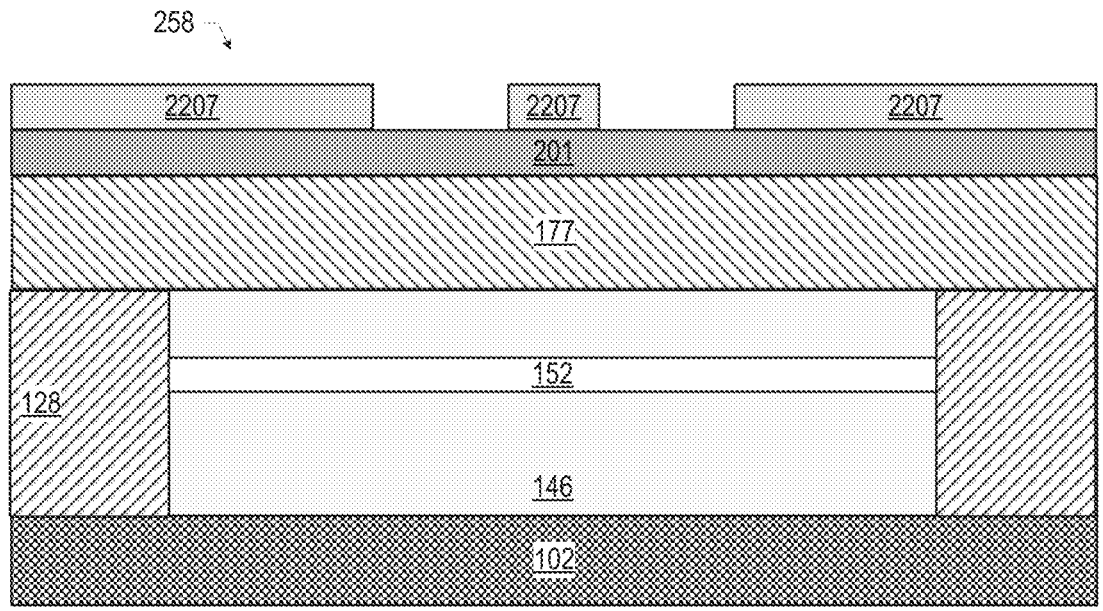
Figure 28B:
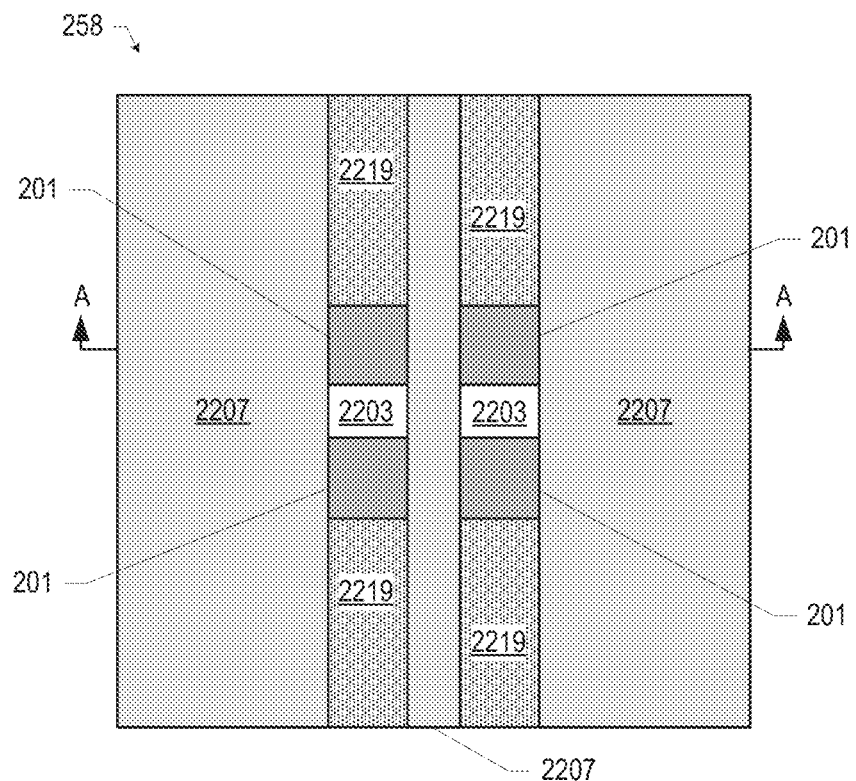

FIG. 28A is a cross-sectional view of an assembly 258 subsequent to exposing at least some of the areas of overlap between the resist material 2219 and the resist material 2204 of the assembly 256 (FIG. 27), and then developing the exposed resist material 2219 and resist material 2204 to "uncover" areas of the hardmask 201 that are not covered by the undeveloped resist material 2204, the undeveloped resist material 2219, or either of the hardmasks 2203 and 2207. FIG. 28B is a top view of the assembly 258; the cross-sectional view of FIG. 28A is taken along the section A-A of FIG. 28B. In the embodiment illustrated in FIG. 28, all four areas of overlap between the resist material 2204 and the resist material 2219 are shown as developed, uncovering four rectangular areas of the hardmask 201. In other embodiments, fewer than all of the areas of overlap between the resist material 2204 and the resist material 2219 may be developed, in any desired pattern.

Figure 29A:
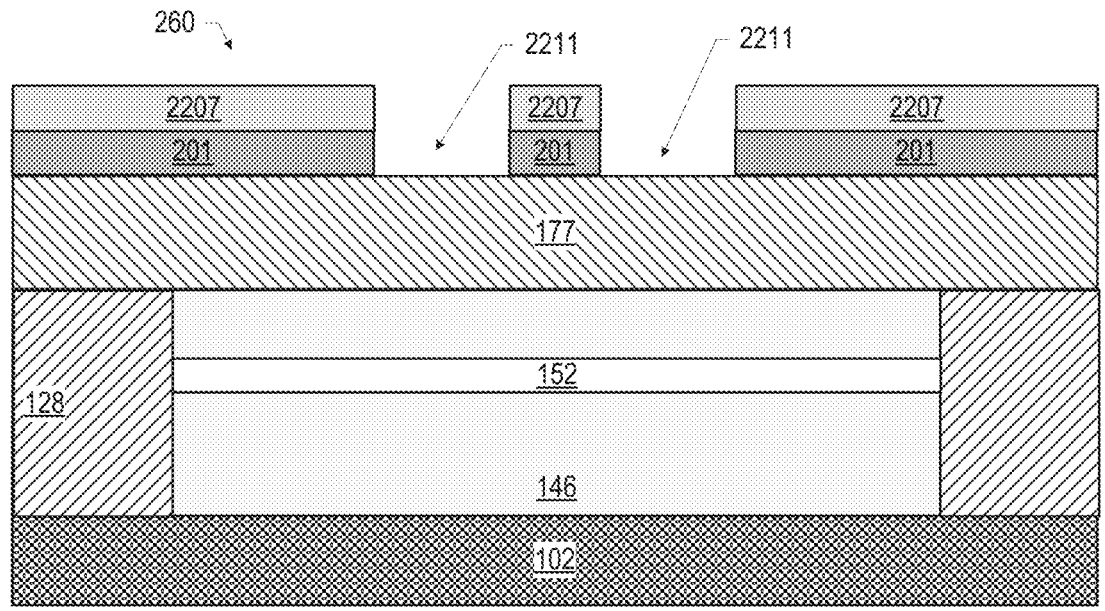
Figure 29B:
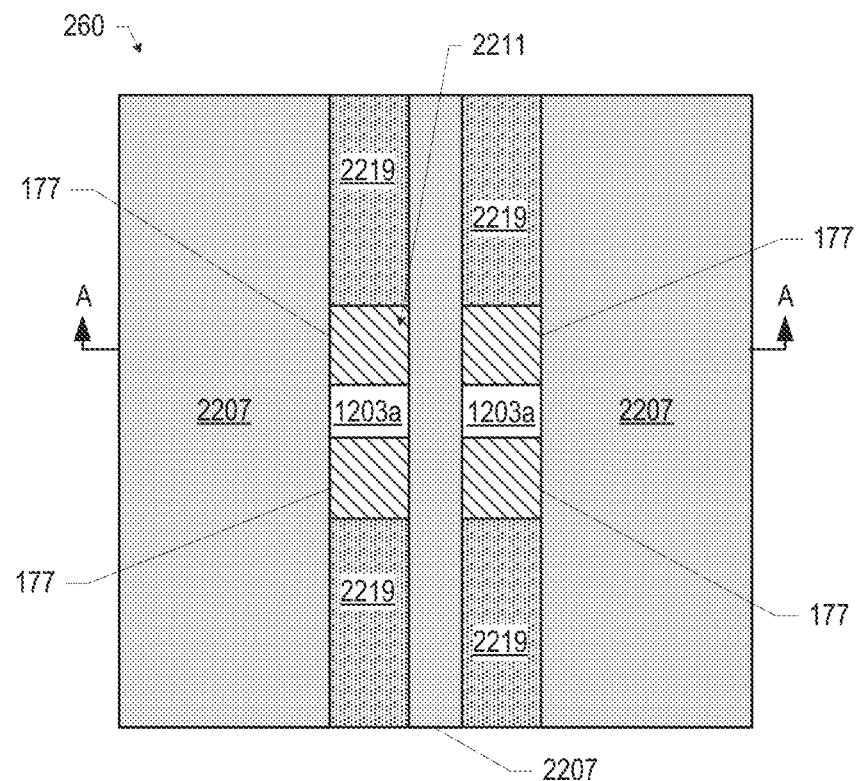

FIG. 29A is a cross-sectional view of an assembly 260 subsequent to patterning the hardmask 201 of the assembly 258 (FIG. 28) to etch away portions of the hardmask 201 that are not covered by the undeveloped resist material 2204, the undeveloped resist material 2219, or either of the hardmasks 2203 and 2207. FIG. 29B is a top view of the assembly 260; the cross-sectional view of FIG. 29A is taken along the section A-A of FIG. 29B. The resulting patterned hardmask 201 may include openings 2211 that have rectangular footprints (corresponding to the areas where the trenches 2209 and the trenches 2277 "overlapped"). The patterned hardmask 201 may be used to analogously pattern the insulating material 177 with openings 109.

Figure 30A:
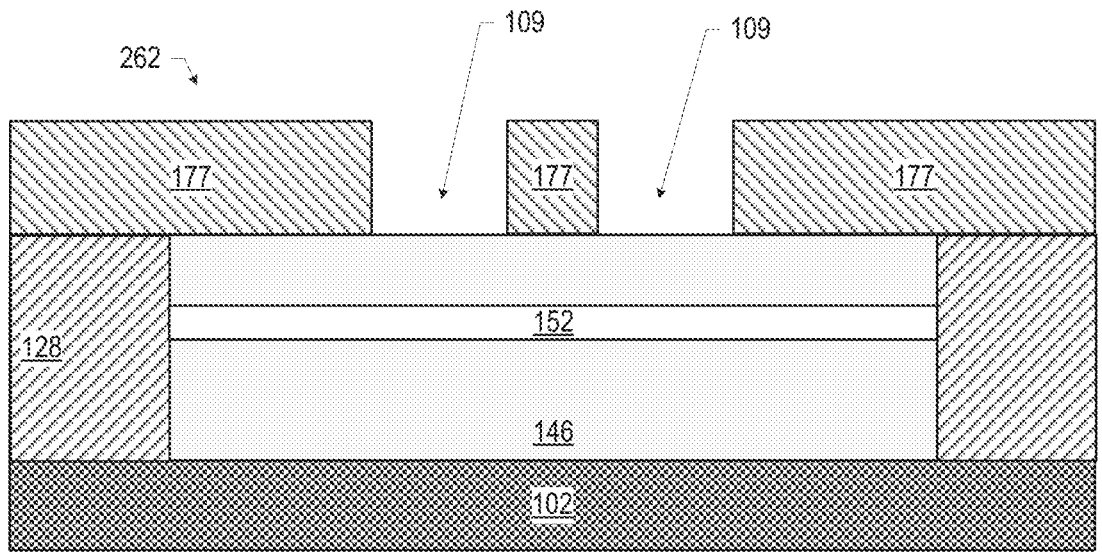
Figure 30B:
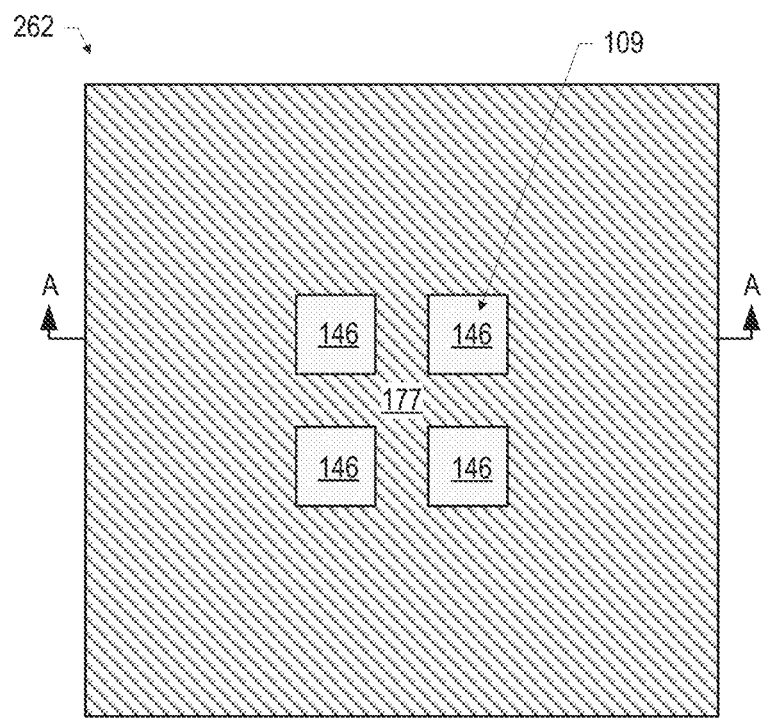

FIG. 30A is a cross-sectional view of an assembly 262 subsequent to patterning the insulating material 177 with openings 109 using the patterned hardmask 201 of the assembly 260 (FIG. 29), then removing the hardmasks 201 and 2207 and the resist material 2219. FIG. 30B is a top view of the assembly 262; the cross-sectional view of FIG. 30A is taken along the section A-A of FIG. 30B. In the assembly 262, the insulating material 177 may have a grid or cross-grating shape around the rectangular openings 109, and the quantum well stack 146 may be exposed through these openings. As noted above, although only four openings 109 arranged in a 2×2 array are illustrated in FIG. 30, any array of openings 109 of any desired number and size may be formed using the techniques disclosed herein.

Figure 31:
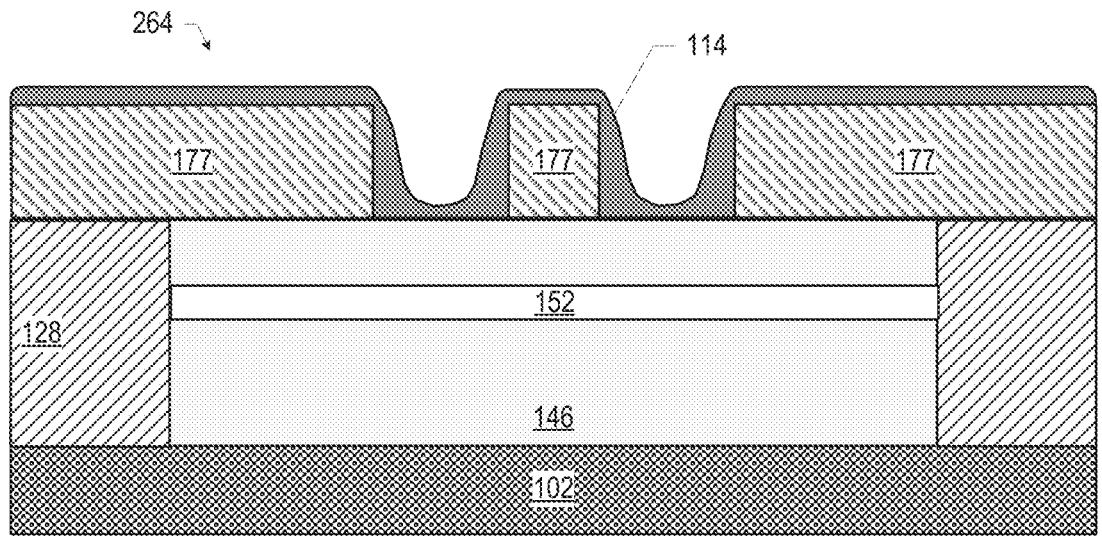

FIG. 31 is a cross-sectional view of an assembly 264 subsequent to providing a gate dielectric 114 on the quantum well stack 146 in the openings 109 between portions of the insulating material 177 of the assembly 262 (FIG. 30). In some embodiments, the gate dielectric 114 of the assembly 264 may be formed by atomic layer deposition (ALD) and, as illustrated in FIG. 31, may cover the exposed quantum well stack 146 in the openings 109 and may extend onto the adjacent insulating material 177.

Figure 32:
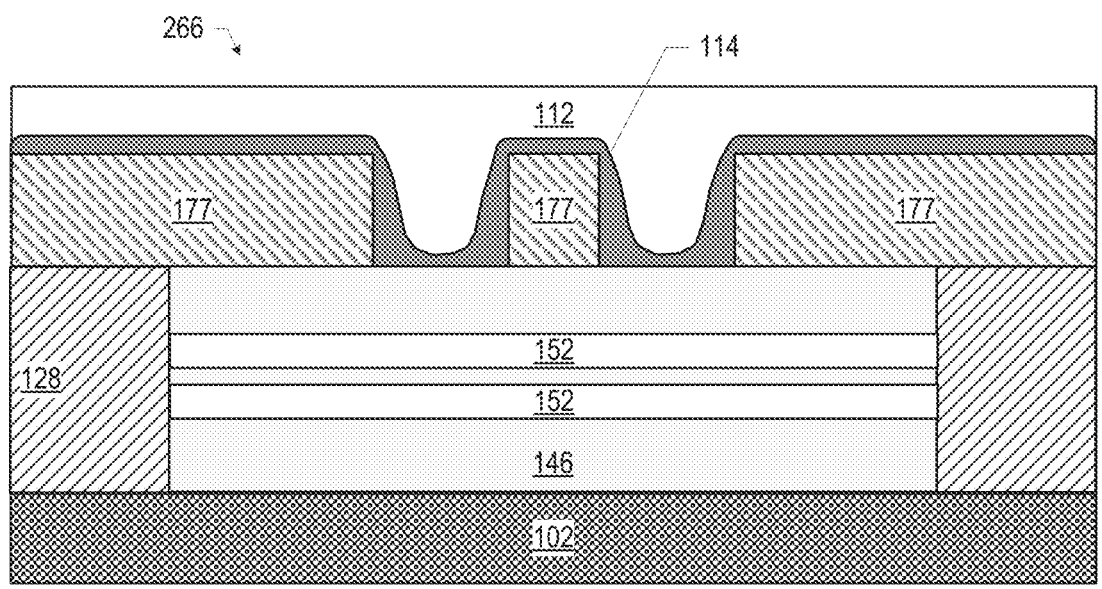

FIG. 32 is a cross-sectional view of an assembly 266 subsequent to providing the gate metal 112 on the assembly 264 (FIG. 31). The gate metal 112 may fill the openings 109 between the gate dielectric 114 disposed on adjacent side walls of the insulating material 177, and may extend over the insulating material 177. The gate metal 112 may be provided using any suitable technique.

Figure 33:
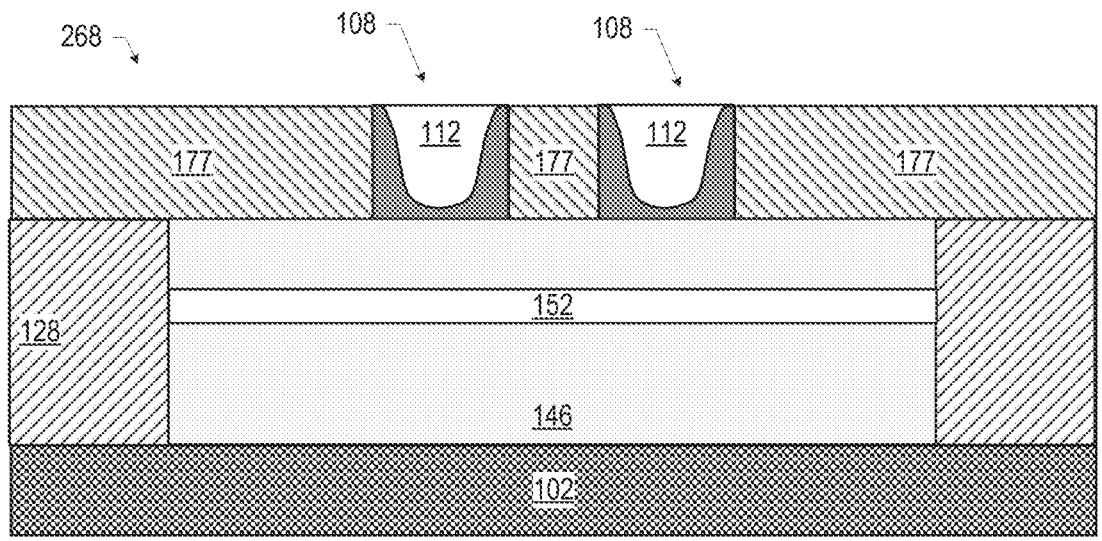

FIG. 33 is a cross-sectional view of an assembly 268 subsequent to planarizing the assembly 266 (FIG. 32) to remove the gate metal 112 and the gate dielectric 114 above the insulating material 177. In some embodiments, the assembly 266 may be planarized to form the assembly 268 using a CMP technique. The remaining gate metal 112 may fill the openings 109 in the insulating material 177.

Figure 34:
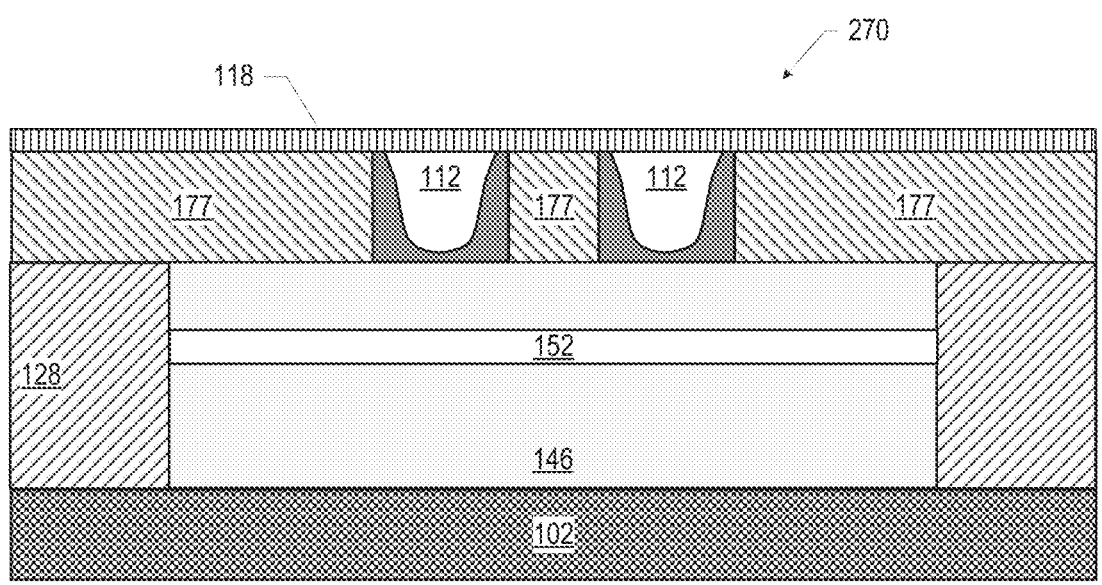

FIG. 34 is a cross-sectional view of an assembly 270 subsequent to providing a hardmask 118 on the planarized surface of the assembly 268 (FIG. 33). The hardmask 118 may be formed of an electrically insulating material, such as silicon nitride or carbon-doped nitride, or any of the other materials discussed above.

Figure 35:
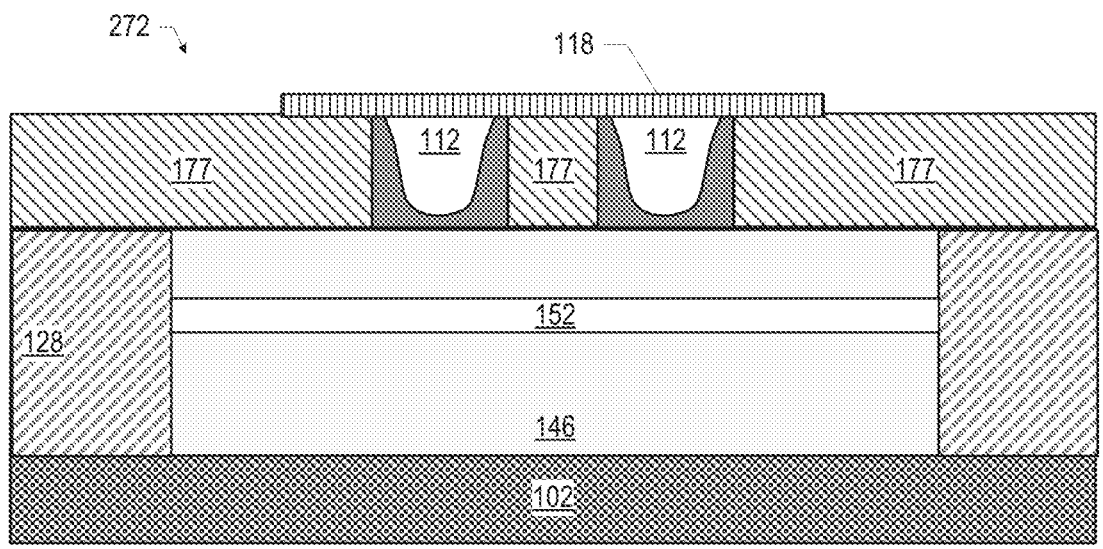

FIG. 35 is a cross-sectional view of an assembly 272 subsequent to patterning the hardmask 118 of the assembly 270 (FIG. 34). The pattern applied to the hardmask 118 may extend over the gate metal 112 and onto adjacent portions of the insulating material 177. The hardmask 118 may be patterned by applying a resist, patterning the resist using lithography, and then etching the hardmask (using dry etching or any appropriate technique).

Figure 36:
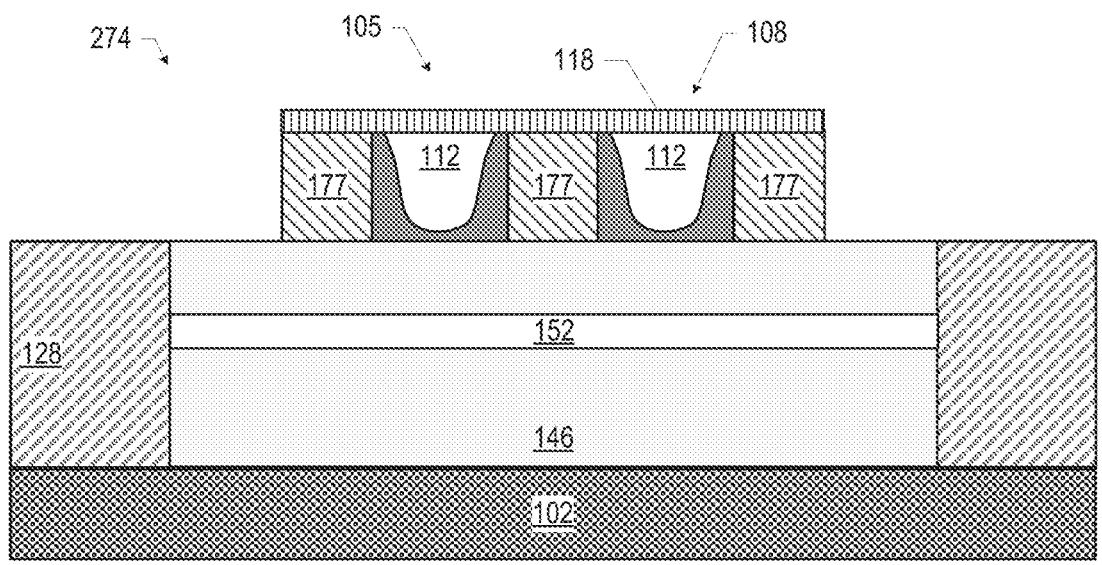

FIG. 36 is a cross-sectional view of an assembly 274 subsequent to etching the assembly 272 (FIG. 35) to remove the portions of insulating material 177 that are not protected by the patterned hardmask 118. The patterned hardmask 118 may remain on top of the insulating material 177 and gates 108, as shown.

The assembly 274 may be further processed with analogous operations to those discussed above with reference to FIGS. 17-19 to form the gate-stack device 100 of FIG. 20.

Figure 37:
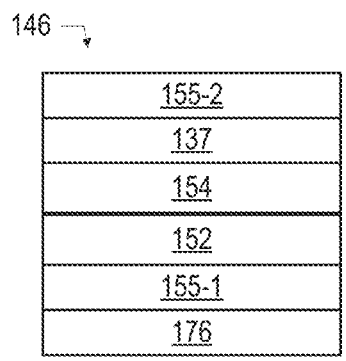
FIGS. 37-39 are cross-sectional views of various examples of quantum well stacks that may be used in a gate-stack device, in accordance with various embodiments.
Figure 38:
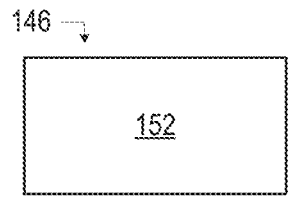
Figure 39:
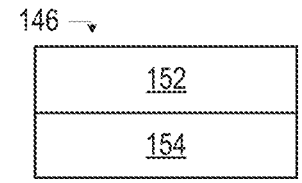

As noted above, a quantum well stack 146 included in a gate-stack device 100 may take any of a number of forms, several of which are illustrated in FIGS. 37-39. Although the quantum well stacks 146 illustrated in FIGS. 37-39 each include one quantum well layer 152, in some embodiments, the quantum well stack 146 included in a gate-stack device 100 may include more than one quantum well layer 152; elements may be duplicated in the quantum well stacks 146 discussed with reference to FIGS. 37-39 to achieve such embodiments, as appropriate.

FIG. 37 is a cross-sectional view of a quantum well stack 146 including a buffer layer 176, a barrier layer 155-1, a quantum well layer 152, a barrier layer 154, a doped layer 137, and a barrier layer 155-2. The quantum well stack 146 may be a modulation doped stack, due to the inclusion of a doped layer 137, spaced apart from a quantum well layer 152. The quantum well stack 146 may be grown on the base 102 (e.g., as discussed above with reference to FIG. 4) such that the buffer layer 176 is disposed between the barrier layer 155-1 and the base 102.

The buffer layer 176 may be formed of the same material as the barrier layer 155-1, and may be present to trap defects that form in this material as it is grown on the base 102. In some embodiments, the buffer layer 176 may be grown under different conditions (e.g., deposition temperature or growth rate) from the barrier layer 155-1. In particular, the barrier layer 155-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 155-1; for example, the silicon germanium of the buffer layer 176 may have a germanium content that varies from zero percent at a silicon base 102 to a nonzero percent (e.g., 30%) at the barrier layer 155-1. The buffer layer 176 may be grown beyond its critical layer thickness such that it is substantially free of stress from the underlying base 102 (and thus may be referred to as "relaxed"). In some embodiments, the thickness of the buffer layer 176 (e.g., silicon germanium) may be between 0.3 and 4 microns (e.g., 0.3-2 microns, or 0.5 microns).

The barrier layer 155-1 may provide a potential energy barrier proximate to the quantum well layer 152. The barrier layer 155-1 may be formed of any suitable materials. For example, in some embodiments in which the quantum well layer 152 is formed of silicon or germanium, the barrier layer 155-1 may be formed of silicon germanium. In some embodiments, the thickness of the barrier layer 155-1 may be between 0 and 400 nanometers (e.g., between 25 and 75 nanometers). When the base 102 is separated from the rest of the assembly 234 during manufacturing of the gate-stack device 100 (e.g., as discussed above with reference to FIG. 19), the quantum well stack 146 may be polished back to a point in the barrier layer 155-1 (i.e., removing the buffer layer 176).

The quantum well layer 152 may be formed of a different material from the barrier layer 155-1. Generally, a quantum well layer 152 may be formed of a material such that, during operation of the gate-stack device 100, a 2DEG may form in the quantum well layer 152. Embodiments in which the quantum well layer 152 is formed of intrinsic silicon may be particularly advantageous for electron-type gate-stack devices 100. Embodiments in which a quantum well layer 152 is formed of intrinsic germanium may be particularly advantageous for hole-type gate-stack devices 100. In some embodiments, a quantum well layer 152 may be strained, while in other embodiments, a quantum well layer 152 may not be strained. The thickness of a quantum well layer 152 may take any suitable values; in some embodiments, a quantum well layer 152 may have a thickness between 5 and 30 nanometers.

In the gate-stack device 100, the doped layer 137 may be disposed between the quantum well layer 152 and the set of gates 105. The doped layer 137 of FIG. 37 may be doped with an n-type material (e.g., for an electron-type gate-stack device 100) or a p-type material (e.g., for a hole-type gate-stack device 100). In some embodiments, the doping concentration of the doped layer 137 may be between $10^{17}/cm^3$ and $10^{20}/cm^3$ (e.g., between $10^{17}/cm^3$ and $10^{18}/cm^3$). The thickness (i.e., z-height) of the doped layer 137 may depend on the doping concentration, among other factors, and in some embodiments may be between 5 and 50 nanometers (e.g., between 20 and 30 nanometers).

A doped layer 137 may be formed using any of a number of techniques. In some embodiments, a doped layer 137 may be formed of an undoped base material (e.g., silicon germanium) that is doped in situ during growth of the base material by epitaxy. In some embodiments, a doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, a doped layer 137 may initially be fully formed of an undoped base material (e.g., silicon germanium), and the dopant may be implanted into the lattice (and, in some embodiments, may be subsequently annealed). In some embodiments, a doped layer 137 may be provided by a silicon germanium layer (e.g., with 90% germanium content) doped with an n-type dopant. In general, any suitable technique may be used to form a doped layer 137.

The barrier layer 154 may not be doped, and thus may provide a barrier to prevent impurities in the doped layer 137 from diffusing into the quantum well layer 152 and forming recombination sites or other defects that may reduce channel conduction and thereby impede performance of the gate-stack device 100. In some embodiments of the quantum well stack 146 of FIG. 37, the doped layer 137 may include a same material as the barrier layer 154, but the barrier layer 154 may not be doped. For example, in some embodiments, the doped layer 137 and the barrier layer 154 may both be silicon germanium. In some embodiments in which the quantum well layer 152 is formed of silicon, the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thickness of the barrier layer 154 may depend on the doping concentration of the doped layer 137, among other factors discussed below, and in some embodiments may be between 5 and 50 nanometers (e.g., between 20 and 30 nanometers).

The thickness of a barrier layer 154 may impact the ease with which carriers in the doped layer 137 can move into a quantum well layer 152 disposed on the other side of the barrier layer 154. The thicker the barrier layer 154, the more difficult it may be for carriers to move into the quantum well layer 152; at the same time, the thicker the barrier layer 154, the more effective it may be at preventing impurities from the doped layer 137 from moving into the quantum well layer 152. Additionally, the diffusion of impurities may depend on the temperature at which the gate-stack device 100 operates. Thus, the thickness of the barrier layer 154 may be adjusted to achieve a desired energy barrier and impurity screening effect between the doped layer 137 and the quantum well layer 152 during expected operating conditions.

The barrier layer 155-2 may provide a barrier between the doped layer 137 and the set of gates 105 (not shown), and may take any of the forms described herein for the barrier layer 155-1.

Elements of the quantum well stack 146 of FIG. 37 may be omitted as suitable. In some particular embodiments, the quantum well stack 146 may include a silicon base 102, a buffer layer 176 of silicon germanium (e.g., with 30% germanium content), then a doped layer 137 formed of silicon germanium doped with an n-type dopant, a silicon quantum well layer 152, a thin barrier layer 154 formed of silicon germanium (e.g., silicon germanium with 70% germanium content), then a doped layer 137 formed of silicon germanium doped with an n-type dopant, and a barrier layer 155 formed of silicon germanium (e.g., with 30% germanium content); in such an embodiment, the set of gates 105 may be disposed on the barrier layer 155.

FIG. 38 is a cross-sectional view of a quantum well stack 146 including only a quantum well layer 152. The quantum well layer 152 may be disposed on the base 102 (e.g., as discussed above with reference to FIG. 4), and may be formed of a material such that, during operation of the gate-stack device 100, a 2DEG may form in the quantum well layer 152 proximate to the upper surface of the quantum well layer 152. The gate dielectric 114 of the set of gates 105 may be disposed on the upper surface of the quantum well layer 152 (e.g., as discussed above with reference to FIG. 7). In some embodiments, the quantum well layer 152 of FIG. 38 may be formed of intrinsic silicon, and the gate dielectric 114 may be formed of silicon oxide; in such an arrangement, during use of the gate-stack device 100, a 2DEG may form in the intrinsic silicon at the interface between the intrinsic silicon and the silicon oxide. Embodiments in which the quantum well layer 152 of FIG. 38 is formed of intrinsic silicon may be particularly advantageous for electron-type gate-stack devices 100. In some embodiments, the quantum well layer 152 of FIG. 38 may be formed of intrinsic germanium, and the gate dielectric 114 may be formed of germanium oxide; in such an arrangement, during use of the gate-stack device 100, a 2DEG may form in the intrinsic germanium at the interface between the intrinsic germanium and the germanium oxide. Such embodiments may be particularly advantageous for hole-type gate-stack devices 100.

In some embodiments, the quantum well layer 152 of FIG. 38 may be strained, while in other embodiments, the quantum well layer 152 may not be strained. The thicknesses (i.e., z-heights) of the layers in the quantum well stack 146 of FIG. 38 may take any suitable values. For example, in some embodiments, the thickness of the quantum well layer 152 (e.g., intrinsic silicon or germanium) may be between 0.8 and 1.2 microns. When the base 102 is separated from the rest of the assembly 234 during manufacturing of the gate-stack device 100 (e.g., as discussed above with reference to FIG. 19), the quantum well stack 146 of FIG. 38 may be polished back to a point in the quantum well layer 152.

FIG. 39 is a cross-sectional view of a quantum well stack 146 including a quantum well layer 152 and a barrier layer 154. The quantum well stack 146 may be disposed on a base 102 (e.g., as discussed above with reference to FIG. 4) such that the barrier layer 154 is disposed between the quantum well layer 152 and the base 102. The barrier layer 154 may provide a potential barrier between the quantum well layer 152 and the base 102. As discussed above, the quantum well layer 152 of FIG. 39 may be formed of a material such that, during operation of the gate-stack device 100, a 2DEG may form in the quantum well layer 152 proximate to the upper surface of the quantum well layer 152. For example, in some embodiments in which the base 102 is formed of silicon, the quantum well layer 152 of FIG. 39 may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thicknesses (i.e., z-heights) of the layers in the quantum well stack 146 of FIG. 39 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon or germanium) may be between 5 and 30 nanometers. In some embodiments, the gate-stack device 100 may include a gate interface material (not shown) between the quantum well stack 146 and the gate dielectric 114. The gate interface material may provide an interface between the quantum well stack 146 and the gate dielectric 114 that has a low total interface trap density ($D_{it}$), reducing the likelihood of scattering that may impede the coherence of the quantum dots 142 formed in the gate-stack device 100. The gate interface material may include any suitable material to improve the $D_{it}$ of the gates 106/108 on the quantum well stack 146. In some embodiments, the gate interface material may include silicon. Silicon may be a particularly useful material for the gate interface material when the quantum well stack 146 includes silicon germanium (e.g., as a barrier layer 154), and the gate interface material is disposed on the silicon germanium. In some embodiments in which the gate interface material includes silicon, the silicon may oxidize (e.g., due to air exposure before the gate dielectric 114 is formed) to form a layer of silicon oxide at the interface between the silicon of the gate interface material and the gate dielectric 114. In some embodiments, the gate interface material may include aluminum nitride, aluminum oxynitride, or germanium oxide. In embodiments in which the gate interface material includes germanium oxide, the gate interface material may be formed by forming a layer of germanium, then allowing the layer of germanium to oxidize. In some embodiments, the gate interface material may be a thin layer grown by epitaxy on a quantum well stack 146. For example, in embodiments in which the quantum well stack 146 includes a silicon germanium barrier layer 154 between a quantum well layer and the gate 106/108, the gate interface material (e.g., silicon) may be grown directly on the silicon germanium barrier. In some embodiments, the gate dielectric 114 (e.g., hafnium oxide) may be grown on top of the gate interface material. The interface between the gate interface material and the gate dielectric 114 may have fewer electrical defects than if the gate dielectric 114 were formed directly on the quantum well stack.

Figure 40:
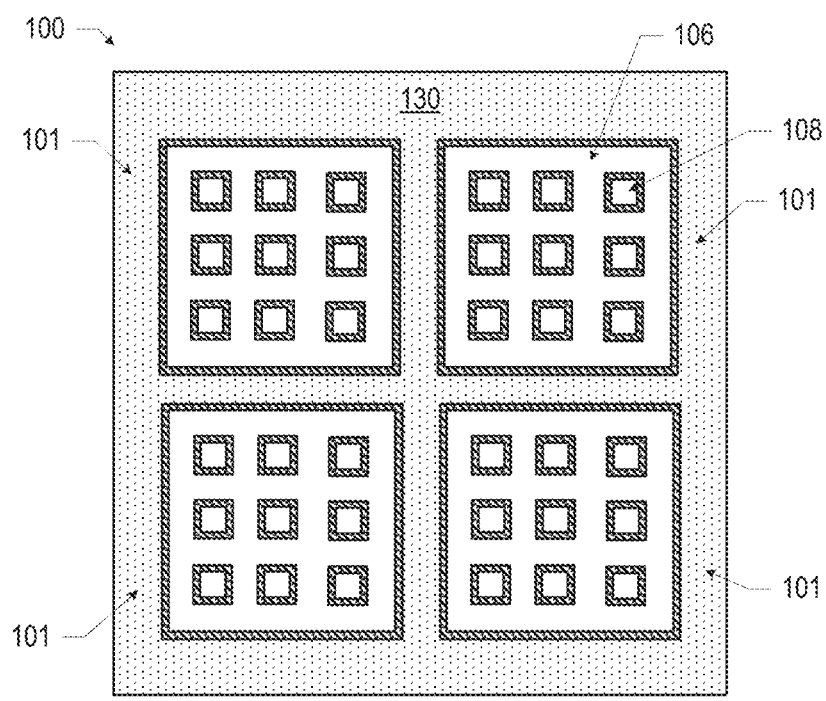
FIG. 40 illustrates an embodiment of a gate-stack device having multiple quantum dot formation regions, in accordance with various embodiments.

Although only a single quantum dot formation region 104 is illustrated in FIG. 2 (and in FIG. 20), a gate-stack device 100 may include any number of quantum dot formation regions 104, arranged in any desired manner. For example, multiple quantum dot formation regions 104 may be arranged in a line, or in a rectangular array, or in any desired distribution. For example, FIG. 40 is a top cross-sectional view (analogous to the view of FIG. 2A) of a gate-stack device 100 including four quantum dot formation regions 104 arranged in a 2×2 array. Each of the quantum dot formation regions 104 may take the form of any of the quantum dot formation regions disclosed herein (e.g., the quantum dot formation region 104 illustrated in FIG. 2A). In particular, a single gate-stack device 100 may include multiple sets of gates 105 spaced apart. Multiple quantum dot formation regions 104 may be formed in parallel using the techniques discussed above, for example. In some embodiments, multiple quantum dot formation regions 104 in a gate-stack device 100 may share common elements. For example, in some embodiments, multiple quantum dot formation regions 104 may share a common doped layer 137 (located in any suitable location in the gate-stack device 100) to act as a reservoir for one or more quantum well layers 152, or may share common doped regions (not shown) to act as carrier reservoirs for one or more quantum well layers 152. As discussed above, the particular number and arrangement of gates 106/108 in the embodiment of FIG. 40 is simply illustrative, and any suitable gate arrangement may be used in a quantum dot formation region 104. In some embodiments, different quantum dot formation regions 104 included in a single gate-stack device 100 may have different structures (e.g., different numbers and arrangements of gates 106/108, or different quantum well stacks 146).

FIG. 41 provides various views of a first embodiment of a SET device 500. In particular, FIG. 41A is a cross-sectional view of the SET device 500 through the section A-A of FIGS. 41C, 41E, and 41F; FIG. 41B is a cross-sectional view of the SET device 500 through the section B-B of FIGS. 41C, 41E, and 41F; FIG. 41C is a cross-sectional view of the SET device 500 through the section C-C of FIGS. 41A, 41B, 41D, and 41F; FIG. 41D is a side view of the SET device 500 toward the section A-A with the insulator 510 removed; FIG. 41E is a side view of the SET device 500 toward the section C-C from the gate electrode 506 with the insulator 510 removed; and FIG. 41F is a top view of the SET device 500 with the insulator 510 removed.

As illustrated in FIG. 41, the SET device 500 may include a source/drain (S/D) structure 581 including two S/D supports 514 disposed on a substrate 502. The S/D structure 581 may also include an S/D electrode 504 disposed on the side faces 562 of the S/D supports 514; in the embodiment of FIG. 41, no electrode may be disposed on the opposite side faces 564 of the S/D supports 514. The two S/D supports 514, and the two S/D electrodes 504, may be spaced apart by intervening dielectric 508 and an island 512. In particular, the SET device 500 may include two tunnel junctions (TJs)

570, each formed by a portion of dielectric 508 "sandwiched" between an S/D electrode 504 and the island 512. The S/D structure 581 may include the S/D supports 514, the dielectric 508, the S/D electrodes 504, and the island 512. As noted above, any of the SET devices 500 disclosed herein may be included in the active qubit devices 836, the detector devices 838, or both, as desired. When a SET device 500 is included in the active qubit devices 836, the face 505 of the SET device 500 may provide (or be oriented towards) the first face 806 of the active qubit die 802 of the die assembly 800. When a SET device 500 is included in the detector devices 838, the face 505 of the SET device 500 may provide (or be oriented towards) the first face 810 of the quantum state detector die 804 of the die assembly 800. In some embodiments, the substrate 502 may be thin to minimize the distance between the island 512 and the face 505 (e.g., to less than 100 nanometers, or less than 50 nanometers); when a SET device 500 is included in the die 302 or 304 in the die assembly 800, the distance between the island 512 and the die 304 or 302, respectively, may be less than 200 nanometers.

The dielectric 508 may extend up the sidewalls 572 of the S/D supports 514, and up the sidewalls 574 of the S/D electrodes 504. In some embodiments, the dielectric 508 may extend along the substrate 502 between the S/D supports 514 and the S/D electrodes 504 such that a portion of the dielectric 508 is disposed between the island 512 and the substrate 502. The dielectric 508 may also extend up sidewalls 576 of the insulator 510, as shown. In some embodiments, the dielectric 508 may have a substantially uniform thickness 524 between 0.5 and 5 nanometers (e.g., 1 nanometer).

The island 512 may be disposed at the bottom of the "box" formed by the dielectric 508. In some embodiments, the top face 578 of the island 512 may be recessed back from the top faces 580 of the S/D supports 514; in some such embodiments, a portion of the insulator 510 may be disposed in the "box" formed by the dielectric 508 such that the island 512 is disposed between this portion of the insulator 510 and the substrate 502. In some embodiments, the island 512 may have a thickness 588 between 5 and 30 nanometers (e.g., 10 nanometers).

The SET device 500 may also include a gate structure 583. The gate structure 583 may include a support 516 disposed on the substrate 502. The gate structure 583 may also include a gate electrode 506 disposed on a side face 568 of the gate support 516; in the embodiment of FIG. 41, no electrode may be disposed on the opposite side face 566 of the gate support 516. The S/D electrodes 504, the dielectric 508, the island 512, and the gate electrode 506 may together provide a SET.

During use of the SET devices 500 disclosed herein, a voltage may be applied across the S/D electrodes 504 and to the gate electrode 506 to provide a potential for carriers (e.g., electrons) to tunnel through the TJs 570 into and out of the island 512. In particular, the gate electrode 506 may be capacitively coupled to the island 512, and thus the potential of the gate electrode 506 may be used to tune the potential of the island 512. Because carriers (e.g., electrons) enter the island 512 via tunneling, the flow of carriers into the island 512 is a discrete phenomenon, and may be characterized by the number of carriers occupying the island 512 at any given time. When the SET device 500 is included in the detector devices 838 of the quantum state detector die 804, the conductance of the island 512 (and thus the conductance of the SET device 500) may change in response to electrical charges proximate to the island 512 (e.g., electron- or hole-based quantum dots generated by the active qubit devices 836 of the active qubit die 802), and the rate of change of this conductance may be a function of the voltage on the gate electrode 506. Thus, when the SET device 500 is used as a charge detector (and thus a large change in conductance is desired when a charge is present), the voltage on the gate electrode 506 may be set to a bias level corresponding to a steep slope of the bias-conductance curve of the SET device 500. In this manner, the SET device 500 may be used as a detector device 838 to detect the state of a proximate qubit (e.g., to detect the spin state of an electron trapped in a proximate quantum well) in the active qubit die 802. In embodiments in which the SET device 500 is included in the active qubit devices of the active qubit die 802, the carrier(s) trapped in the island 512 may themselves provide a quantum dot (e.g., with the quantum information encoded in the spin of the carrier) that may be "read" by the detector devices 838 in the quantum state detector die 804.

In some embodiments, the SET devices 500 disclosed herein may themselves be used as a qubit in a quantum computing device. For example, an electron may be confined in the island 512, and the spin of the electron may be used as a qubit for quantum computations. Thus, any of the SET devices 500 disclosed herein may be used in a computing device to detect the state of spin-based qubits, provide spin-based qubits, or both.

In some embodiments, the top faces 582 of the S/D electrodes 504 may be recessed back from the top faces 580 of the S/D supports 514. Similarly, in some embodiments, the top face 584 of the gate electrode 506 may be recessed back from the top face 586 of the gate support 516. In some embodiments, the gate electrode 506 and the S/D electrodes 504 may have a same height 526. In other embodiments, the gate electrode 506 and the S/D electrodes 504 may have different heights. Generally, the height 526 of the gate electrode 506 and/or the S/D electrodes 504 may be between 5 and 15 nanometers (e.g., 10 nanometers). In some embodiments, the S/D supports 514 and the gate support 516 may have a same height 522. In other embodiments, the S/D supports 514 and the gate support 516 may have different heights. Generally, the height 522 of the gate support 516 and/or the S/D supports 514 may be between 20 and 500 nanometers (e.g., between 30 and 80 nanometers, or approximately equal to 50 nanometers). In some embodiments, the S/D supports 514 and the gate support 516 may have a same width 518. In other embodiments, the S/D supports 514 and the gate support 516 have different widths. Generally, the width 518 of the S/D supports 514 and/or the gate support 516 may be between 20 and 500 nanometers (e.g., 40 nanometers).

Figure 41A:
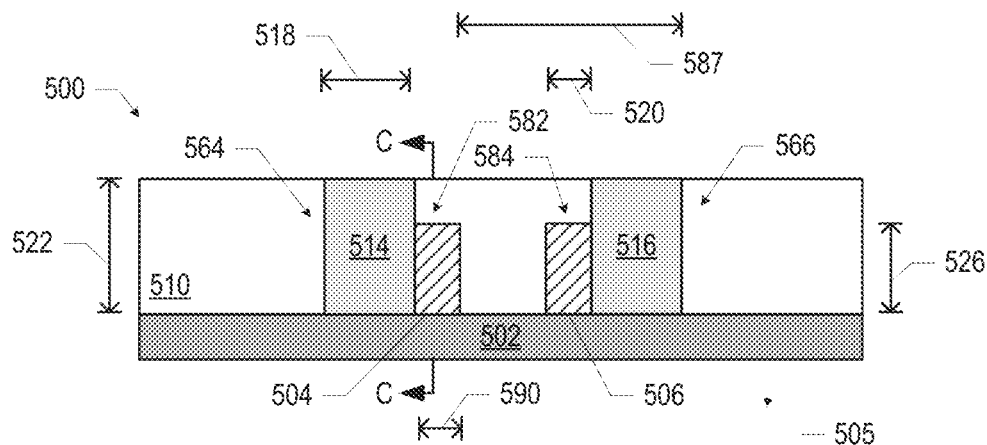
FIGS. 41A-41F are various views of a single electron transistor (SET) device, in accordance with various embodiments.
Figure 41B:
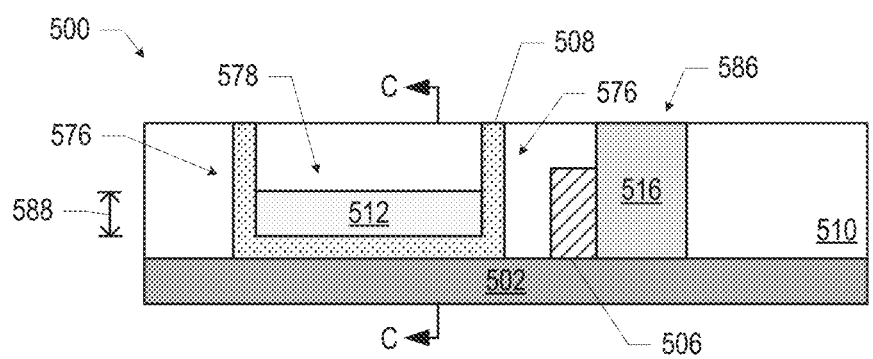
Figure 41C:
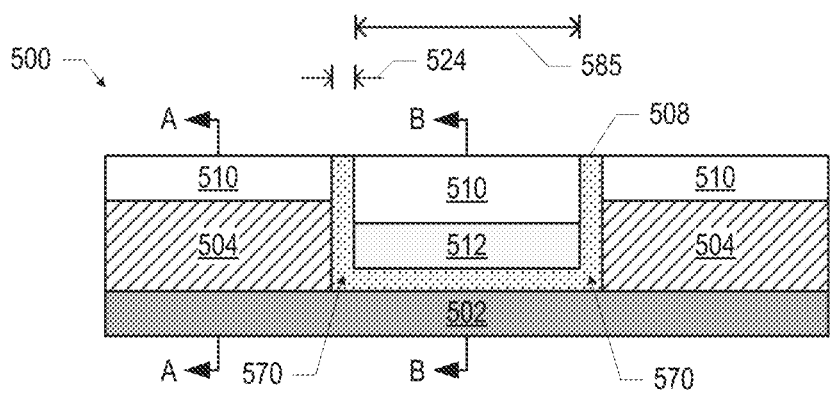
Figure 41D:
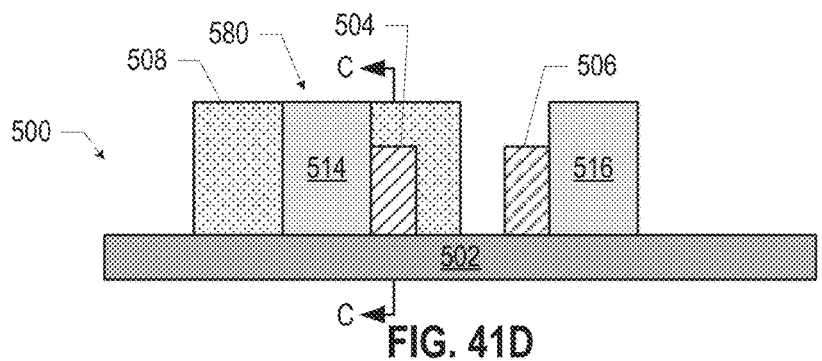
Figure 41E:
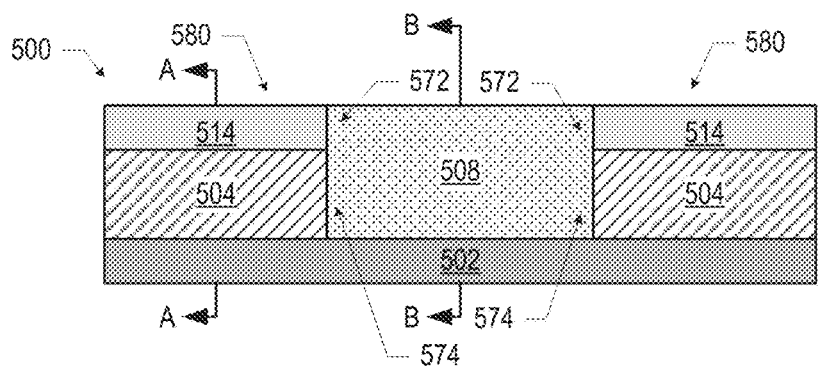

The S/D electrodes 504 may have a width 590 between 1 and 10 nanometers (e.g., 5 nanometers). Smaller S/D electrodes 504 may be suitable for higher temperature (e.g., room temperature) operation; for example, the width 590 may between 1 and 5 nanometers (e.g., 2 nanometers). In some embodiments, the width 520 of the gate electrode 506 may be the same as the width 590 of the S/D electrodes 504. In some embodiments, the width 520 of the gate electrode 506 may be different from the width 590 of the S/D electrodes 504. Generally, the width 520 of the gate electrode 506 may take the form of any of the embodiments discussed herein with reference to the width 590 of the S/D electrodes 504. In some embodiments, the spacing 587 of the S/D electrodes 504 and the gate support 516, as shown in FIG. 41A, may be between 80 and 200 nanometers (e.g., 500 nanometers).

As illustrated in FIG. 41, in some embodiments, the dielectric 508 may laterally extend beyond the area between the two S/D supports 514 (e.g., in the dimension indicated by the arrow 511). The dielectric 508 may also laterally extend beyond the area between the two S/D electrodes 504. Similarly, in some embodiments, the island 512 may laterally extend beyond the area between the two S/D supports 514, and the island 512 may laterally extend beyond the area between the two S/D electrodes 504. In some embodiments, the footprint of the dielectric 508 may have a lateral dimension 530 (in the direction of the axis between the S/D electrodes 504) between 25 and 105 nanometers (e.g., between 40 and 50 nanometers). In some embodiments, the island 512 may have a lateral dimension 585 (in the direction of the axis between the S/D electrodes 504) between 25 and 500 nanometers (e.g., 40 nanometers). In some embodiments, the dielectric 508 may have a lateral dimension 528 (perpendicular to the axis between the S/D electrodes 504) between 25 and 500 nanometers (e.g., 40 nanometers).

Generally, the smaller the island 512, the better the charge sensitivity of any of the SET devices 500 disclosed herein for a given temperature when the self-capacitance of the SETs is the dominant capacitance. In particular, the SET device 500 may have an associated charging energy, representative of the rate of change of conductance in response to proximate charges; a larger charging energy represents greater sensitivity to proximate charges. The charging energy may be inversely proportional to the self-capacitance of the island 512, and the self-capacitance of the island may be proportional to the size of the island 512. As the temperature of the environment of a SET device 500 increases (e.g., to room temperature), the sensitivity of the SET device 500 is typically compromised. Larger charging energies may help a SET device 500 achieve an adequate sensitivity at higher temperatures (e.g., room temperature), and thus smaller islands 512 may be advantageous in SET devices 500 that are to operate at these higher temperatures when self-capacitance of the islands 512 are the dominant capacitances.

Any suitable materials may be used in the SET device 500 of FIG. 41. The S/D supports 514 and the gate support 516 may be "dummy" structures that provide a mechanical support against which the S/D electrodes 504 and the gate electrode 506 may be formed, respectively. In some embodiments, the S/D supports 514 and the gate support 516 may be formed from an insulating material, such as an oxide. The S/D electrodes 504 and the gate electrode 506 may be formed from any suitable conductive material, such as a metal. In some embodiments, the S/D electrodes 504 and the gate electrode 506 may be formed of a noble metal, which may provide advantageous resistance to corrosion during manufacture and thereby facilitate the reliable construction of the TJs 570 (due to the absence of oxide interference).

The insulator 510 may be a suitable dielectric material, such as any interlayer dielectric (ILD) material. The dielectric 508 may be silicon oxide, carbon-doped oxide, or any suitable low-k dielectric material. The island 512 may be a semiconductor material (e.g., silicon) or a metal (e.g., a noble metal, such as copper), in various embodiments.

Figure 41F:
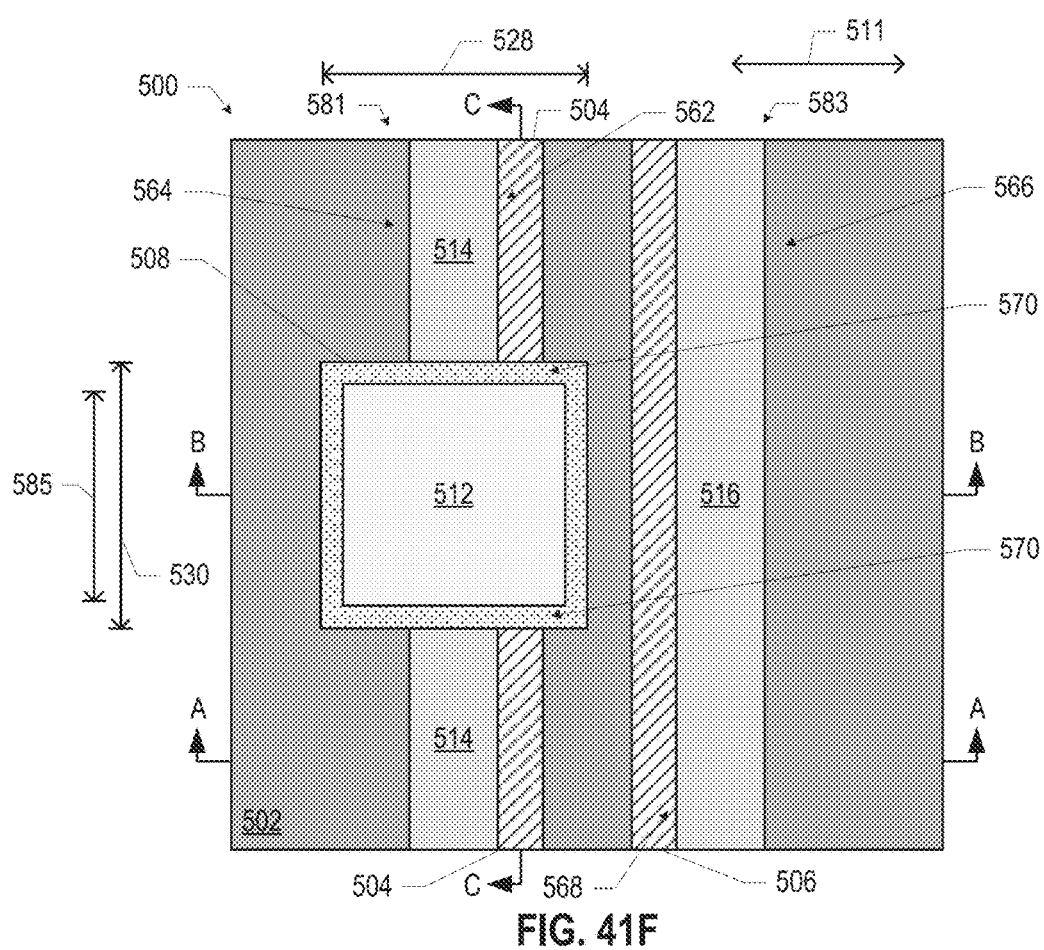

Although a single SET device 500 is illustrated in FIG. 41, a device may include an array of SET devices 500 (e.g., by tiling the SET device 500 illustrated in FIG. 41F in a one-dimensional or two-dimensional array, alternating the S/D structures 581 and the gate structures 583).

Any suitable process may be used to manufacture the SET device 500 of FIG. 41. For example, FIGS. 42-53 depict various cross-sectional views of stages in an example process for manufacturing the SET device 500 of FIG. 41. The materials and dimensions of various components of the stages illustrated in FIGS. 42-53 may take the form of any of the embodiments discussed herein. In FIGS. 42-53, the "A" sub-figures represent cross-sectional views through the section A-A (analogous to FIG. 41A), the "B" sub-figures represent cross-sectional views through the section B-B (analogous to FIG. 41B), and the "C" sub-figures represent cross-sectional views through the section C-C (analogous to FIG. 41C).

Figure 42A:
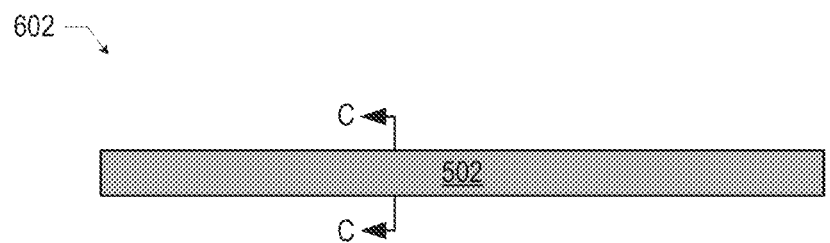
FIGS. 42A-42C, 43A-43C, 44A-44C, 45A-45C, 46A-46C, 47A-47C, 48A-48C, 49A-49C, 50A-50C, 51A-51C, 52A-52C, and 53A-53C illustrate various example stages in the manufacture of the SET device of FIGS. 41A-41F, in accordance with various embodiments.
Figure 42B:
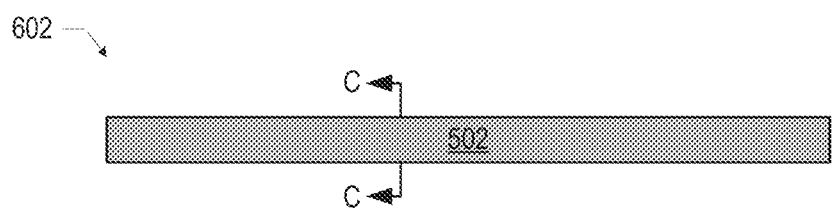
Figure 42C:
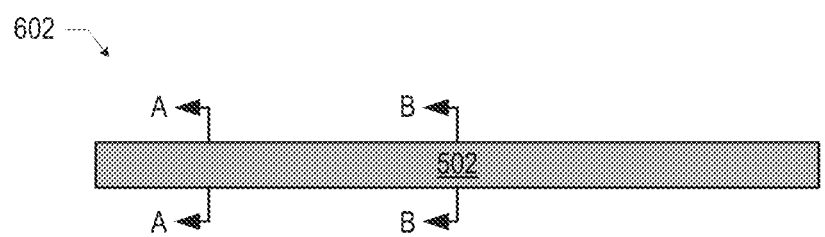

FIG. 42 depicts an assembly 602 including a substrate 502. The substrate 502 may take any of the forms discussed above with reference to FIG. 41; for example, the substrate 502 may be a semiconductor wafer or a structure disposed on a semiconductor wafer.

Figure 43A:
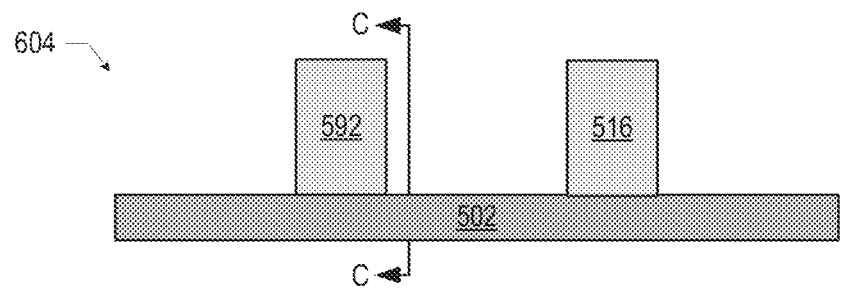
Figure 43B:
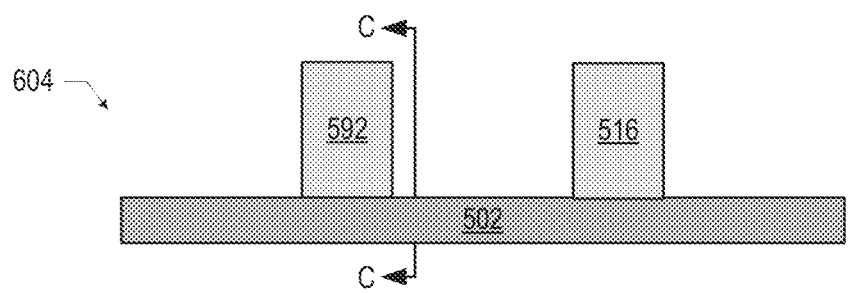
Figure 43C:
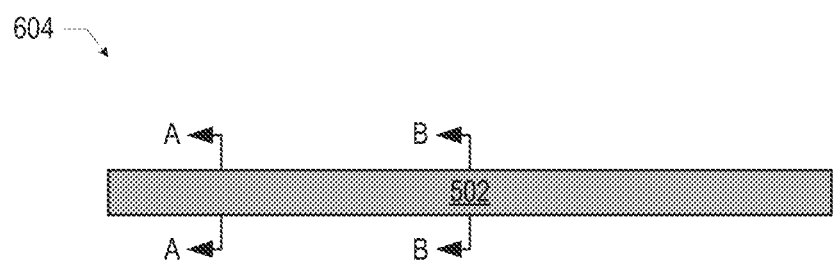

FIG. 43 depicts an assembly 604 subsequent to providing support material 592 and the gate support 516 on the substrate 502 of the assembly 604 (FIG. 42). In some embodiments, the support material 592 and the gate support 516 may each be shaped substantially as a rectangular solid. The support material 592 and the gate support 516 may each take the form of "fins" extending from the substrate 502, and may be formed using any suitable technique. For example, in some embodiments, an insulating material may be blanket-deposited on the substrate 502, and patterned to form the support material 592 and the gate support 516. In other embodiments, a sacrificial material may be blanket-deposited on the substrate 502, trenches may be formed in the sacrificial material down to the substrate 502, the trenches may be filled with insulating material to form the support material 592 and the gate support 516, and then the sacrificial material may be removed. These embodiments are simply examples, and any desired technique may be used to form the support material 592 and the gate support 516 on the substrate 502.

Figure 44A:
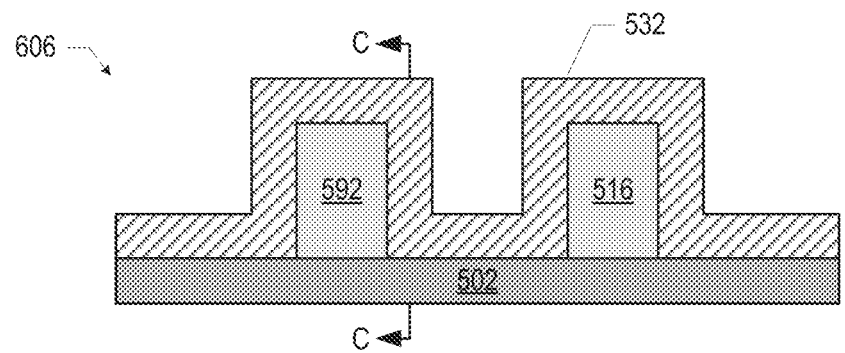
Figure 44B:
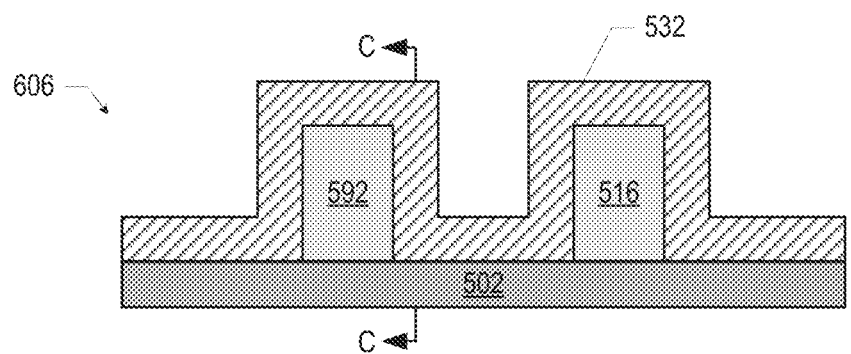
Figure 44C:
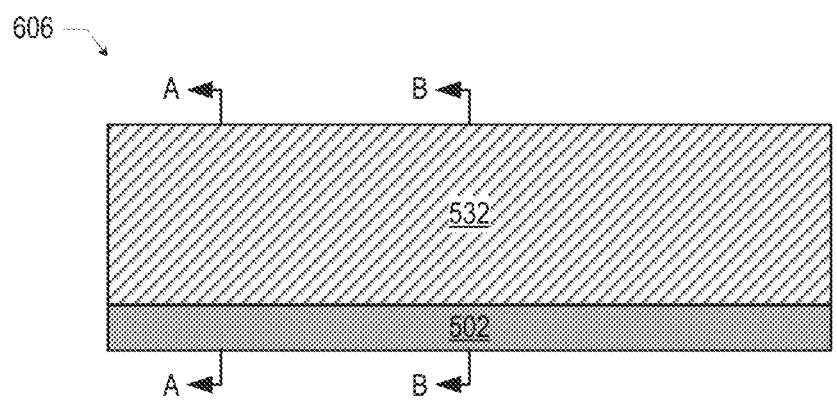

FIG. 44 depicts an assembly 606 subsequent to depositing conductive material 532 on the assembly 604 (FIG. 43). In some embodiments, the conductive material 532 may be conformally deposited on the assembly 604, extending over the support material 592 and the gate support 516 and the exposed substrate 502, to a desired thickness. The thickness of the conductive material 532 may be substantially equal to the widths 590 and 520, discussed above. Such conformal deposition may be performed by, for example, atomic layer deposition (ALD). Using ALD to deposit the conductive material 532 may allow the thickness of the deposition to be very well controlled, helping achieve a small and reliably sized SET device 500.

Figure 45A:
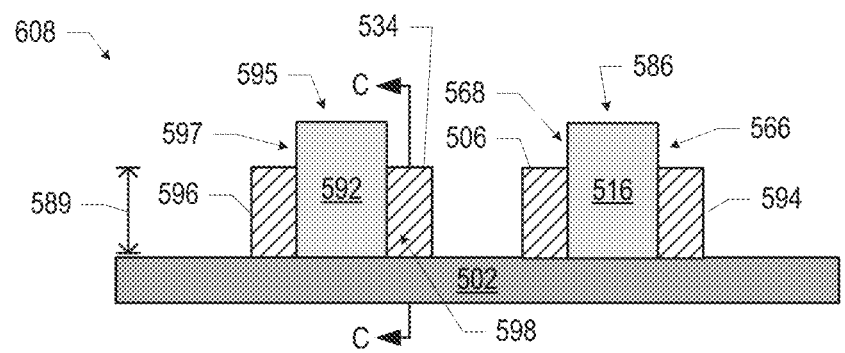
Figure 45B:
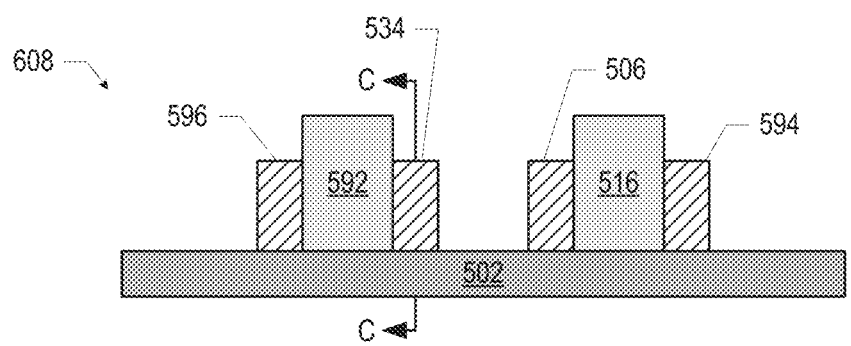
Figure 45C:
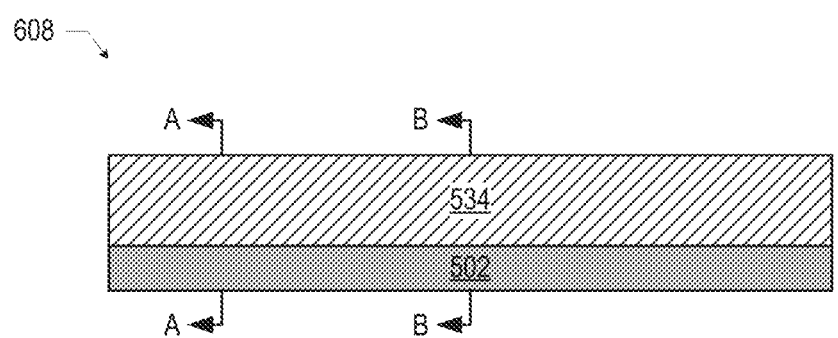

FIG. 45 depicts an assembly 608 subsequent to directionally etching back the conductive material 532 of the assembly 606 (FIG. 44) to remove a desired thickness of the conductive material 532 in the "vertical" direction and leave a desired height 589 of the conductive material 532. The height 589 may be equal to the height 526 discussed above. In particular, the conductive material 532 may be removed from the top face 595 of the support material 592, the top face 586 of the gate support 516, and from exposed areas of the substrate 502 where the thickness of the conductive material 532 was less than or equal to the thickness removed. The directional etching may leave portions of the conductive material 532 on the side faces of the support material 592 and the gate support 516. In particular, conductive material 596 may be disposed on the side face 597 of the support material 592, conductive material 534 may be disposed on the side face 598 of the support material 592, the gate electrode 506 may be disposed on the side face 568 of the gate support 516, and conductive material 594 may be disposed on the side face 566 of the gate support 516. As discussed above with reference to FIG. 41, in some embodiments, the conductive material 532 may be recessed below the top faces 595 and 586 of the support material 592 and the gate support 516, respectively. Techniques other than the directional etching described above may be used to form the assembly 608 from the assembly 606. For example, in some embodiments, a sacrificial light absorbing material (SLAM) may be deposited on the assembly 606 and recessed back to the desired height 589 (e.g., using a timed dry etch); a desired thickness of the conductive material 532 that extends beyond the SLAM may be etched away, then the SLAM may be removed and the conductive material 532 etched again to further recess the conductive material 532 on the side faces of the support material 592 and the gate support 516 and remove the conductive material 532 from exposed areas of the substrate 502.

Figure 46A:
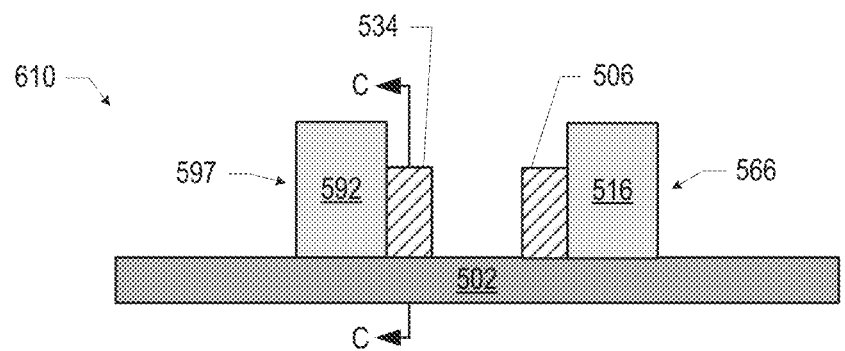
Figure 46B:
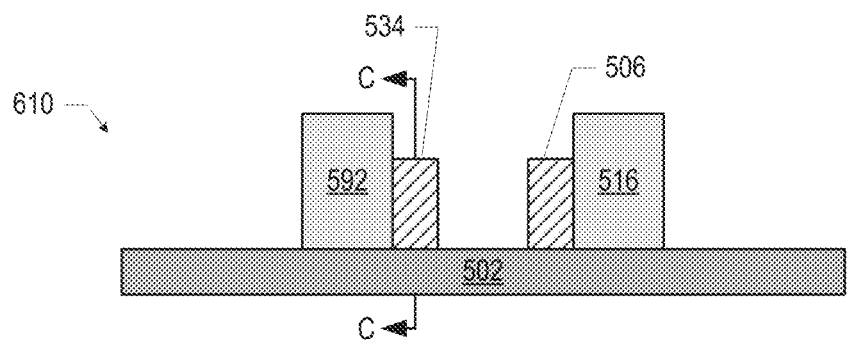
Figure 46C:
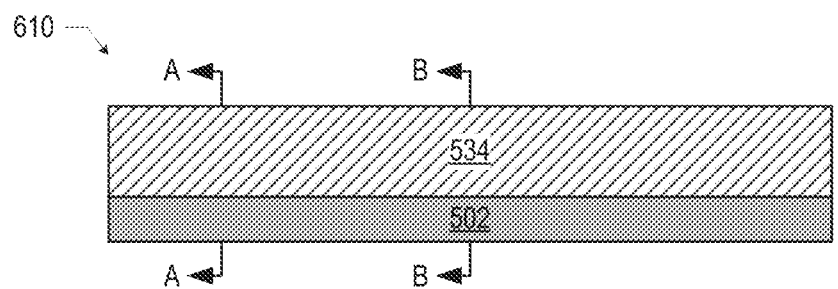

FIG. 46 depicts an assembly 610 subsequent to removing the conductive material 596 from the side face 597 of the support material 592 of the assembly 608 (FIG. 45), and removing the conductive material 594 from the side face 566 of the gate support 516 of the assembly 608. In some embodiments, the conductive material 596 and the conductive material 594 may be removed by providing an appropriate mask to the assembly 608 (that exposes the conductive material 596 and the conductive material 594) and then etching away the exposed conductive material 596 and the conductive material 594. In other embodiments, the conductive material 596 and the conductive material 594 may not be formed on the support material 592 and the gate support 516, respectively, at all. Instead, an insulating material (e.g., the insulator 510, as discussed below with reference to FIG. 47) may be deposited on the assembly 604 (FIG. 43) and polished back to expose the top face 595 of the support material 592 and the top face 586 of the gate support 516; the insulating material may be patterned to expose the substrate 502 between the support material 592 and the gate support 516; the conductive material 532 may be conformally deposited on this assembly (e.g., using the techniques discussed above with reference to FIG. 44); and then a directional etch may be performed on the conductive material 532, resulting in an assembly similar to that illustrated in FIG. 46 but with insulating material on the side face 597 of the support material 592 and the side face 566 of the gate support 516. This assembly may be processed in substantially the same manner as discussed below, and thus represents one alternative approach to that explicitly illustrated in FIGS. 42-53.

Figure 47A:
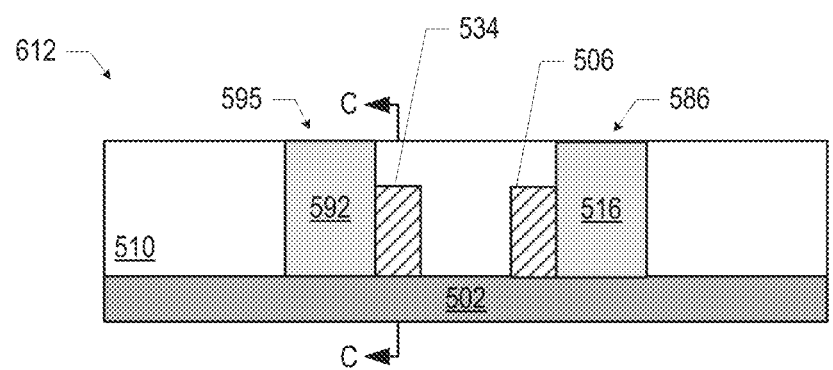
Figure 47B:
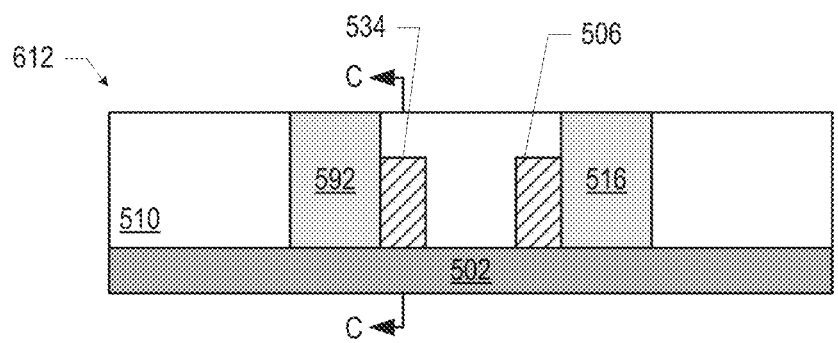
Figure 47C:
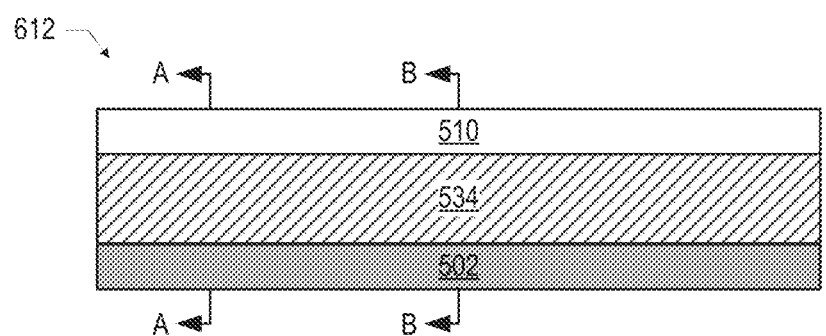

FIG. 47 depicts an assembly 612 subsequent to depositing an insulator 510 on the assembly 610 (FIG. 46). In the assembly 612, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 48A:
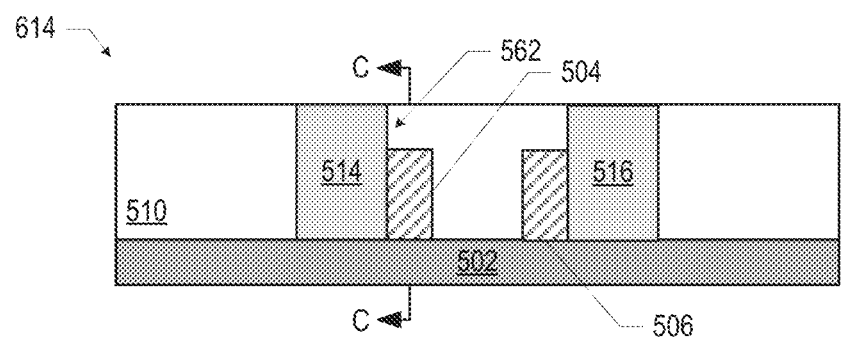
Figure 48B:
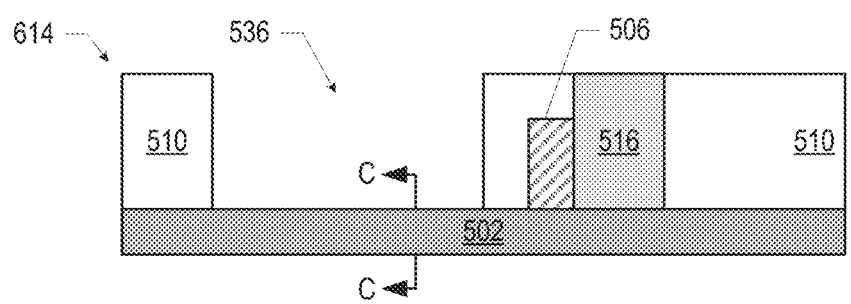
Figure 48C:
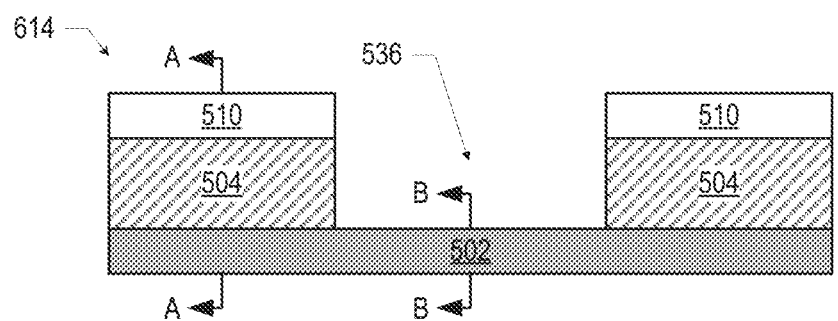

FIG. 48 depicts an assembly 614 subsequent to forming a recess 536 in the assembly 612 (FIG. 47). The recess 536 may have the footprint of the dielectric 508 illustrated in FIG. 41F (e.g., a substantially rectangular footprint), and may divide the support material 592 of FIG. 47 into the two S/D supports 514, and thus the lateral dimensions of the recess 536 may take any of the forms of the lateral dimensions 530 and 528 discussed herein. The recess 536 may similarly divide the conductive material 534 into two S/D electrodes 504 (disposed on the side faces 562 of the S/D supports 514). The recess 536 may be spaced apart from the gate electrode 506 by a portion of the insulator 510, as shown. Any suitable technique may be used to form the recess 536, and the appropriate technique may depend on the desired dimensions of the recess 536. In some embodiments, the recess 536 may be formed by a hole shrink technique, or extreme ultraviolet lithography, for example.

Figure 49A:
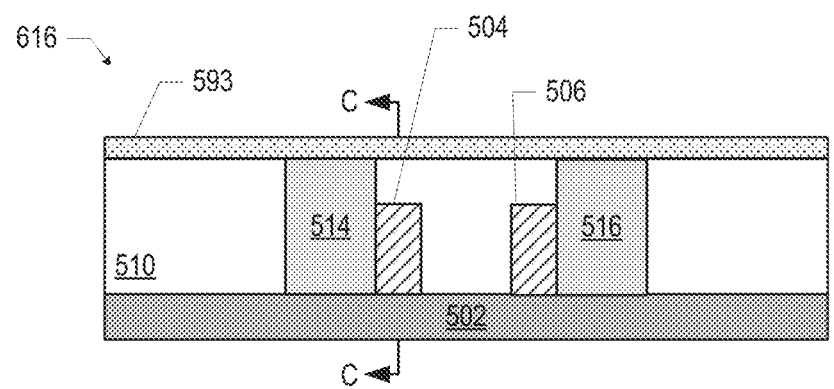
Figure 49B:
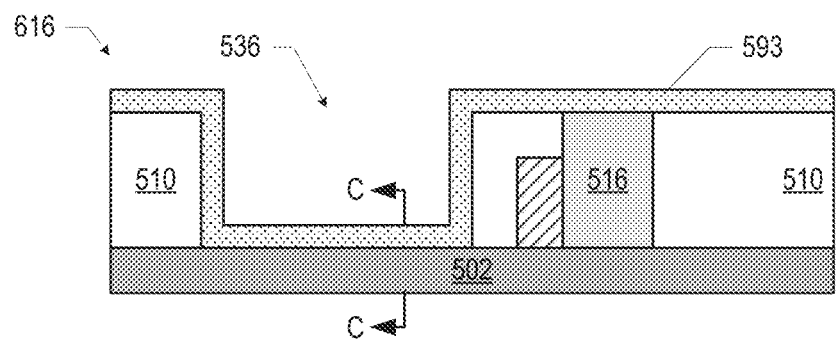
Figure 49C:
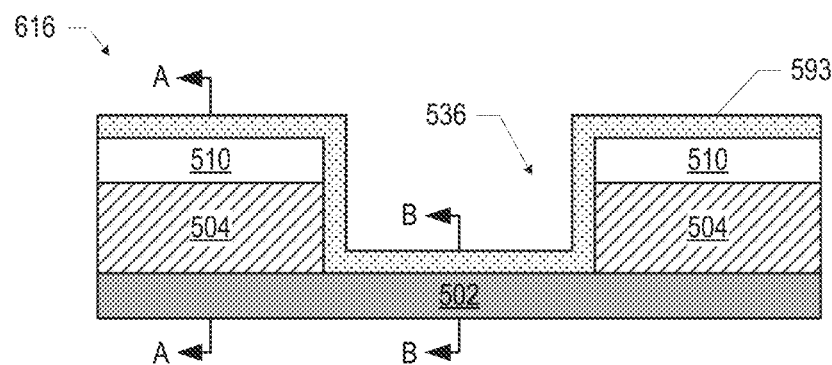

FIG. 49 depicts an assembly 616 subsequent to conformally depositing a dielectric material 593 on the assembly 614 (FIG. 48). The dielectric material 593 may be the material of the dielectric 508 (as discussed below), and it may be deposited on the sidewalls and bottom of the recess 536, as shown. The thickness of the dielectric material 593 may be substantially equal to the thickness 524, discussed above. Such conformal deposition may be performed by, for example, ALD (which may provide a desirably well-controlled deposition thickness).

Figure 50A:
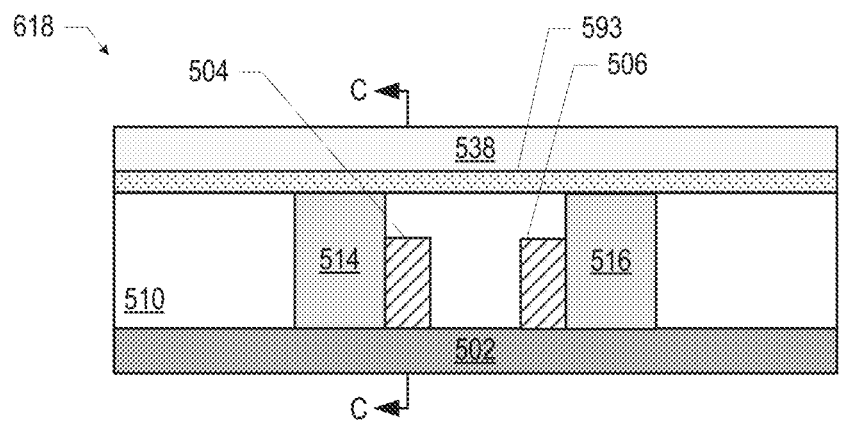
Figure 50B:
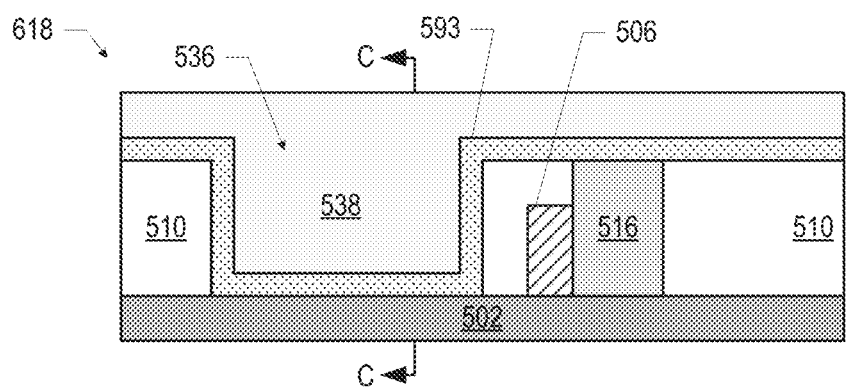
Figure 50C:
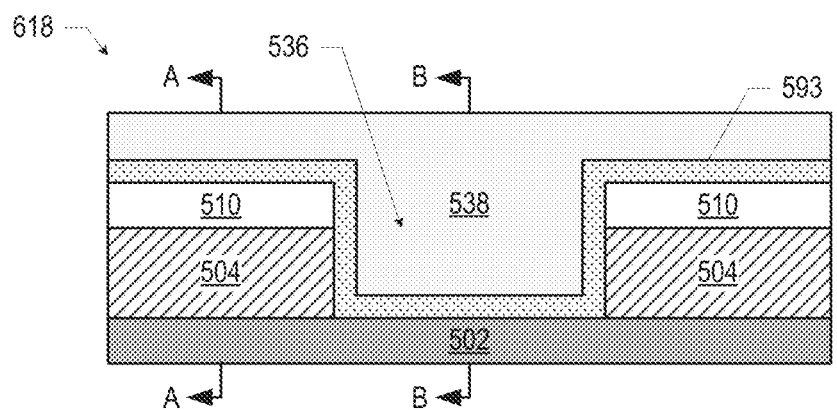

FIG. 50 depicts an assembly 618 subsequent to depositing an island material 538 on the assembly 616 (FIG. 49). The island material 538 may, as illustrated in FIG. 50, fill the recess 536, and in some embodiments, may extend beyond the recess 536 and over the S/D supports 514 and the gate support 516. The island material 538 may be deposited using any suitable technique, such as chemical vapor deposition (CVD) or atomic layer deposition (ALD).

Figure 51A:
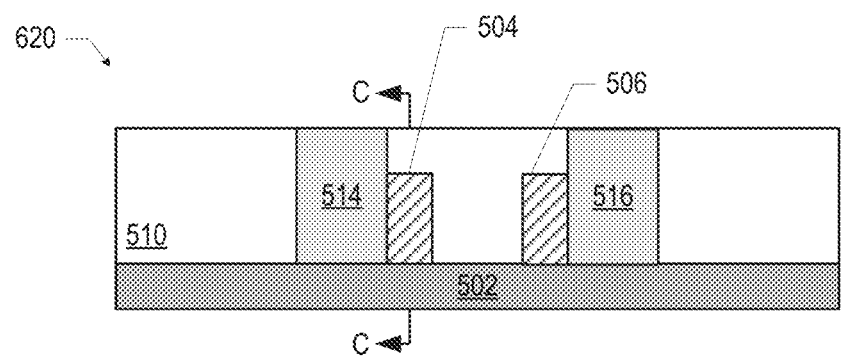
Figure 51B:
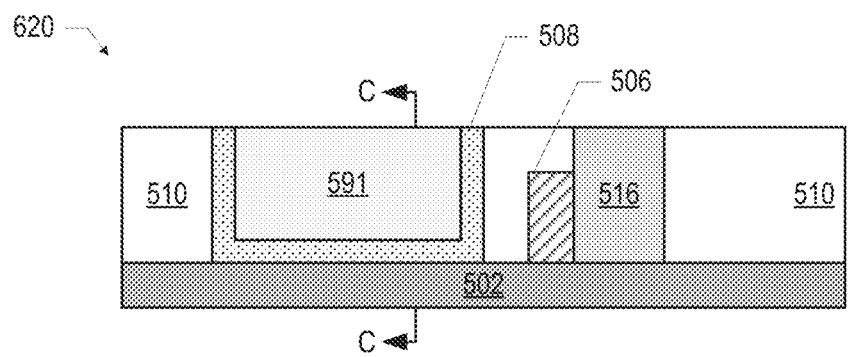
Figure 51C:
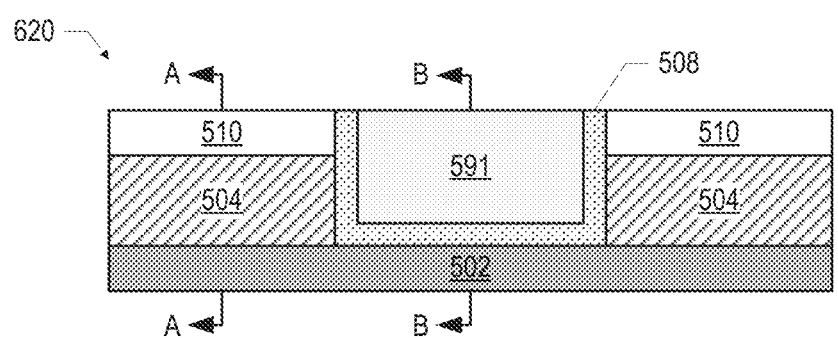

FIG. 51 depicts an assembly 620 subsequent to polishing the assembly 618 (FIG. 50) to remove the dielectric material 593 and the island material 538 that extended beyond the recess 536 in the assembly 618, forming the dielectric 508 and island material 591, respectively. In some embodiments, a CMP technique may be used to polish the assembly 618. In some embodiments, this polishing operation may not remove all of the dielectric material 593 that extends beyond the recess 536; some or all of that "excess" dielectric material 593 may remain in the assembly 620.

Figure 52A:
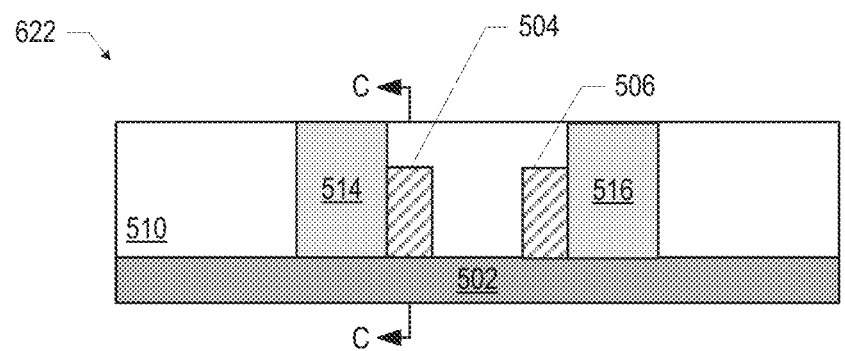
Figure 52B:
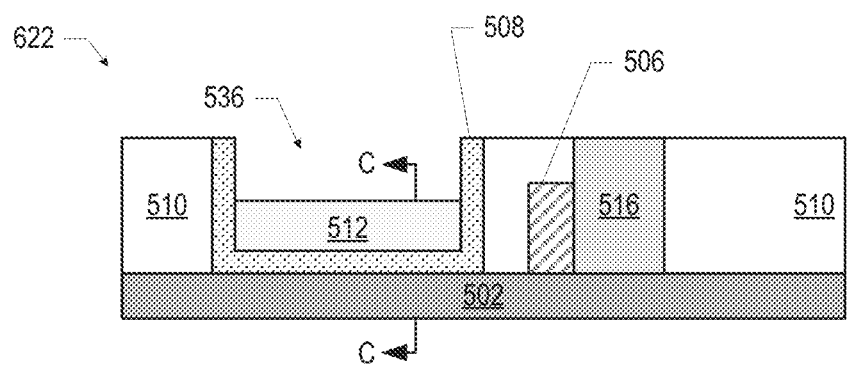
Figure 52C:
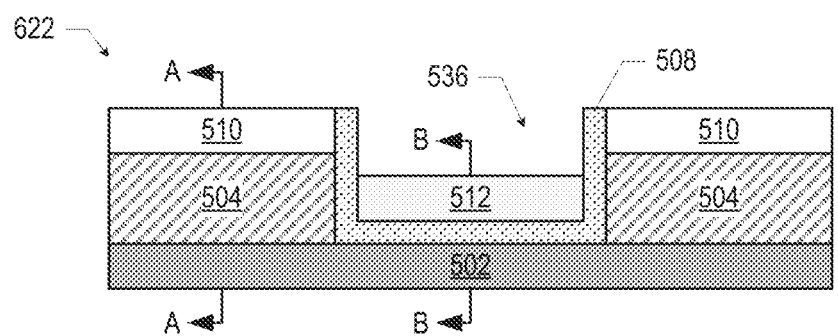

FIG. 52 depicts an assembly 622 subsequent to recessing the island material 591 of the assembly 620 (FIG. 51) back into the recess 536 to form the island 512. The island material 591 may be recessed using any suitable technique (e.g., using a dry etch, followed by a wet clean, as appropriate for the material composition of the island material 591).

Figure 53A:
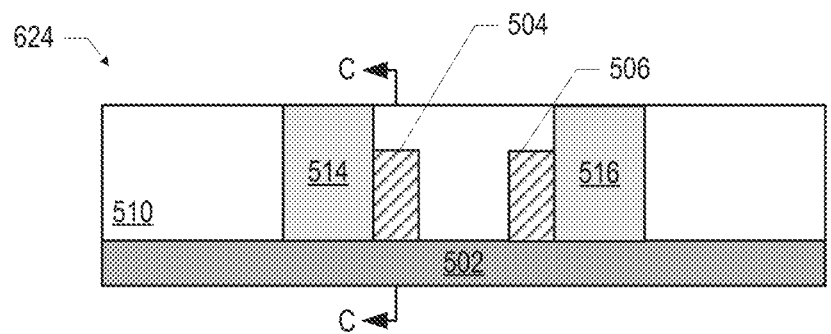
Figure 53B:
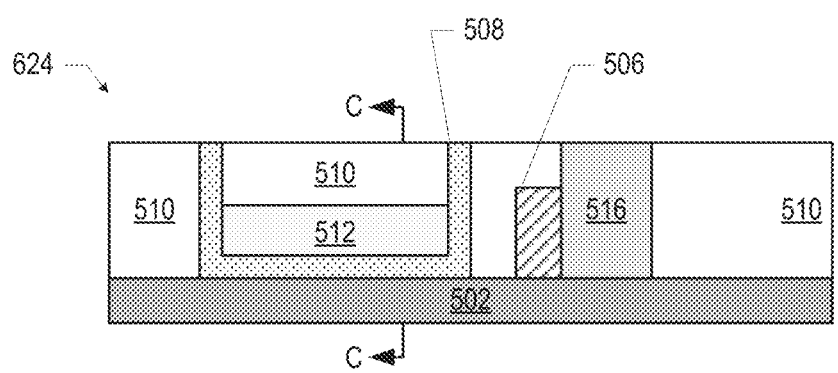
Figure 53C:
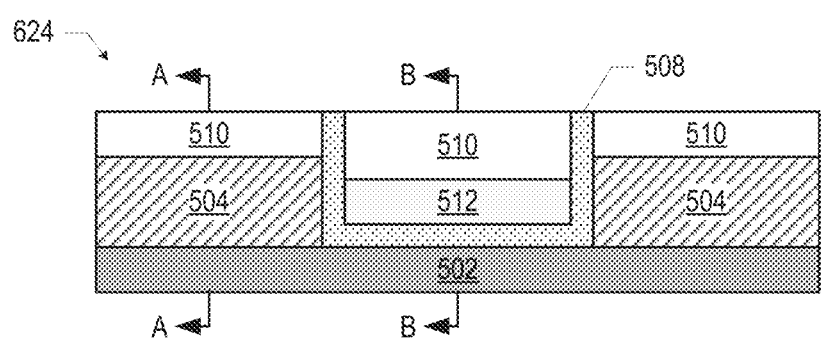
Figure 54A:
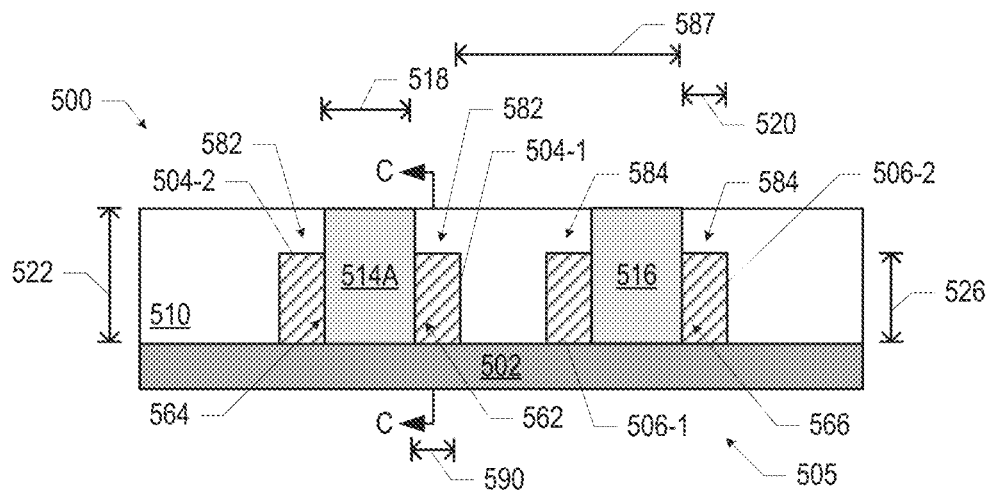
FIGS. 54A-54F are various views of another SET device, in accordance with various embodiments.
Figure 54B:
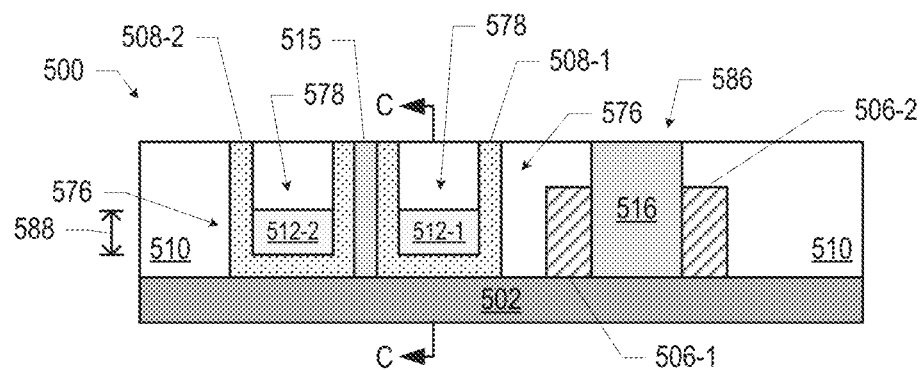
Figure 54C:
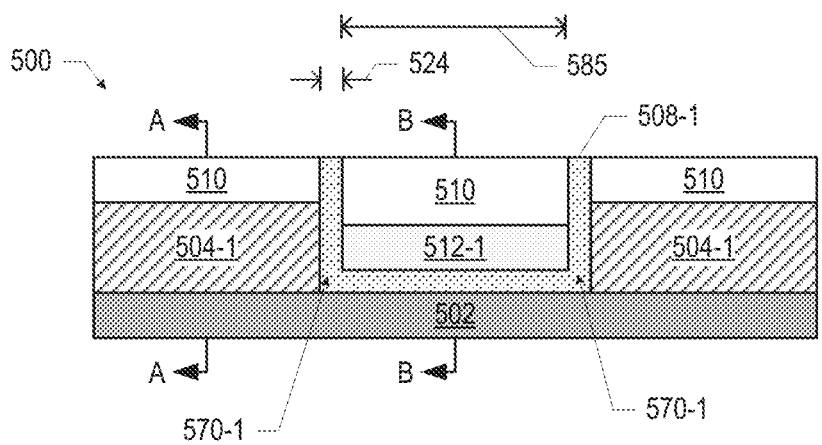
Figure 54D:
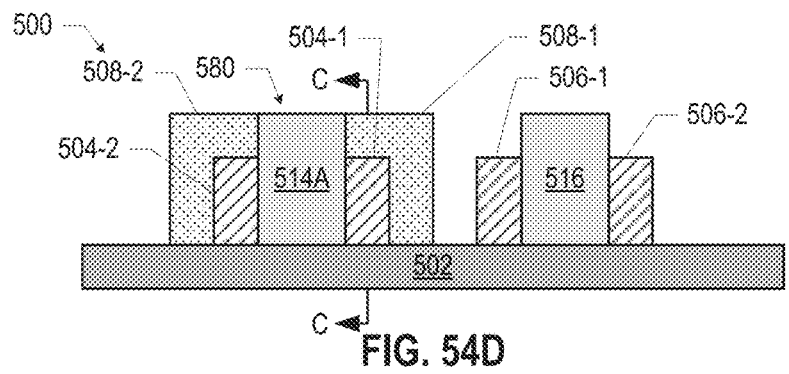
Figure 54E:
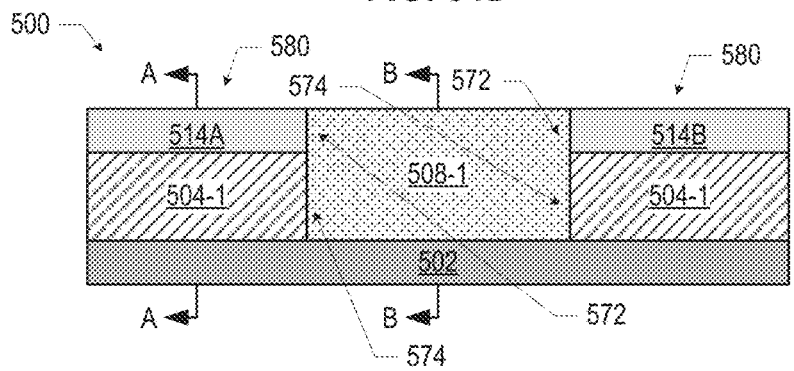
Figure 54F:
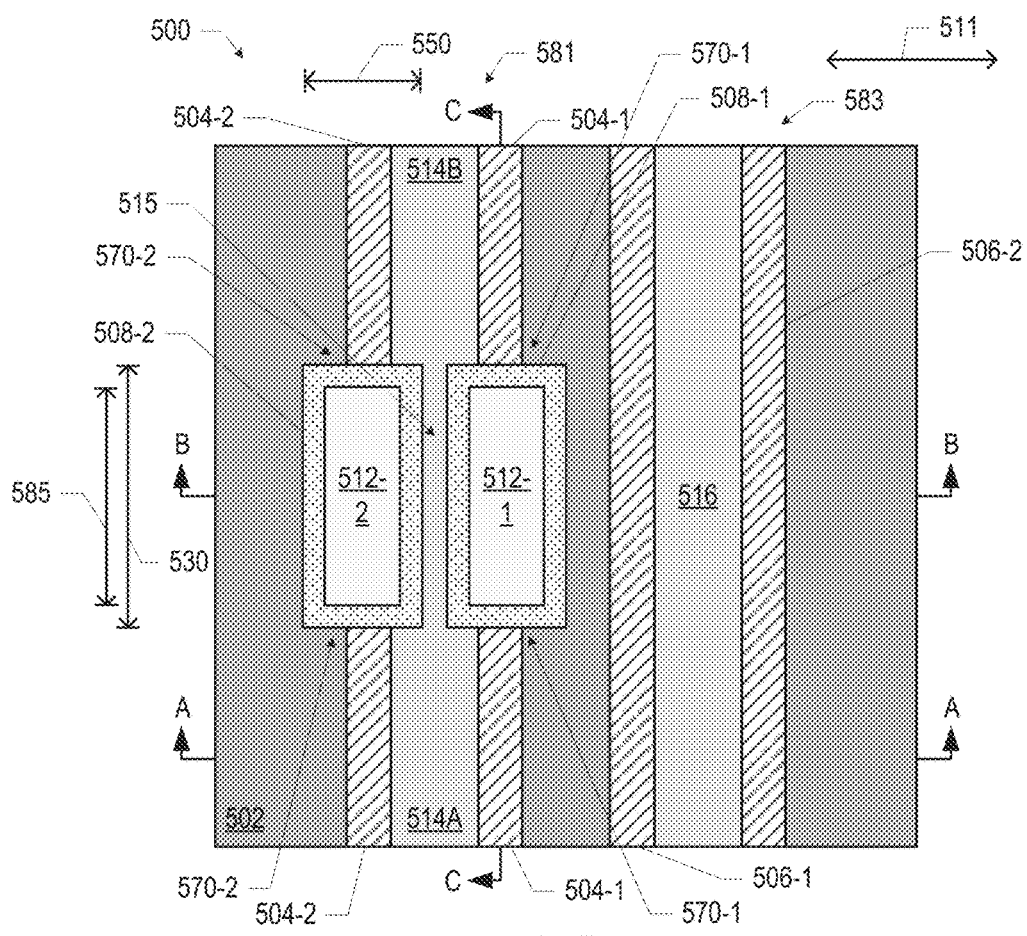

FIG. 53 depicts an assembly 624 subsequent to providing additional insulator 510 in the recess 536 of the assembly 622 (FIG. 52) above the island 512. The additional insulator 510 may be provided using any of the techniques discussed above with reference to FIG. 47. The assembly 624 may take the form of the SET device 500 discussed above with reference to FIG. 41. In some embodiments, the additional insulator 510 may extend beyond the recess 536, and may be deposited over all of the assembly 622; this is not shown in FIG. 53 for economy of illustration. As discussed below with reference to FIG. 65, conductive pathways (including, e.g., conductive vias) may extend through the insulator 510 to make contact with the S/D electrodes 504 and the gate electrode 506.

FIG. 54 provides various views of a second embodiment of a SET device 500. In particular, FIG. 54A is a cross-sectional view of the SET device 500 through the section A-A of FIGS. 54C, 54E, and 54F; FIG. 54B is a cross-sectional view of the SET device 500 through the section B-B of FIGS. 54C, 54E, and 54F; FIG. 54C is a cross-sectional view of the SET device 500 through the section C-C of FIGS. 54A, 54B, 54D, and 54F; FIG. 54D is a side view of the SET device 500 toward the section A-A with the insulator 510 removed; FIG. 54E is a side view of the SET device 500 toward the section C-C from the gate electrode 506-1 with the insulator 510 removed; and FIG. 54F is a top view of the SET device 500 with the insulator 510 removed. As discussed below, FIG. 54 depicts one complete SET, and two "halves" of additional SETs 500.

As illustrated in FIG. 54, the SET device 500 may include an S/D structure 581 including two source/drain (S/D) supports 514A and 514B disposed on a substrate 502. The S/D structure 581 may also include support material 515 between the S/D supports 514A and 514B. In some embodiments, the S/D supports 514A and 514B and the support material 515 may be materially contiguous (e.g., as discussed below with reference to FIGS. 55-56). Reference to an "S/D support 514" may refer to both the S/D supports 514A and 514B. Each S/D support 514 may have an S/D electrode 504-1 disposed on a side face 562 of the S/D support 514. Two S/D electrodes 504-1 of the S/D structure 581 may be spaced apart by intervening dielectric 508-1 and an island 512-1. In particular, a SET may include two TJs 570-1, each formed by a portion of dielectric 508-1 "sandwiched" between an S/D electrode 504-1 and the island 512-1.

A gate structure 583 including a gate support 516 may also be disposed on the substrate 502. The gate structure 583 may also include a gate electrode 506-1 disposed on a side face 568 of the gate support 516. During use, as discussed above with reference to FIG. 41, voltages may be applied to the gate electrode 506-1 and the S/D electrodes 504-1 to control electron transport and electron occupancy in the island 512-1; the gate electrode 506-1, the S/D electrodes 504-1, the dielectric 508-1, and the island 512-1 may thus together provide a SET.

FIG. 54 also illustrates portions of additional SETs. In particular, the S/D structure 581 may include additional S/D electrodes 504-2 disposed on the side faces 564 of the S/D supports 514 (opposite to the side faces 562). The two S/D electrodes 504-2 may be spaced apart by intervening dielectric 508-2 and an island 512-2. In particular, this arrangement may result in two TJs 570-2, each formed by a portion of dielectric 508-2 "sandwiched" between an S/D electrode 504-2 and the island 512-2. Similarly, the gate structure 583 may include an additional gate electrode 506-2 disposed on the side face 566 of the gate support 516 (opposite to the side face 568). If the S/D structures 581 and the gate structures 583 of FIG. 54 are repeatedly alternatingly arranged (continuing the pattern illustrated in FIG. 54), the gate electrode 506-2 of an additional gate structure 583 (not shown) disposed to the "left" of the S/D structure 581 of FIG. 54F may, together with the S/D electrodes 504-2, the dielectric 508-2, and the island 512-2, provide another SET. In this manner, an array of SETs may be formed. Use of these SETs may take the form of any of the embodiments disclosed herein.

Reference to a "dielectric 508" may refer to both the dielectrics 508-1 and 508-2, and reference to an "island 512" may refer to both the islands 512-1 and 512-2. Similarly, reference to an "S/D electrode 504" may refer to both the S/D electrodes 504-1 and 504-2, and reference to a "gate electrode 506" may refer to both the gate electrodes 506-1 and 506-2.

The dielectrics 508 of FIG. 54 may extend up the sidewalls 572 of the S/D supports 514, and up the sidewalls 574 of the S/D electrodes 504. In some embodiments, the dielectrics 508 may extend along the substrate 502 between the S/D supports 514 and the S/D electrodes 504 such that a portion of the dielectrics 508 is disposed between the islands 512 and the substrate 502. The dielectrics 508 may also extend up sidewalls 576 of the insulator 510, as shown.

The islands 512 of FIG. 54 may be disposed at the bottom of the "boxes" formed by the dielectrics 508. In some embodiments, the top faces 578 of the islands 512 may be recessed back from the top faces 580 of the S/D supports 514; in some such embodiments, portions of the insulator 510 may be disposed in the "boxes" formed by the dielectrics 508 such that the islands 512 are disposed between these portions of the insulator 510 and the substrate 502.

In some embodiments, the top faces 582 of the S/D electrodes 504 of FIG. 54 may be recessed back from the top faces 580 of the S/D supports 514. Similarly, in some embodiments, the top faces 584 of the gate electrodes 506 may be recessed back from the top face 586 of the gate support 516. The dimensions 524, 588, 526, 522, 518, 590, 520, 530, 585, and 587 of FIG. 54 may take any of the forms discussed above with reference to the SET device 500 of FIG. 41.

As illustrated in FIG. 54, in some embodiments, the dielectrics 508 may laterally extend beyond the area between the two S/D supports 514 (e.g., in the dimension indicated by the arrow 511). The dielectrics 508 may also laterally extend beyond the area between the two S/D electrodes 504. Similarly, in some embodiments, the islands 512 may laterally extend beyond the area between the two S/D supports 514, and the islands 512 may laterally extend beyond the area between the two associated S/D electrodes 504. In some embodiments, the dielectric 508 may have a lateral dimension 550 (perpendicular to the axis between the S/D electrodes 504) between 10 and 50 nanometers (e.g., 20 nanometers).

Any suitable materials discussed above with reference to the SET device 500 of FIG. 41 may be used in the SET device 500 of FIG. 54. Additionally, although a single complete SET is illustrated in FIG. 54 (and a one-dimensional array of the SETs of FIG. 54 is discussed above), a device may include a two-dimensional array of the SETs illustrated in FIG. 54 (or any other arrangement of multiple SETs).

Any suitable process may be used to manufacture the SET device 500 of FIG. 54. For example, FIGS. 55-58 depict various cross-sectional views of stages in an example process for manufacturing the SET device 500 of FIG. 54. The materials and dimensions of various components of the stages illustrated in FIGS. 55-58 may take the form of any of the embodiments discussed herein. In FIGS. 55-58, the "A" sub-figures represent cross-sectional views through the section A-A (analogous to FIG. 54A), the "B" sub-figures represent cross-sectional views through the section B-B (analogous to FIG. 54B), and the "C" sub-figures represent cross-sectional views through the section C-C (analogous to FIG. 54C).

Figure 55A:
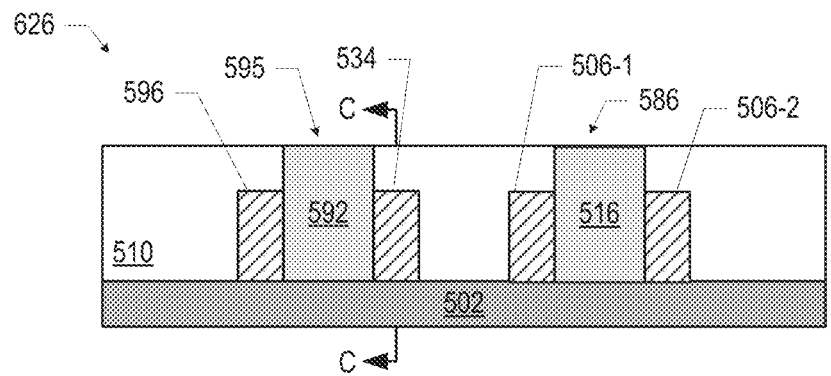
FIGS. 55A-55C, 56A-56C, 57A-57C, and 58A-58C illustrate various example stages in the manufacture of the SET device of FIGS. 54A-54F, in accordance with various embodiments.
Figure 55B:
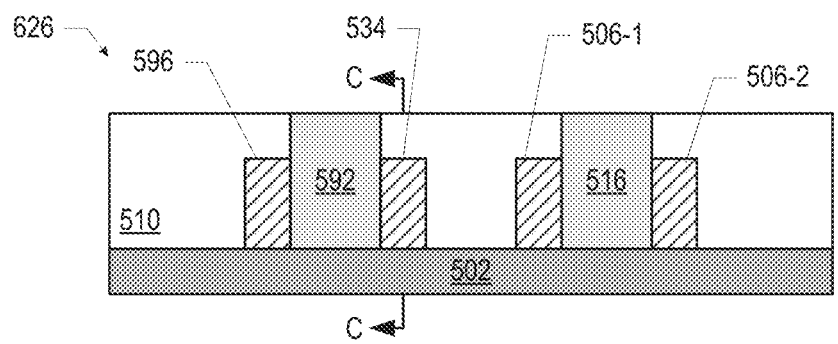
Figure 55C:
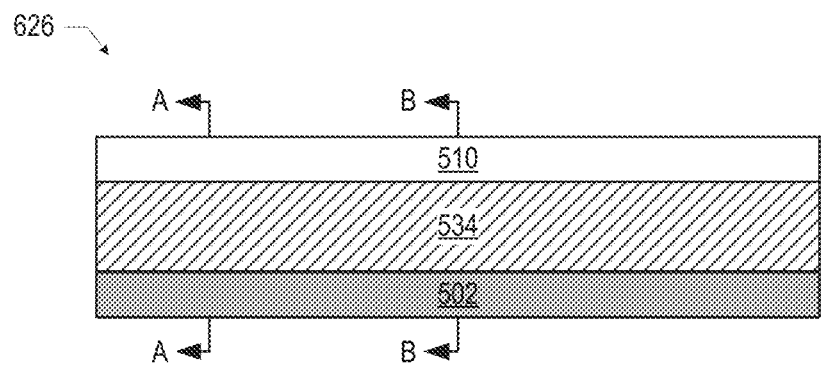

FIG. 55 depicts an assembly 626 subsequent to depositing an insulator 510 on the assembly 608 (FIG. 45). In contrast to the manufacturing process discussed above with reference to FIG. 41, the conductive material 596 disposed on the side face 597 of the support material 592 may not be removed (as discussed above with reference to FIG. 46); similarly, the conductive material 594 disposed on the side face 566 of the gate support 516 in FIG. 45 may not be removed. In FIG. 55, the conductive material 594 is relabeled as 506-2, consistent with FIG. 54, and the gate electrode 506 of FIG. 45 is relabeled as the gate electrode 506-1. In the assembly 626, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 56A:
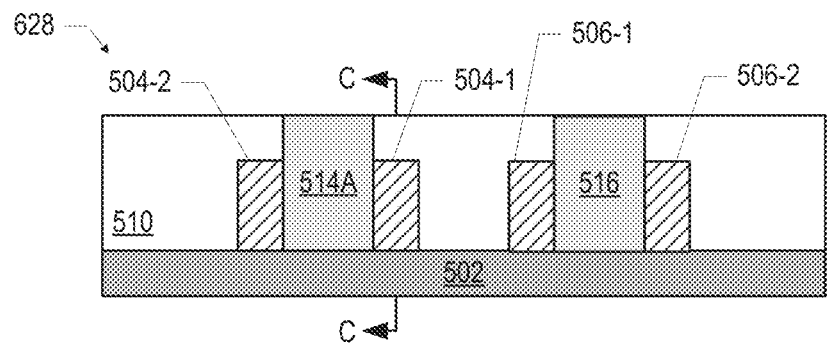
Figure 56B:
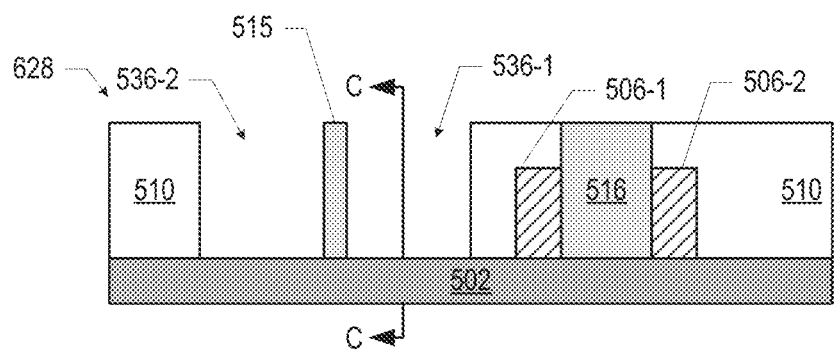
Figure 56C:
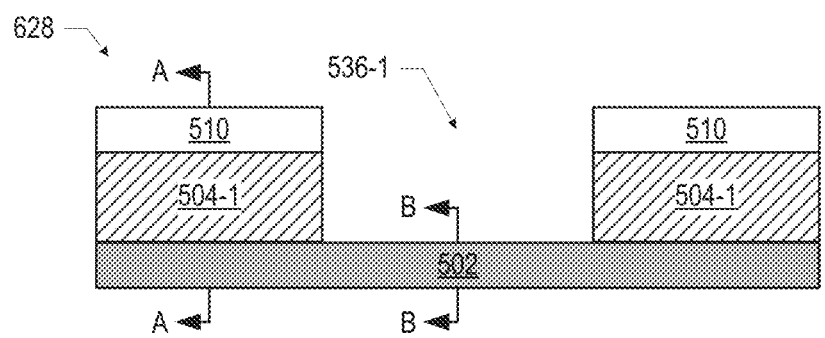

FIG. 56 depicts an assembly 628 subsequent to forming two recesses 536-1 and 536-2 in the assembly 626 (FIG. 55). Reference to a "recess 536" may refer to both the recesses 536-1 and 536-2. The recesses 536 may have the footprints of the dielectrics 508 illustrated in FIG. 54F (e.g., substantially rectangular footprints), and may divide the support material 592 of FIG. 55 into the two S/D supports 514A and 514B, joined by the support material 515. The lateral dimensions of the recesses 536 may take any of the forms of the lateral dimensions 550 and 530 discussed herein. The recess 536-1 may divide the conductive material 534 into two S/D electrodes 504-1 (disposed on the side faces 562 of the S/D supports 514), and the recess 536-2 may divide the conductive material 534 into two S/D electrodes 504-2 (disposed on the side faces 564 of the S/D supports 514). The recess 536-1 may be spaced apart from the gate electrode 506-1 by a portion of the insulator 510, as shown. The recesses 536-1 and 536-2 may be spaced apart from each other by the support material 515. The recesses 536-1 and 536-2 may be formed using any of the techniques discussed above with reference to FIG. 48.

Figure 57A:
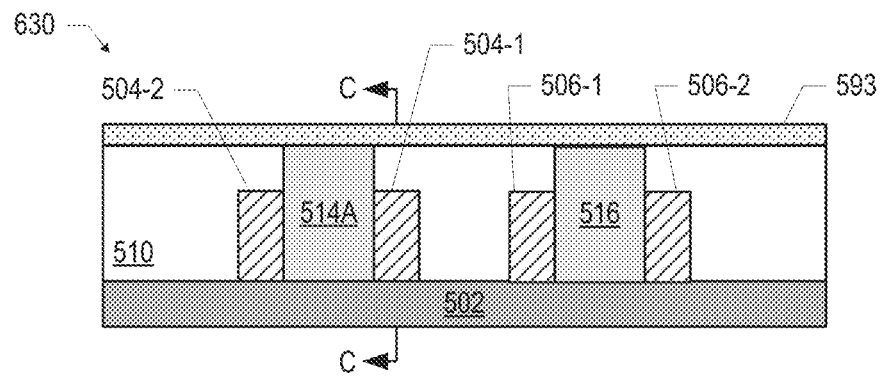
Figure 57B:
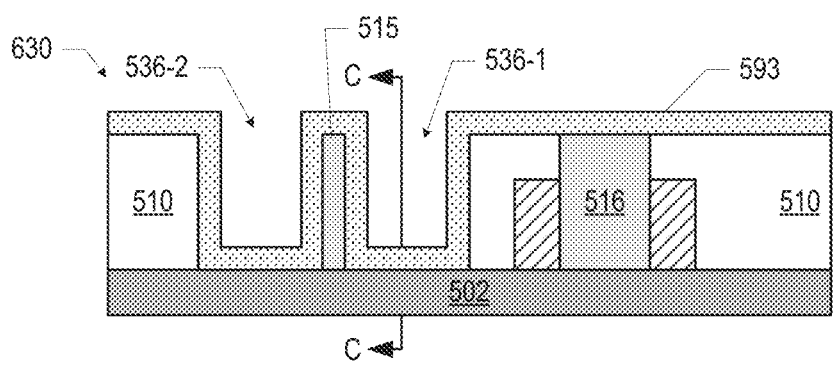
Figure 57C:
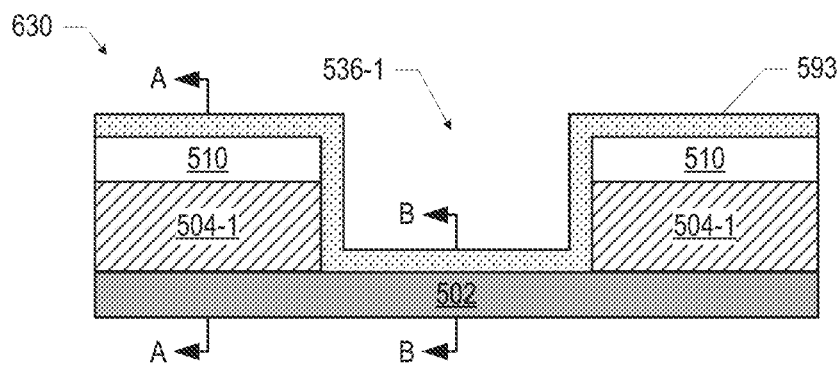

FIG. 57 depicts an assembly 630 subsequent to conformally depositing a dielectric material 593 on the assembly 628 (FIG. 56). The dielectric material 593 may be the material of the dielectrics 508, and it may be deposited on the sidewalls and bottom of the recesses 536-1 and 536-2, as shown. The thickness of the dielectric material 593 may be substantially equal to the thickness 524, discussed above. Such conformal deposition may be performed by, for example, ALD.

Figure 58A:
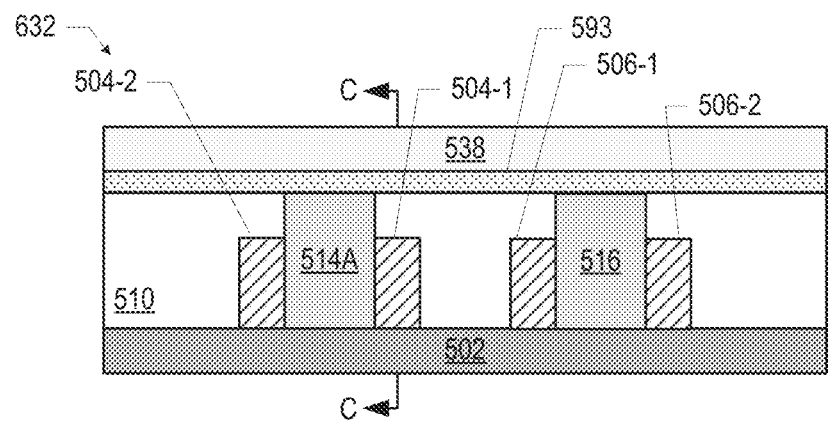
Figure 58B:
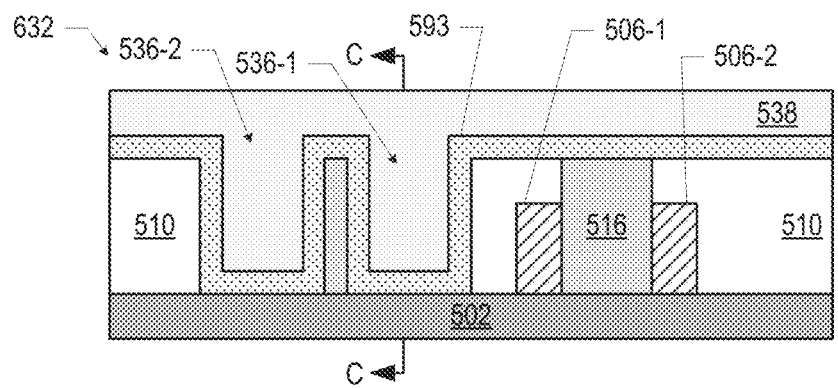
Figure 58C:
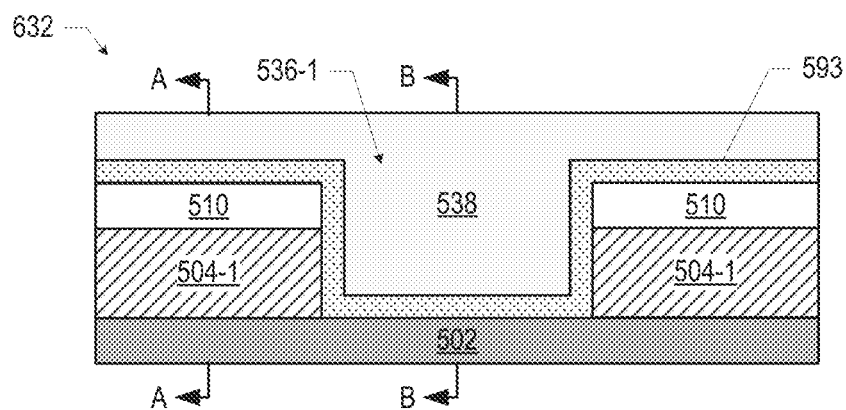

FIG. 58 depicts an assembly 632 subsequent to depositing an island material 538 on the assembly 630 (FIG. 57). The island material 538 may, as illustrated in FIG. 58, fill the recesses 536, and in some embodiments, may extend beyond the recess 536 and over the S/D supports 514 and the gate support 516. The island material 538 may be deposited using any suitable technique, such as those discussed above with reference to FIG. 50. The assembly 632 may be further processed as discussed above with reference to FIGS. 51-53 to form the SET device 500 illustrated in FIG. 54.

FIG. 59 provides various views of a third embodiment of a SET device 500. In particular, FIG. 59A is a cross-sectional view of the SET device 500 through the section A-A of FIGS. 59C, 59E, and 59F; FIG. 59B is a cross-sectional view of the SET device 500 through the section B-B of FIGS. 59C, 59E, and 19F; FIG. 59C is a cross-sectional view of the SET device 500 through the section E-E of FIGS. 59A, 59B, 59D, and 59F; FIG. 59D is a side view of the SET device 500 toward the section A-A with the insulator 510 removed; FIG. 59E is a side view of the SET device 500 toward the section E-E from the gate electrodes 506 with the insulator 510 removed; and FIG. 59F is a top view of the SET device 500 with the insulator 510 removed.

As illustrated in FIG. 59, the SET device 500 may include an S/D structure 581 including S/D electrodes 504 disposed on a substrate 502. The S/D electrodes 504 of the S/D structure 581 may be spaced apart by intervening dielectric 508 and an island 512. The S/D structure 581 may include two TJs 570, each formed by a portion of dielectric 508 "sandwiched" between an S/D electrode 504 and the island 512.

A gate structure 583 may be spaced apart from the S/D structure 581 on the substrate 502, and may include a gate electrode 506. During use, as discussed above with reference to FIG. 41, voltages may be applied to the gate electrode 506 and the S/D electrodes 504 to control electron transport and electron occupancy in the island 512; the gate electrode 506, the S/D electrodes 504, the dielectric 508, and the island 512 of FIG. 59 may thus provide a SET.

The dielectric 508 of FIG. 59 may extend up the sidewalls 574 of the S/D electrodes 504. In some embodiments, the dielectric 508 may extend along the substrate 502 between the S/D electrodes 504 such that a portion of the dielectric 508 is disposed between the island 512 and the substrate 502. The dielectric 508 may also extend up sidewalls 576 of the insulator 510, as shown.

The island 512 of FIG. 59 may be disposed at the bottom of the "box" formed by the dielectric 508. In some embodiments, the top face 578 of the island 512 may be recessed back from the top faces 582 of the S/D electrodes 504; in some such embodiments, a portion of the insulator 510 may be disposed in the "box" formed by the dielectric 508 such that the island 512 is disposed between this portion of the insulator 510 and the substrate 502.

Figure 59A:
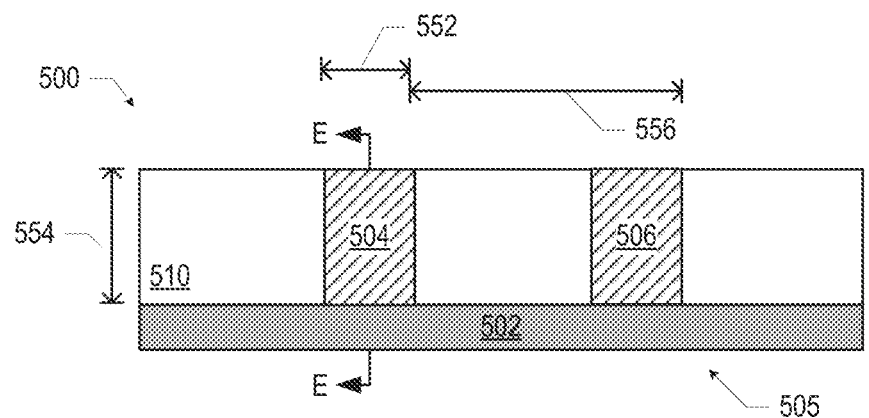
FIGS. 59A-59F are various views of another SET device, in accordance with various embodiments.
Figure 59B:
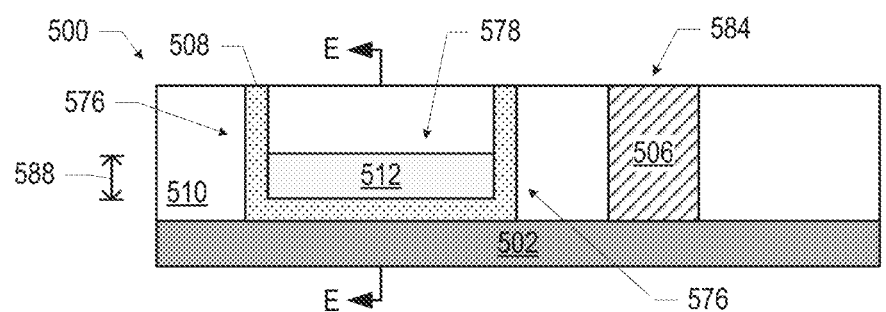
Figure 59C:
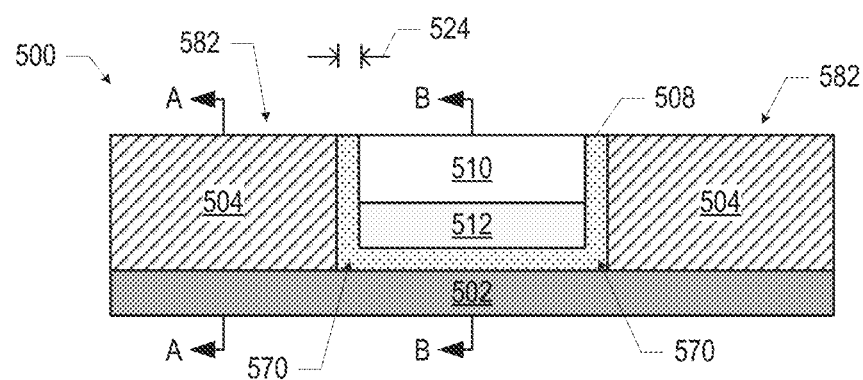
Figure 59D:
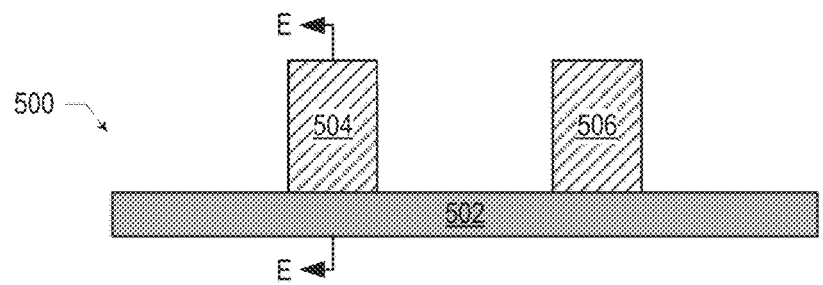
Figure 59E:
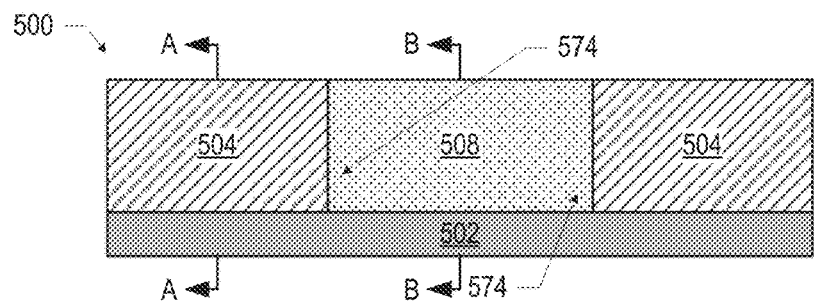
Figure 59F:
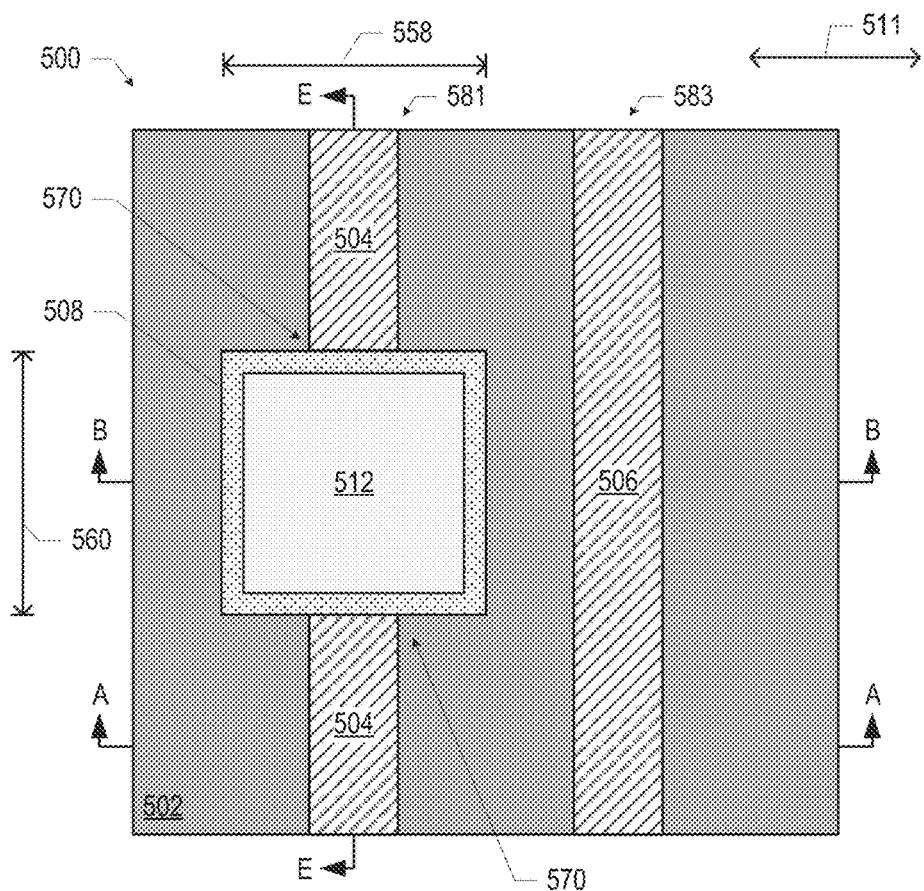

The width 552 and the height 554 of the S/D electrodes 504 may take any suitable values. For example, the width 552 may be between 20 and 80 nanometers (e.g., 40 nanometers), and the height 554 may be between 30 and 500 nanometers (e.g., 50 nanometers). The width and height of the gate electrode 506 may take the form of any of the embodiments of the width 552 and the height 554. In some embodiments, the spacing 556 of the S/D electrodes 504 and the gate electrode 506, as shown in FIG. 59A, may be between 80 and 200 nanometers (e.g., 500 nanometers). The dimensions 524 and 588 of FIG. 59 may take any of the forms discussed above with reference to the SET device 500 of FIG. 41.

As illustrated in FIG. 59, in some embodiments, the dielectric 508 may laterally extend beyond the area between the two S/D electrodes 504 (e.g., in the dimension indicated by the arrow 511). Similarly, in some embodiments, the island 512 may laterally extend beyond the area between the two S/D electrodes 504. In some embodiments, the dielectric 508 may have a lateral dimension 560 (parallel to the axis between the S/D electrodes 504) between 25 and 500 nanometers (e.g., 50 nanometers). In some embodiments, the dielectric 508 may have a lateral dimension 558 (perpendicular to the axis between the S/D electrodes 504) between 25 and 500 nanometers (e.g., 50 nanometers).

Any suitable materials discussed above with reference to the SET device 500 of FIG. 41 may be used in the SET device 500 of FIG. 59. Additionally, although a single complete SET device 500 is illustrated in FIG. 59, a device may include a one- or two-dimensional array of the SET devices 500 of FIG. 59 (or any other arrangement of multiple SET devices 500).

Figure 60A:
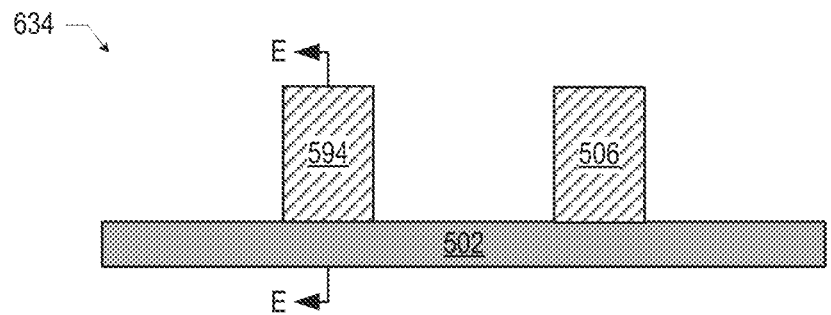
FIGS. 60A-60C, 61A-61C, and 62A-62C illustrate various example stages in the manufacture of the SET device of FIGS. 59A-59F, in accordance with various embodiments.
Figure 60B:
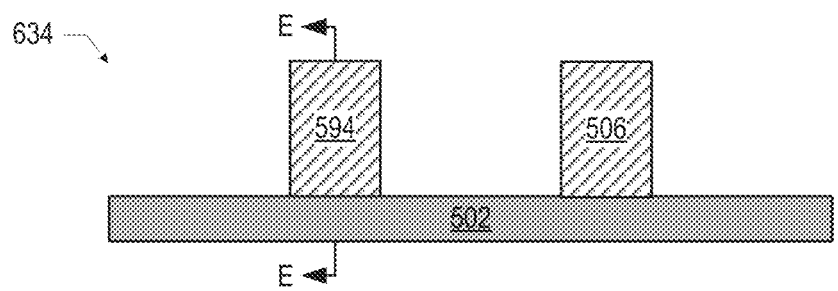
Figure 60C:
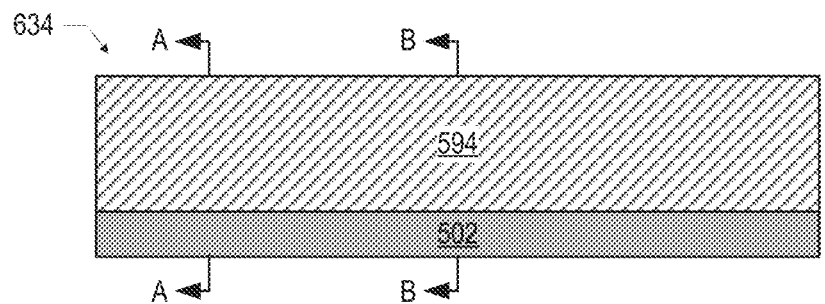
Figure 61A:
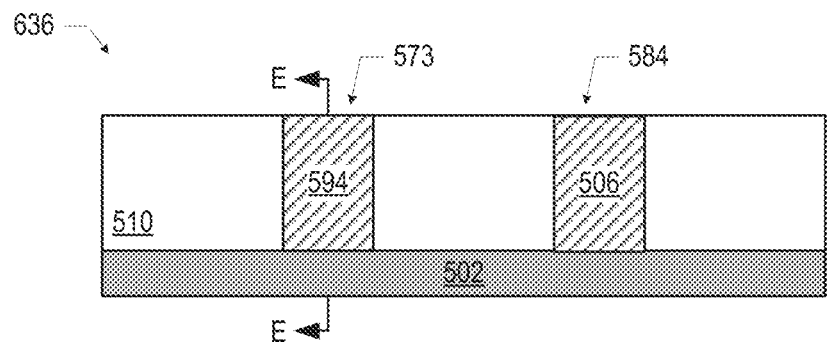
Figure 61B:
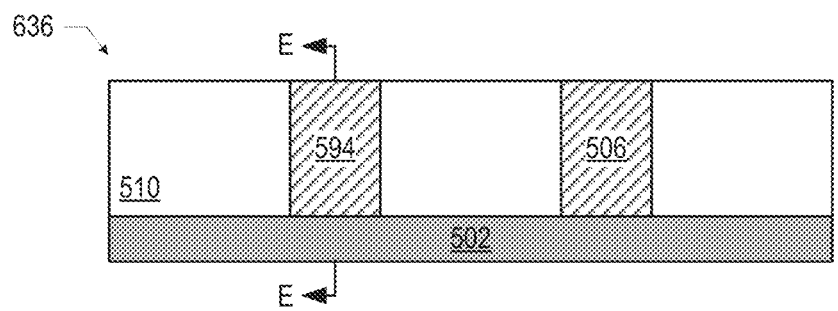
Figure 61C:
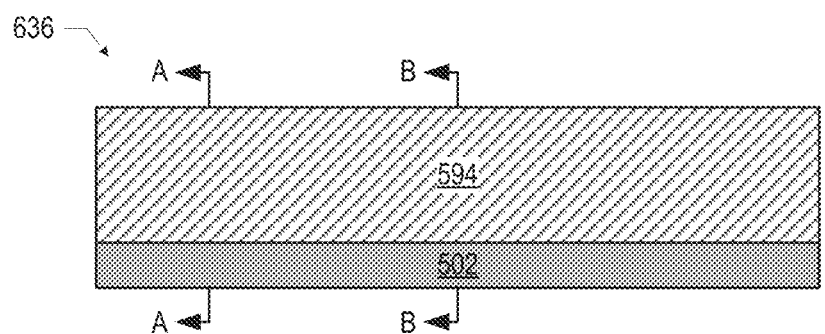
Figure 62A:
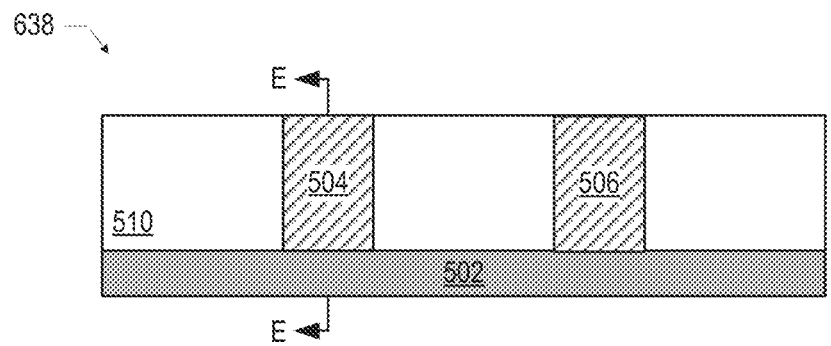
Figure 62B:
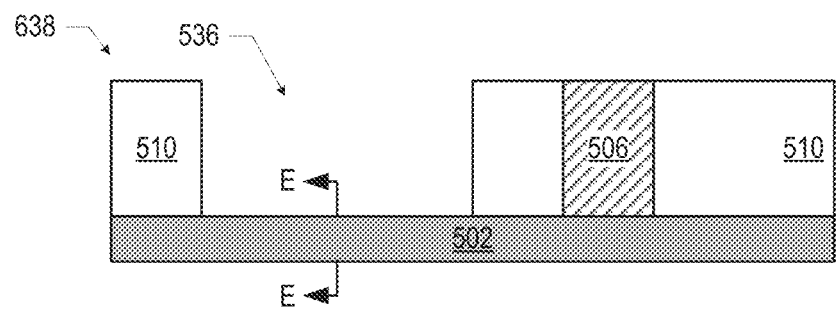
Figure 62C:
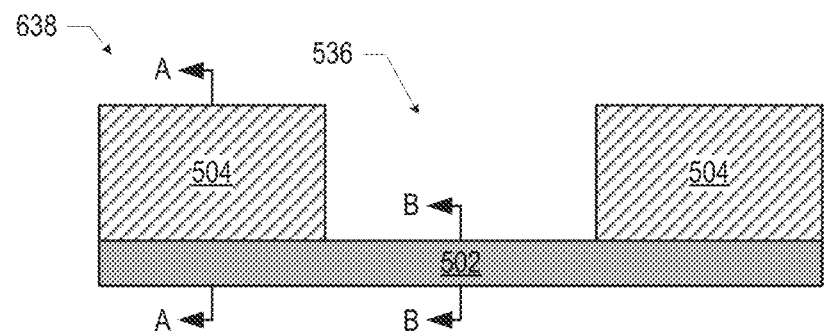
Figure 63A:
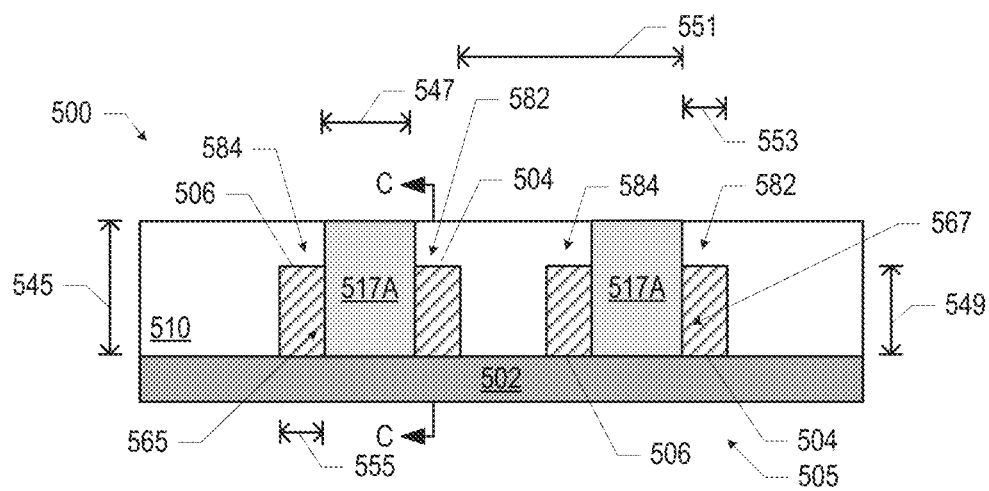
FIGS. 63A-63F are various views of another SET device, in accordance with various embodiments.
Figure 63B:
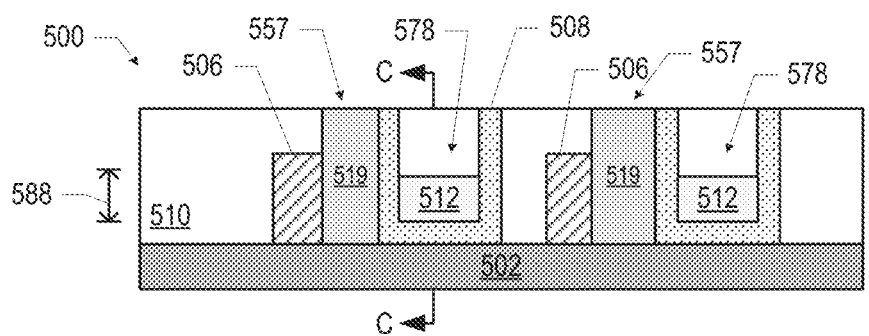
Figure 63C:
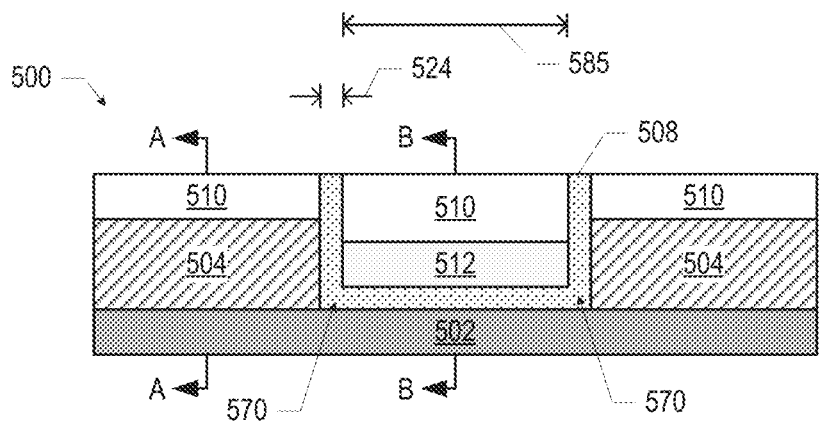
Figure 63D:
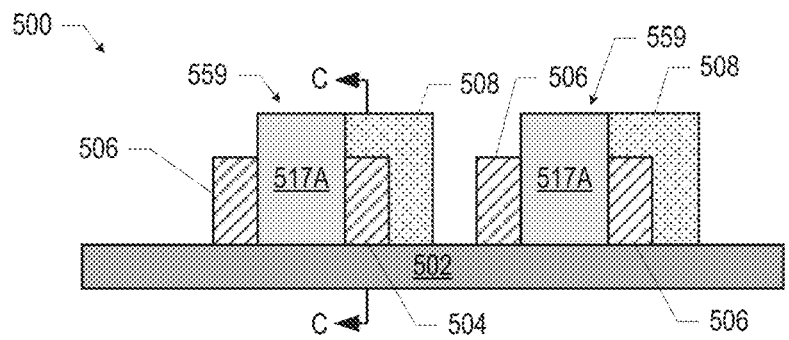
Figure 63E:
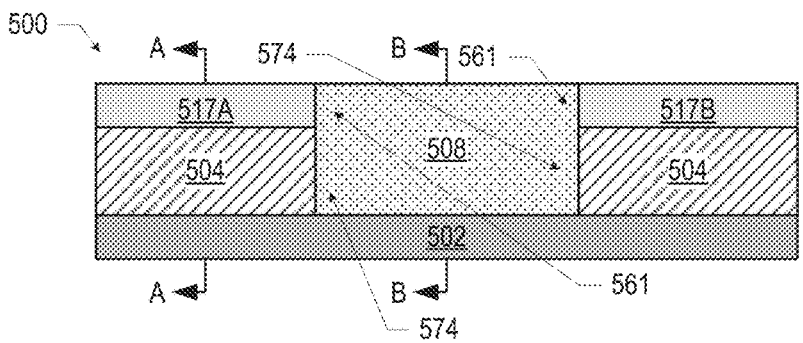
Figure 63F:
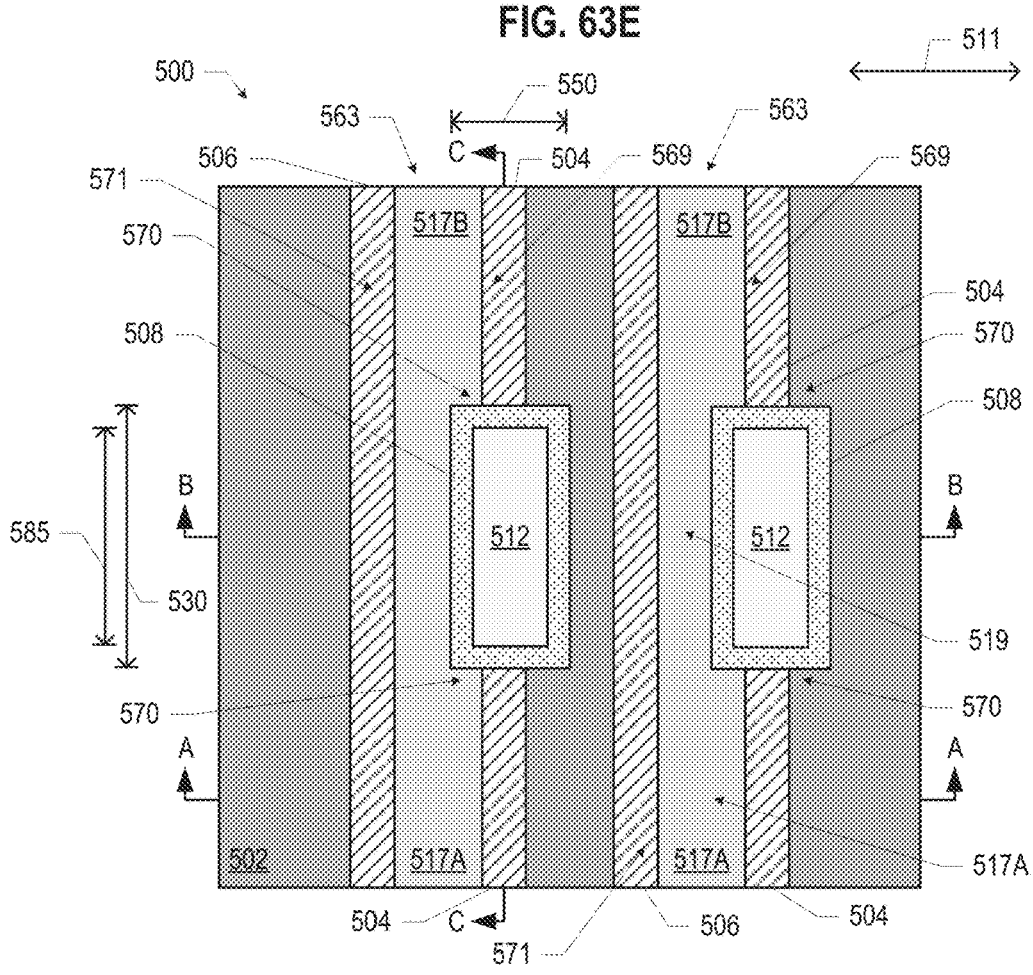

Any suitable process may be used to manufacture the SET device 500 of FIG. 59. For example, FIGS. 60-62 depict various cross-sectional views of stages in an example process for manufacturing the SET device 500 of FIG. 59. The materials and dimensions of various components of the stages illustrated in FIGS. 60-62 may take the form of any of the embodiments discussed herein. In FIGS. 60-62, the "A" sub-figures represent cross-sectional views through the section A-A (analogous to FIG. 59A), the "B" sub-figures represent cross-sectional views through the section B-B (analogous to FIG. 59B), and the "C" sub-figures represent cross-sectional views through the section E-E (analogous to FIG. 59C).

FIG. 60 depicts an assembly 634 subsequent to providing conductive material 594 and the gate electrode 506 on the substrate 502 of the assembly 602 (FIG. 42). In some embodiments, the conductive material 594 and the gate electrode 506 may each be shaped substantially as a rectangular solid. The conductive material 594 and the gate electrode 506 may each take the form of "fins" extending from the substrate 502, and may be formed using any suitable technique. For example, in some embodiments, a conductive material may be blanket-deposited on the substrate 502, and patterned to form the conductive material 594 and the gate electrode 506. In other embodiments, a sacrificial material may be blanket-deposited on the substrate 502, trenches may be formed in the sacrificial material down to the substrate 502, the trenches may be filled with conductive material to form the conductive material 594 and the gate electrode 506, and then the sacrificial material may be removed. These embodiments are simply examples, and any desired technique may be used to form the conductive material 594 and the gate electrode 506 on the substrate 502.

FIG. 61 depicts an assembly 636 subsequent to depositing an insulator 510 on the assembly 634 (FIG. 60). In the assembly 636, the top face 573 of the conductive material 594 and the top face 584 of the gate electrode 506 are shown as exposed, but in other embodiments, the insulator 510 may extend over the top face 573 and the top face 584. In some embodiments, deposition of the insulator 510 may be followed by a polishing step in which the insulator 510 is polished to create a flat face (e.g., by chemical mechanical polishing); in some such embodiments, the top face 573 and the top face 584 may be exposed subsequent to polishing.

FIG. 62 depicts an assembly 638 subsequent to forming a recess 536 in the assembly 636 (FIG. 61). The recess 536 may have the footprint of the dielectric 508 illustrated in FIG. 59F (e.g., a substantially rectangular footprint), and may divide the conductive material 594 of FIG. 61 into the two S/D electrodes 504. The lateral dimensions of the recess 536 may take any of the forms of the lateral dimensions 560 and 558 discussed herein. The recess 536 may be spaced apart from the gate electrode 506 by a portion of the insulator 510, as shown. The recess 536 may be formed using any of the techniques discussed above with reference to FIG. 48. The assembly 638 may be further processed as discussed above with reference to FIGS. 49-53 to form the SET device 500 illustrated in FIG. 59.

FIG. 63 provides various views of additional embodiments of a SET device 500. In particular, FIG. 63A is a cross-sectional view of the SET device 500 through the section A-A of FIGS. 63C, 63E, and 63F; FIG. 63B is a cross-sectional view of the SET device 500 through the section B-B of FIGS. 63C, 63E, and 63F; FIG. 63C is a cross-sectional view of the SET device 500 through the section C-C of FIGS. 63A, 63B, 63D, and 63F; FIG. 63D is a side view of the SET device 500 toward the section A-A with the insulator 510 removed; FIG. 63E is a side view of the SET device 500 toward the section C-C from the gate electrode 506 with the insulator 510 removed; and FIG. 63F is a top view of the SET device 500 with the insulator 510 removed. As discussed below, the SET device 500 of FIG. 63 may configured to so as to include two complete SETs (each provided by a gate/S/D structure 563), or one complete SET and two "halves" of additional SETs.

As illustrated in FIG. 63, the SET device 500 may include one or more gate/S/D structures 563, each including two supports 517A and 517B disposed on a substrate 502. A gate/S/D structure 563 may also include support material 519 between the supports 517A and 517B. In some embodiments, the supports 517A and 517B and the support material 519 may be materially contiguous (e.g., as discussed below with reference to FIG. 64). Reference to a "support 517" may refer to both the supports 517A and 517B. Two gate/S/D structures 563 are illustrated in FIG. 63, but any number of gate/S/D structures 563 may be included in a SET device 500. Each support 517 may have an S/D electrode 504 disposed on a side face 569 of the support 517. The two S/D electrodes 504 of a gate/S/D structure 563 may be spaced apart by intervening dielectric 508 and an island 512. In particular, a SET device 500 may include two TJs 570, each formed by a portion of dielectric 508 "sandwiched" between an S/D electrode 504 and the island 512. A gate/S/D structure 563 may also include a gate electrode 506 disposed on the side face 571 of the supports 517 and support material 519 (opposite to the side face 569).

The SET device 500 may be configured for use in a number of different ways. In some embodiments, the S/D electrodes 504, the island 512, and the dielectric 508 of one gate/S/D structure 563 may form a SET along with the proximate gate electrode 506 of a different adjacent gate/S/D structure 563. For example, in the embodiment shown in FIG. 63F, the "leftmost" S/D electrodes 504 and the "rightmost" gate electrode 506 (on different gate/S/D structures 563) may be used together as a SET, in any of the manners described above. In such embodiments, FIG. 63F may depict portions of additional SETs, accordingly; additional ones of the gate/S/D structures 563 may continue the linear array of FIG. 63F to provide as many complete SETs as desired. In other embodiments, the S/D electrodes 504, the island 512, the dielectric 508, and the gate electrode 506 in a single gate/S/D structure 563 may be used together as a SET. For example, in the embodiment shown in FIG. 63F, the "leftmost" S/D electrodes 504 and the "leftmost" gate electrode 506 (part of the same gate/S/D structure 563) may be used together as a SET; in such embodiments, FIG. 63F may depict two complete SETs. In either of these embodiments, an array of SETs may be formed (e.g., a one- or two-dimensional array, or any other arrangement of SETs).

The dielectric 508 of FIG. 63 may extend up the sidewalls 561 of the support 517, and up the sidewalls 574 of the S/D electrodes 504. In some embodiments, the dielectric 508 may extend along the substrate 502 between the S/D electrodes 504 such that a portion of the dielectric 508 is disposed between the islands 512 and the substrate 502. The dielectric 508 may also extend up sidewalls 576 of the insulator 510, as shown.

The island 512 of FIG. 63 may be disposed at the bottom of the "boxes" formed by the dielectric 508. In some embodiments, the top face 578 of the island 512 may be recessed back from the top face 559 of the support 517; in some such embodiments, a portion of the insulator 510 may be disposed in the "box" formed by the dielectric 508 such that the island 512 is disposed between this portion of the insulator 510 and the substrate 502.

In some embodiments, the top face 582 of the S/D electrodes 504 of FIG. 63 may be recessed back from the top face 559 of the support 517. Similarly, in some embodiments, the top face 584 of the gate electrode 506 may be recessed back from the top face 559 of the support 517. The dimensions 524, 588, 530, 550 and 585 of FIG. 63 may take any of the forms discussed above with reference to the SET device 500 of FIG. 41. The dimensions 549, 545, 547, 555, 553, and 551 may take any of the forms of the dimensions 526, 522, 518, 590, 520, and 587 disclosed herein.

As illustrated in FIG. 63, in some embodiments, the dielectric 508 may laterally extend beyond the area between the two S/D electrodes 504 of a gate/S/D structure 563 (e.g., in the dimension indicated by the arrow 511). Similarly, in some embodiments, the island 512 may laterally extend beyond the area between the two associated S/D electrodes 504.

Any suitable materials discussed above with reference to the SET device 500 of FIG. 41 may be used in the SET device 500 of FIG. 63. For example, the support 517 may be formed of any of the materials discussed above with reference to the S/D supports 514 and the gate supports 516.

Figure 64A:
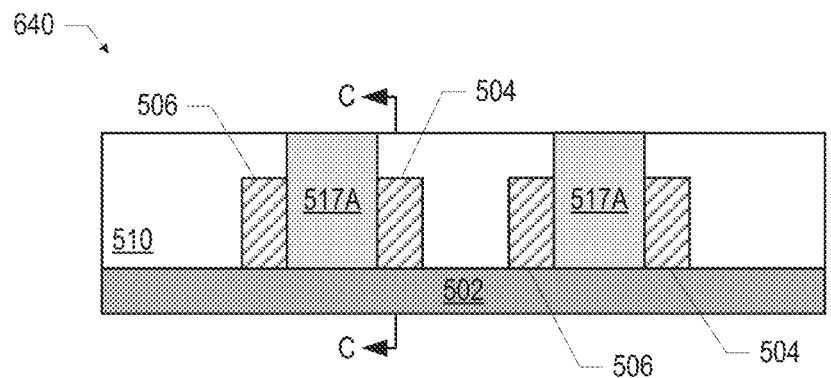
FIGS. 64A-64C illustrate an example stage in the manufacture of the SET device of FIGS. 63A-63F, in accordance with various embodiments.
Figure 64B:
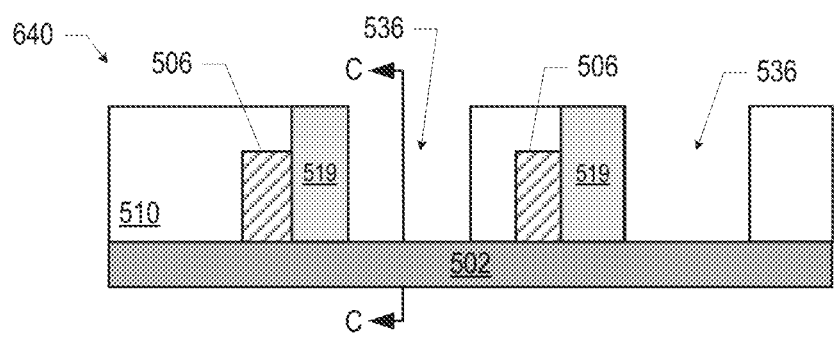
Figure 64C:
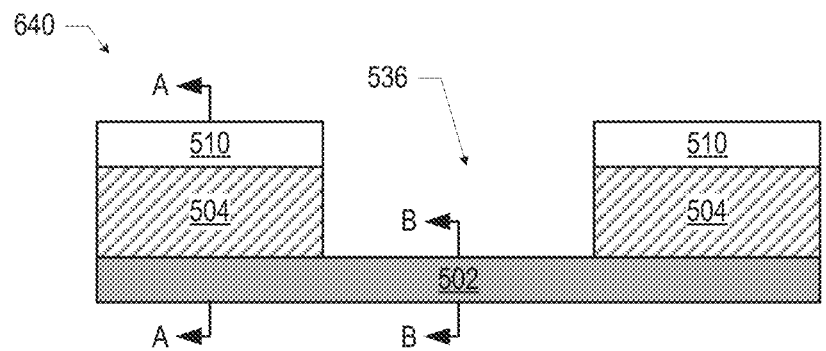

Any suitable process may be used to manufacture the SET device 500 of FIG. 63. For example, FIG. 64 depicts various cross-sectional views of a stage in an example process for manufacturing the SET device 500 of FIG. 63. The materials and dimensions of various components of the stage illustrated in FIG. 64 may take the form of any of the embodiments discussed herein. In FIG. 64, the "A" sub-figure represents a cross-sectional view through the section A-A (analogous to FIG. 63A), the "B" sub-figure represents a cross-sectional view through the section B-B (analogous to FIG. 63B), and the "C" sub-figure represents a cross-sectional view through the section C-C (analogous to FIG. 63C).

FIG. 64 depicts an assembly 640 subsequent to forming recesses 536 in the assembly 626 (FIG. 55). The recesses 536 may have the footprints of the dielectrics 508 illustrated in FIG. 63F (e.g., substantially rectangular footprints), and may divide the support material 592 of FIG. 55 into the two supports 517A and 517B, joined by the support material 519. The lateral dimensions of the recesses 536 may take any of the forms of the lateral dimensions 550 and 530 discussed herein. The recess 536 may divide the conductive material 534 into two S/D electrodes 504 (disposed on the side faces 569 of the supports 517). In FIG. 64, the conductive material 596 is relabeled as the gate electrode 506, and the gate support 516 has been relabeled as the support 517, consistent with FIG. 63. The recess 536 may be spaced apart from the gate electrode 506 by the support material 519, as shown, and a recess 536 of one gate/S/D structure 563 (not labeled in FIG. 64) may be spaced apart by a proximate gate electrode 506 of another gate/S/D structure 563 by a portion of the insulator 510, as shown. The recesses 536 may be formed using any of the techniques discussed above with reference to FIG. 48. The assembly 640 may be further processed as discussed above with reference to FIGS. 57-58 and/or 49-53 to form the SET device 500 illustrated in FIG. 63.

Figure 65:
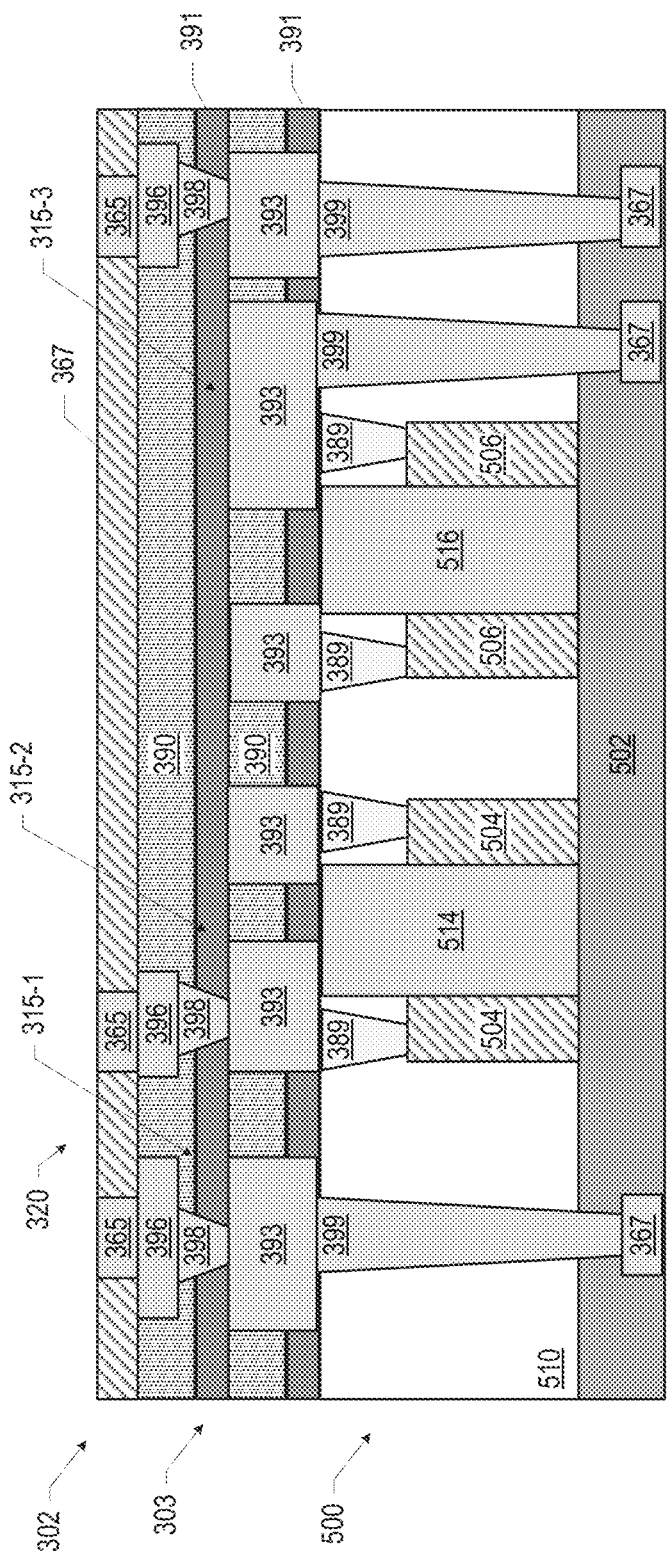
FIG. 65 is a cross-sectional view of a die including a SET device, in accordance with various embodiments.

As noted above, a SET device 500 may be included in the quantum state detector die 804 and/or in the active qubit die 802. FIG. 65 is a side cross-sectional view of a die 302 including the SET device 500 of FIG. 54A and conductive pathway layers 303 disposed thereon. The die 302 may provide the active qubit die 802 and/or the quantum state detector die 804. Although the particular SET device 500 illustrated in FIG. 65 may take the form of the SET device 500 illustrated in FIG. 54A, any of the SET devices 500 disclosed herein (e.g., the SET devices 500 discussed above with reference to FIG. 41, FIG. 59, or FIG. 63) may be included in a die 302. Additionally, although only a single SET device 500 is illustrated in FIG. 65, this is simply for economy of illustration, and any desired number of SET devices 500 may be included in a die 302 (e.g., in an array, as discussed above).

The die 302 may include a first face 322 and an opposing second face 320. When the die 302 is the active qubit die 802, the first face 322 may be the first face 806, and the second face 320 may be the second face 808. When the die 302 is the quantum state detector die 804, the first face 322 may be the first face 810, and the second face 320 may be the second face 812. The substrate 502 may be proximate to the first face 322, and conductive pathways 315 from various components of the SET device 500 may extend to conductive contacts 367 disposed at the first face 322 or conductive contacts 365 disposed at the second face 320. When the die 302 is the active qubit die 802, the conductive contacts 367 may be the conductive contacts 816 and the conductive contacts 365 may be the conductive contacts 818. When the die 302 is the quantum state detector die 804, the conductive contacts 367 may be the conductive contacts 820, and the conductive contacts 365 may be the conductive contacts 822.

The conductive pathways 315 may include conductive vias, conductive lines, and/or any combination of conductive vias and lines. For example, FIG. 65 illustrates an embodiment in which a conductive pathway 315-1 (extending between a conductive contact 367 and a conductive contact 365) includes a conductive via 399, a conductive line 393, a conductive via 398, and a conductive line 396. When the die 302 is the active qubit die 802, the conductive pathway 315-1 may be a conductive pathway 854. When the die 302 is the quantum state detector die 804, the conductive pathway 315-1 may be a conductive pathway 856. In the embodiment of FIG. 65, another conductive pathway 315-2 (extending between an S/D electrode 504 and a conductive contact 365) includes a conductive via 389, a conductive line 393, a conductive via 398, and a conductive line 396. When the die 302 is the active qubit die 802, the conductive pathway 315-2 may be a conductive pathway 846. When the die 302 is the quantum state detector die 804, the conductive pathway 315-2 may be a conductive pathway 848. In the embodiment of FIG. 65, another conductive pathway 315-3 (extending between a gate electrode 506 and a conductive contact 367) includes a conductive via 389, a conductive line 393, and a conductive via 398. When the die 302 is the active qubit die 802, the conductive pathway 315-3 may be a conductive pathway 843. When the die 302 is the quantum state detector die 804, the conductive pathway 315-3 may be a conductive pathway 841. More or fewer structures may be included in the conductive pathways 315, and analogous conductive pathways 315 may be provided between ones of the conductive contacts 365, the conductive contacts 367, and/or any components of the SET device 500.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material. Although FIG. 65 illustrates a layer of nitride material 391 disposed directly on the S/D support 514 and the gate support 516 of the SET device 500, this need not be the case, and in some embodiments, additional insulator 510 may be disposed between the S/D support 514 (and the gate support 516) and the first layer of nitride material 391.

The S/D electrodes 504 and the gate electrodes 506 (as well as the proximate conductive vias/lines, such as the conductive vias 389) may be referred to as part of the "device layer" of the SET device 500. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer. More or fewer interconnect layers may be included in the die 302, as desired.

A solder resist material 367 may be disposed around the conductive contacts 365, and in some embodiments may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the SET device 500, and may be formed of any suitable conductive material (e.g., a superconducting material). For example, solder bonds may be formed on the one or more conductive contacts 365 to mechanically and/or electrically couple the die 302 with another component (e.g., a circuit board), as discussed above. The conductive contacts 365 illustrated in FIG. 65 take the form of bond pads, but other interconnect structures may be used (e.g., posts) to route electrical signals to/from the die 302. The conductive contacts 367 may take any of the forms discussed above with reference to the conductive contacts 365.

The combination of the conductive pathways and the proximate insulating material (e.g., the proximate insulator 510, the oxide material 390, and the nitride material 391) in the die 302 may provide an interlayer dielectric (ILD) stack of the die 302. As noted above, interconnect structures may be arranged within the die 302 to route electrical signals according to a wide variety of designs (in particular, the arrangement is not limited to the particular configuration of interconnect structures depicted in FIG. 65 or any of the other accompanying figures, and may include more or fewer interconnect structures). During operation of the SET device 500, electrical signals (such as power and/or input/output (I/O) signals) may be routed to and/or from the S/D electrodes 504 and the gate electrodes 506 (and/or other components) of the SET device 500 through the interconnects provided by conductive vias and/or lines of the die 302.

Figure 66:
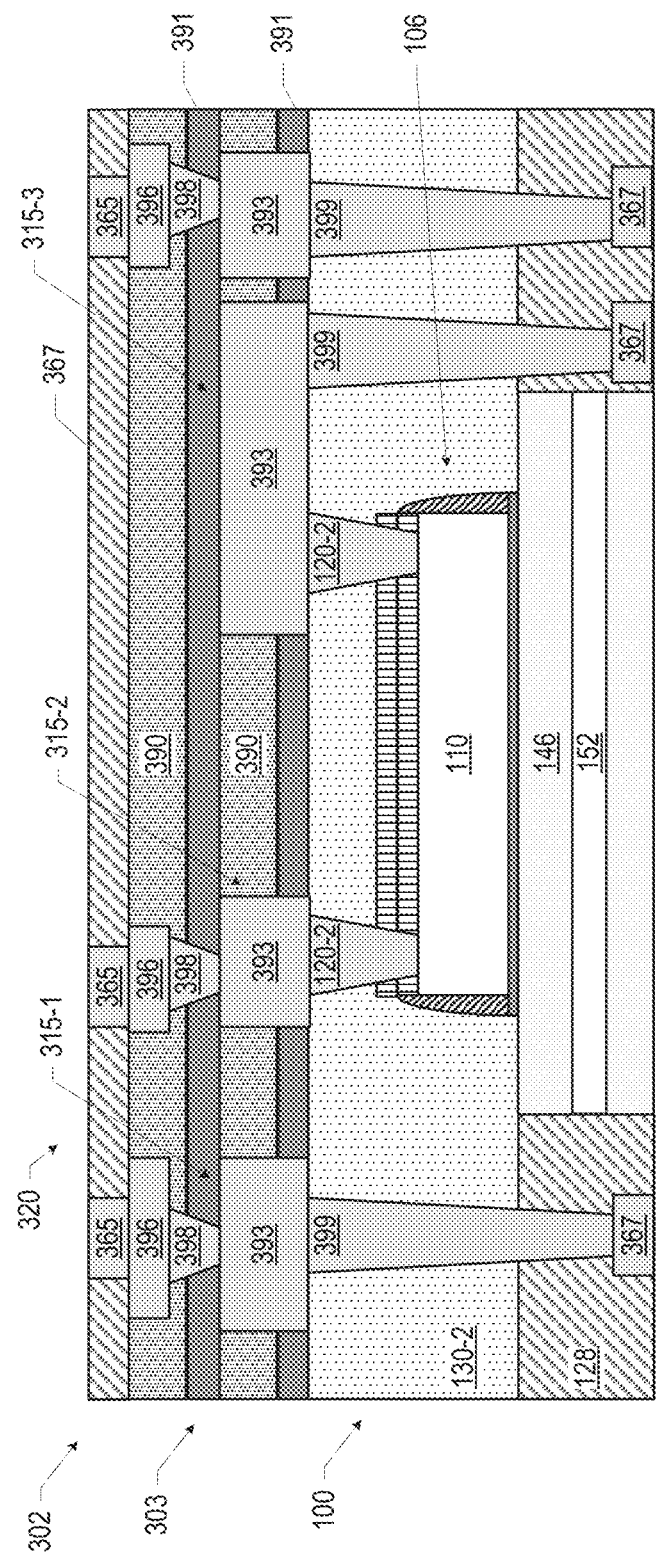
FIG. 66 is a cross-sectional view of a die including a gate-stack device, in accordance with various embodiments.

As noted above, a gate-stack device 100 may be included in the quantum state detector die 804 and/or in the active qubit die 802 (e.g., instead of or in addition to one or more SET devices 500). FIG. 66 is a side cross-sectional view of a die 302 including the gate-stack device 100 of FIG. 2C and conductive pathway layers 303 disposed thereon. The die 302 of FIG. 66 may provide the active qubit die 802 and/or the quantum state detector die 804. Although the particular gate-stack device 100 illustrated in FIG. 66 may take the form of the gate-stack device 100 illustrated in FIG. 2C, any of the gate-stack devices 100 disclosed herein (e.g., the gate-stack devices 100 discussed above with reference to FIGS. 2 and 20) may be included in a die 302. Additionally, although only a single gate-stack device 100 is illustrated in FIG. 66, this is simply for economy of illustration, and any desired number of gate-stack devices 100 may be included in a die 302 (e.g., in an array, as discussed above).

The die 302 of FIG. 66 may share many example structures with the die 302 of FIG. 65, and any of the embodiments discussed above with reference to FIG. 65 may be included in the die 302 of FIG. 66. In FIG. 66, the quantum well layer 152 may be proximate to the first face 322. In the embodiment of FIG. 66, a conductive pathway 315-2 (extending between the gate 106 and a conductive contact 365) includes a conductive via 389, a conductive line 393, a conductive via 398, and a conductive line 396. When the die 302 is the active qubit die 802, the conductive pathway 315-2 may be a conductive pathway 846. When the die 302 is the quantum state detector die 804, the conductive pathway 315-2 may be a conductive pathway 848. In the embodiment of FIG. 66, another conductive pathway 315-3 (extending between the gate 106 and a conductive contact 367) includes a conductive via 389, a conductive line 393, and a conductive via 398. When the die 302 is the active qubit die 802, the conductive pathway 315-3 may be a conductive pathway 843. When the die 302 is the quantum state detector die 804, the conductive pathway 315-3 may be a conductive pathway 841. More or fewer structures may be included in the conductive pathways 315 of FIG. 66, and analogous conductive pathways 315 may be provided between ones of the conductive contacts 365, the conductive contacts 367, and/or any components of the gate-stack device 100. During operation of the gate-stack device 100, electrical signals (such as power and/or input/output (I/O) signals) may be routed to and/or from the gates 106/108 (and/or other components) of the gate-stack device 100 through the interconnects provided by conductive vias and/or lines of the die 302.

FIGS. 67A-B are top views of a wafer 450 and dies 452 that may be formed from the wafer 450; the dies 452 may be included in any of the die assemblies 800 disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more gate-stack devices 100, SET devices 500, and/or supporting circuitry to route electrical signals to the gate-stack devices 100 and/or SET devices 500 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 71) or other logic that is configured to store information in the memory devices or execute instructions stored in the memory array.

FIG. 68 is a cross-sectional side view of a device assembly 400 that may include any of the embodiments of the die assemblies 800 disclosed herein. In particular, any suitable ones of the packages or components of the device assembly 400 may include an embodiment of the die assembly 800. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 68 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 68, multiple packages may be coupled to the interposer 404; indeed, additional interposers may be coupled to the interposer 404. The interposer 404 may provide an intervening substrate used to bridge the circuit board 402 and the package 420. The package 420 may include a die assembly 800 or may be a conventional IC package, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 68, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include a die assembly 800 or may be a conventional IC package, for example.

The device assembly 400 illustrated in FIG. 68 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include a die assembly 800 or may be a conventional IC package, for example.

As noted above, any suitable techniques may be used to manufacture the gate-stack devices 100 disclosed herein. FIG. 69 is a flow diagram of an illustrative method 1000 of manufacturing a quantum computing device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum computing device (including any suitable ones of the embodiments disclosed herein).

At 1002, a first die may be coupled to a second die. The first die may include a plurality of first devices at a first face of the first die, the second die may include a plurality of second devices at a first face of the second die, and the first faces of the first and second dies may face each other. The first devices may be active qubit devices and the second devices may be quantum state detector devices, or the second devices may be active qubit devices and the first devices may be quantum state detector devices. For example, the active qubit die 802 may be mechanically coupled to the quantum state detector die 804, with the active qubit devices 836 facing the detector devices 838 (e.g., as discussed above with reference to FIG. 1).

At 1004, the second die may be electrically coupled to a support. For example, the active qubit die 802 or the quantum state detector die 804 may be coupled to a package substrate 814 (or another component) (e.g., as discussed above with reference to FIG. 1).

A number of techniques are disclosed herein for operating a quantum computing device. FIG. 70 is a flow diagram of an illustrative method 1020 of operating a qubit-detector die assembly, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable qubit-detector die assembly (including any suitable ones of the embodiments disclosed herein).

At 1022, electrical signals may be provided to a plurality of active qubit devices disposed at a first face of a first die as part of causing a plurality of quantum dots to form in the first die. For example, electrical signals may be provided to the active qubit devices 836 disposed at the first face 806 of an active qubit die 802 (e.g., as discussed above with reference to FIG. 1).

At 1024, quantum states of the plurality of quantum dots may be sensed with quantum state detector devices disposed at a first face of a second die. The second die may be mechanically coupled to the first die such that the first faces of the first and second dies are spaced apart and face each other. For example, quantum states of quantum dots generated by the active qubit devices 836 may be sensed by detector devices 838 disposed at the first face 810 of a quantum state detector die 804 (e.g., as discussed above with reference to FIG. 1).

Figure 71:
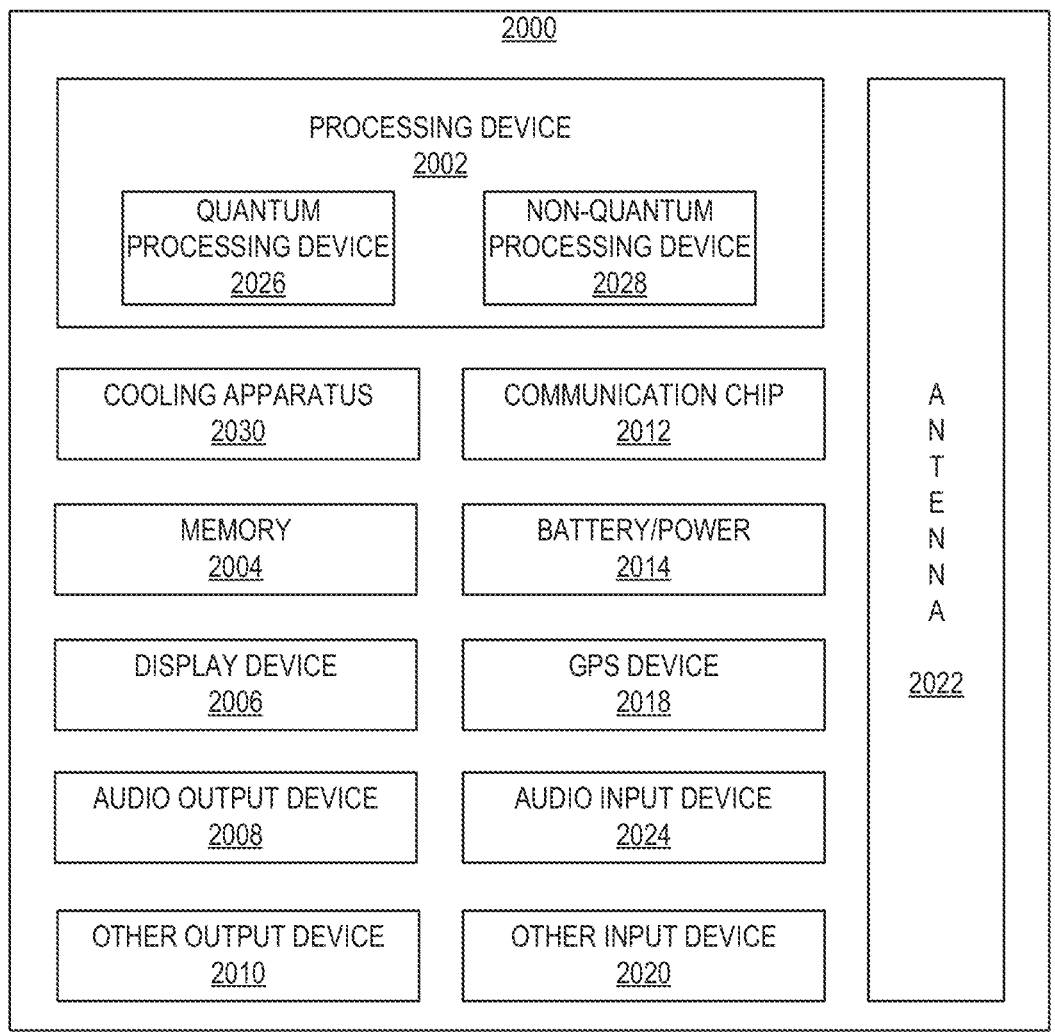
FIG. 71 is a block diagram of an example quantum computing device that may include any of the qubit-detector die assemblies disclosed herein, in accordance with various embodiments.

FIG. 71 is a block diagram of an example quantum computing device 2000 that may include any of the quantum dot devices disclosed herein (e.g., any of the die assemblies 800, gate-stack devices 100, and/or SET devices 500). A number of components are illustrated in FIG. 71 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 71, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the die assemblies 800 disclosed herein, and may perform data processing by performing operations on the quantum dots that may be generated in the active qubit die 802, and monitoring the result of those operations with the quantum state detector die 804. For example, as discussed above, different quantum dots may be allowed to interact, the quantum states of different quantum dots may be set or transformed, and the quantum states of quantum dots may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Although various ones of the embodiments illustrated in the accompanying drawings may include exactly two quantum well layers 152, this is simply for illustrative purposes, and any of the gate-stack devices 100 (or associated methods or devices) discussed herein may include three or more quantum well layers 152, in accordance with the teachings of the present disclosure. Thus, various ones of the gate-stack devices 100 disclosed herein may be regarded as stacked quantum well structures including two or more quantum well layers 152. For example, a double quantum well structure in a gate-stack device 100 may include two or more quantum well layers 152.

The following paragraphs provide examples of various ones of the embodiments disclosed herein.

Example 1 is a die assembly, including: a first die having a first face and an opposing second face, wherein a plurality of active qubit devices are disposed at the first face of the first die; and a second die, mechanically coupled to the first die, having a first face and an opposing second face, wherein a plurality of quantum state detector devices are disposed at the first face of the second die; wherein the first face of the first die is disposed between the second face of the first die and the first face of the second die, and the first face of the second die is disposed between the second face of the second die and the first face of the first die.

Example 2 may include the subject matter of Example 1, and may further specify that a distance between the first face of the first die and the first face of the second die is between 50 and 250 nanometers.

Example 3 may include the subject matter of any of Examples 1-2, and may further specify that the first and second dies are mechanically coupled with an adhesive disposed between the first face of the first die and the first face of the second die.

Example 4 may include the subject matter of any of Examples 1-3, and may further specify that the first and second dies are mechanically coupled with solder disposed between the first face of the first die and the first face of the second die.

Example 5 may include the subject matter of any of Examples 1-4, and may further specify that the second die is electrically coupled to the first die.

Example 6 may include the subject matter of Example 5, and may further specify that the second die is electrically and mechanically coupled to the first die with solder.

Example 7 may include the subject matter of any of Examples 5-6, and may further specify that the second die includes a conductive pathway between the first face of the second die and the second face of the second die, and the first die is electrically coupled to that conductive pathway.

Example 8 may include the subject matter of any of Examples 5-7, and may further specify that the first die includes a conductive pathway between the first face of the first die and the second face of the first die, and the second die is electrically coupled to that conductive pathway.

Example 9 may include the subject matter of any of Examples 1-8, and may further specify that the first die includes a conductive pathway between an active qubit device and the first face of the first die.

Example 10 may include the subject matter of any of Examples 1-9, and may further specify that the first die includes a conductive pathway between an active qubit device and the second face of the first die.

Example 11 may include the subject matter of any of Examples 1-10, and may further specify that the second die includes a conductive pathway between a quantum state detector device and the first face of the second die.

Example 12 may include the subject matter of any of Examples 1-11, and may further specify that the second die includes a conductive pathway between a quantum state detector device and the second face of the second die.

Example 13 may include the subject matter of any of Examples 1-12, and may further specify that the active qubit devices or the quantum state detector devices include: a quantum well stack including a quantum well layer, a doped layer, and a barrier layer disposed between the doped layer and the quantum well layer; a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and a material disposed above the quantum well stack, wherein the material extends between at least two of the first gates spaced apart in the first dimension, and the material extends between at least two of the first gates spaced apart in the second dimension.

Example 14 may include the subject matter of Example 13, and may further specify that the material is a gate metal for a second gate.

Example 15 may include the subject matter of Example 13, and may further specify that the material is an insulating material.

Example 16 may include the subject matter of any of Examples 13-15, and may further specify that the plurality of first gates are arranged in an n×m array, n is greater than 1, and m is greater than 1.

Example 17 may include the subject matter of any of Examples 1-16, and may further specify that the active qubit devices or the quantum state detector devices include a single electron transistor (SET).

Example 18 may include the subject matter of Example 17, and may further specify that the SET includes: first and second insulating supports; first and second source/drain (S/D) electrodes, wherein the first S/D electrode is disposed on a side face of the first insulating support and the second S/D electrode is disposed on a side face of the second insulating support; an island, disposed between the first and second S/D electrodes and extending into an area between the first and second insulating supports; and first and second portions of a dielectric, wherein the first portion of the dielectric is disposed between the first S/D electrode and the island, and the second portion of the dielectric is disposed between the second S/D electrode and the island.

Example 19 may include the subject matter of Example 18, and may further specify that the first and second S/D electrodes are disposed on a substrate, and another portion of the dielectric is disposed between the substrate and the island.

Example 20 may include the subject matter of any of Examples 18-19, and may further specify that the SET further includes: a third insulating support; and a gate electrode of the SET disposed on a side face of the third insulating support.

Example 21 may include the subject matter of any of Examples 18-20, and may further specify that the SET is a first SET, the island is a first island, the side face of the first insulating support is a first side face of the first insulating support, the side face of the second insulating support is a first side face of the second insulating support, and the device further includes: third and fourth S/D electrodes of a second SET, wherein the third S/D electrode is disposed on a second side face of the first insulating support and the fourth S/D electrode is disposed on a second side face of the second insulating support; a second island of the second SET, disposed between the third and fourth S/D electrodes and extending into the area between the first and second insulating supports; and third and fourth portions of the dielectric; wherein the third portion of the dielectric is disposed between the third S/D electrode and the second island, and the fourth portion of the dielectric is disposed between the fourth S/D electrode and the second island.

Example 22 may include the subject matter of Example 21, and may further specify that the SET further includes: a third insulating support; and a gate electrode of the first SET disposed on a side face of the third insulating support, wherein the side face of the third insulating support faces the first side faces of the first and second insulating supports.

Example 23 may include the subject matter of Example 22, and may further specify that the gate electrode is a first gate electrode, the side face of the third insulating support is a first side face of the third insulating support, and the device further includes a second gate electrode disposed on a second side face of the third insulating support.

Example 24 may include the subject matter of any of Examples 22-23, and may further specify that the SET further includes: a fourth insulating support; and a gate electrode of the second SET disposed on a side face of the fourth insulating support, wherein the side face of the fourth insulating support faces the second side faces of the first and second insulating supports.

Example 25 may include the subject matter of any of Examples 17-24, and may further specify that the SET includes: first and second source/drain (S/D) electrodes disposed on a substrate; an island disposed in an area between the first and second S/D electrodes;

first and second portions of dielectric disposed between the first S/D electrode and the island and between the second S/D electrode and the island, respectively; and a third portion of dielectric disposed between the substrate and the island.

Example 26 may include the subject matter of Example 25, and may further specify that the island extends outside the area between the first and second S/D electrodes.

Example 27 may include the subject matter of any of Examples 25-26, and may further specify that the SET further includes an insulating material disposed in the area between the first and second S/D electrodes.

Example 28 may include the subject matter of any of Examples 25-27, and may further specify that the SET further includes a gate electrode spaced apart from the island.

Example 29 may include the subject matter of Example 28, and may further specify that a longitudinal axis of the gate electrode is parallel to an axis running between the first and second S/D electrodes.

Example 30 may include the subject matter of any of Examples 28-29, and may further specify that the SET further includes a fourth portion of dielectric disposed between the island and the gate electrode.

Example 31 may include the subject matter of any of Examples 25-30, and may further specify that the first and second S/D electrodes are shaped as rectangular solids.

Example 32 may include the subject matter of any of Examples 1-31, and may further specify that the active qubit devices and the quantum state detector devices are single electron transistors (SETs).

Example 33 may include the subject matter of any of Examples 1-31, and may further specify that the active qubit devices and the quantum state detector devices include gates disposed on quantum well stacks.

Example 34 may include the subject matter of any of Examples 1-31, and may further specify that the active qubit devices and the quantum state detector devices are each drawn from a group consisting of single electron transistors (SETs) and gates disposed on quantum well stacks.

Example 35 may include the subject matter of Example 34, and may further specify that the active qubit devices and the quantum state detector devices are different.

Example 36 is a method of manufacturing a quantum computing device, including: coupling a first die to a second die, wherein the first die includes a plurality of first devices at a first face of the first die, the second die includes a plurality of second devices at a first face of the second die, and the first faces of the first and second die face each other; and electrically coupling the second die to a support; wherein the first devices are active qubit devices and the second devices are quantum state detector devices, or the second devices are active qubit devices and the first devices are quantum state detector devices.

Example 37 may include the subject matter of Example 36, and may further specify that coupling the first die to the second die includes performing solder reflow between the first die and the second die.

Example 38 may include the subject matter of any of Examples 36-37, and may further specify that coupling the first die to the second die includes providing an adhesive between the first die and the second die.

Example 39 may include the subject matter of any of Examples 36-38, and may further specify that a distance between the first faces of the first and second dies, after coupling, is between 50 and 200 nanometers.

Example 40 may include the subject matter of any of Examples 36-39, and may further specify that the active qubit devices and the quantum state detector devices are each drawn from a group consisting of single electron transistors (SETs) and gates disposed on quantum well stacks.

Example 41 may include the subject matter of any of Examples 36-40, and may further specify that the support is a package substrate including conductive pathways between opposing faces of the support.

Example 42 is a method of operating a quantum computing device, including: providing electrical signals to a plurality of active qubit devices disposed at a first face of a first die as part of causing a plurality of quantum dots to form in the first die; and sensing quantum states of the plurality of quantum dots with quantum state detector devices disposed at a first face of a second die, wherein the second die is mechanically coupled to the first die such that the first faces of the first and second dies are spaced apart and face each other.

Example 43 may include the subject matter of Example 42, and may further include providing electrical signals representative of the sensed quantum states to an electrical component external to the second die.

Example 44 may include the subject matter of Example 43, and may further specify that the electrical component includes a package substrate or a printed circuit board.

Example 45 may include the subject matter of any of Examples 42-44, and may further specify that the quantum state detector devices include single electron transistors (SETs).

Example 46 may include the subject matter of Example 45, and may further include biasing the SETs before sensing the quantum states of the plurality of quantum dots.

Example 47 may include the subject matter of any of Examples 42-46, and may further specify that the quantum state detector devices include gates disposed on a quantum well stack.

Example 48 may include the subject matter of any of Examples 42-47, and may further specify that the active qubit devices include single electron transistors (SETs) or gates disposed on a quantum well stack.

Example 49 is a quantum computing device, including: a quantum processing device, wherein the quantum processing device includes a first die coupled to a second die, wherein the first die includes a plurality of active qubit devices disposed at a first face of the first die, the second die includes a plurality of quantum state detector devices disposed at a first face of the second die, and the first faces of the first and second dies face each other; a non-quantum processing device, coupled to the quantum processing device, to control electrical signals applied to the first die; and a memory device to store data generated by the second die during operation of the quantum processing device.

Example 50 may include the subject matter of Example 49, and may further include a communication chip communicatively coupled to the non-quantum processing device.

Example 51 may include the subject matter of any of Examples 49-50, and may further specify that the first and second dies are coupled by an adhesive.

Example 52 may include the subject matter of any of Examples 49-51, and may further specify that the first and second dies are coupled by solder.

Example 53 may include the subject matter of any of Examples 49-52, and may further include a cooling apparatus.

Example 54 may include the subject matter of any of Examples 49-53, and may further specify that the first faces of the first and second dies are spaced apart by a distance less than 200 nanometers.

The invention claimed is:

1. A die assembly, comprising:
a first die having a first face and an opposing second face, wherein a plurality of active qubit devices are disposed at the first face of the first die; and
a second die, mechanically coupled to the first die, having a first face and an opposing second face, wherein a plurality of quantum state detector devices are disposed at the first face of the second die;
wherein the first face of the first die is disposed between the second face of the first die and the first face of the second die, and the first face of the second die is disposed between the second face of the second die and the first face of the first die.

2. The die assembly of claim 1, wherein a distance between the first face of the first die and the first face of the second die is between 50 and 250 nanometers.

3. The die assembly of claim 1, wherein the first and second dies are mechanically coupled with an adhesive disposed between the first face of the first die and the first face of the second die.

4. The die assembly of claim 1, wherein the first and second dies are mechanically coupled with solder disposed between the first face of the first die and the first face of the second die.

5. The die assembly of claim 1, wherein the second die is electrically coupled to the first die.

6. The die assembly of claim 1, wherein the active qubit devices or the quantum state detector devices include:
a quantum well stack including a quantum well layer, a doped layer, and a barrier layer disposed between the doped layer and the quantum well layer;
a plurality of first gates disposed above the quantum well stack, wherein at least two of the first gates are spaced apart in a first dimension above the quantum well stack, at least two of the first gates are spaced apart in a second dimension above the quantum well stack, and the first and second dimensions are perpendicular; and
a material disposed above the quantum well stack, wherein the material extends between at least two of the first gates spaced apart in the first dimension, and the material extends between at least two of the first gates spaced apart in the second dimension.

7. The die assembly of claim 6, wherein the material is a gate metal for a second gate.

8. The die assembly of claim 6, wherein the material is an insulating material.

9. The die assembly of claim 6, wherein the plurality of first gates are arranged in an n×m array, n is greater than 1, and m is greater than 1.

10. The die assembly of claim 1, wherein the active qubit devices or the quantum state detector devices include a single electron transistor (SET).

11. The die assembly of claim 10, wherein the SET includes:
first and second insulating supports;
first and second source/drain (S/D) electrodes, wherein the first S/D electrode is disposed on a side face of the first insulating support and the second S/D electrode is disposed on a side face of the second insulating support;
an island, disposed between the first and second S/D electrodes and extending into an area between the first and second insulating supports; and
first and second portions of a dielectric, wherein the first portion of the dielectric is disposed between the first S/D electrode and the island, and the second portion of the dielectric is disposed between the second S/D electrode and the island.

12. The die assembly of claim 11, wherein the first and second S/D electrodes are disposed on a substrate, and another portion of the dielectric is disposed between the substrate and the island.

13. The die assembly of claim 12, wherein the SET further includes:
a third insulating support; and
a gate electrode of the SET disposed on a side face of the third insulating support.

14. The die assembly of claim 11, wherein the SET is a first SET, the island is a first island, the side face of the first insulating support is a first side face of the first insulating support, the side face of the second insulating support is a first side face of the second insulating support, and the die assembly further includes:
third and fourth S/D electrodes of a second SET, wherein the third S/D electrode is disposed on a second side face of the first insulating support and the fourth S/D electrode is disposed on a second side face of the second insulating support;
a second island of the second SET, disposed between the third and fourth S/D electrodes and extending into the area between the first and second insulating supports; and
third and fourth portions of the dielectric; wherein the third portion of the dielectric is disposed between the third S/D electrode and the second island, and the fourth portion of the dielectric is disposed between the fourth S/D electrode and the second island.

15. The die assembly of claim 10, wherein the SET includes:
first and second source/drain (S/D) electrodes disposed on a substrate;
an island disposed in an area between the first and second S/D electrodes;
first and second portions of dielectric disposed between the first S/D electrode and the island and between the second S/D electrode and the island, respectively; and
a third portion of dielectric disposed between the substrate and the island.

16. The die assembly of claim 1, wherein the active qubit devices and the quantum state detector devices are each drawn from a group consisting of single electron transistors (SETS) and gates disposed on quantum well stacks.

17. A method of manufacturing a quantum computing device, comprising:
- coupling a first die to a second die, wherein the first die includes a plurality of first devices at a first face of the first die, the second die includes a plurality of second devices at a first face of the second die, and the first faces of the first and second die face each other; and
- electrically coupling the second die to a support;
- wherein the first devices are active qubit devices and the second devices are quantum state detector devices, or the second devices are active qubit devices and the first devices are quantum state detector devices.

18. The method of claim 17, wherein the active qubit devices and the quantum state detector devices are each drawn from a group consisting of single electron transistors (SETS) and gates disposed on quantum well stacks.

19. A quantum computing device, comprising:
- a quantum processing device, wherein the quantum processing device includes a first die coupled to a second die, wherein the first die includes a plurality of active qubit devices disposed at a first face of the first die, the second die includes a plurality of quantum state detector devices disposed at a first face of the second die, and the first faces of the first and second dies face each other;
- a non-quantum processing device, coupled to the quantum processing device, to control electrical signals applied to the first die; and
- a memory device to store data generated by the second die during operation of the quantum processing device.

20. The quantum computing device of claim 19, further comprising:
- a communication chip communicatively coupled to the non-quantum processing device.

\* \* \* \* \*